United States Patent
Seo et al.

(10) Patent No.: US 12,317,668 B2
(45) Date of Patent: May 27, 2025

(54) LIGHT-EMITTING DEVICE, LIGHT-EMITTING APPARATUS, ELECTRONIC DEVICE, AND LIGHTING DEVICE

(71) Applicant: SEMICONDUCTOR ENERGY LABORATORY CO., LTD., Atsugi (JP)

(72) Inventors: Satoshi Seo, Kanagawa (JP); Hiroshi Kadoma, Kanagawa (JP); Takumu Okuyama, Tokyo (JP); Naoaki Hashimoto, Kanagawa (JP); Yusuke Takita, Kanagawa (JP); Tsunenori Suzuki, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 819 days.

(21) Appl. No.: 17/610,760

(22) PCT Filed: May 7, 2020

(86) PCT No.: PCT/IB2020/054305
§ 371 (c)(1),
(2) Date: Nov. 12, 2021

(87) PCT Pub. No.: WO2020/234680
PCT Pub. Date: Nov. 26, 2020

(65) Prior Publication Data
US 2022/0069246 A1  Mar. 3, 2022

(30) Foreign Application Priority Data

May 17, 2019  (JP) .................................. 2019-094017
Nov. 29, 2019  (JP) .................................. 2019-216119

(51) Int. Cl.
*H10K 50/11* (2023.01)
*H10K 50/15* (2023.01)
(Continued)

(52) U.S. Cl.
CPC ............. *H10K 50/11* (2023.02); *H10K 50/15* (2023.02); *H10K 50/16* (2023.02); *H10K 50/171* (2023.02);
(Continued)

(58) Field of Classification Search
CPC ........ H10K 50/11; H10K 50/15; H10K 50/16; H10K 50/171; H10K 2101/30;
(Continued)

(56) References Cited

U.S. PATENT DOCUMENTS 8,486,543 B2  7/2013  Seo et al.
8,841,655 B2  9/2014  Okamoto
(Continued)

FOREIGN PATENT DOCUMENTS

CN  109509840 A  3/2019
CN  110036692 A  7/2019
(Continued)

OTHER PUBLICATIONS

International Search Report (Application No. PCT/IB2020/054305) Dated Jul. 7, 2020.
(Continued)

*Primary Examiner* — Douglas W Owens
(74) *Attorney, Agent, or Firm* — Fish & Richardson P.C.

(57) ABSTRACT

A light-emitting device including an EL layer including a hole-injection layer, a light-emitting layer, and an electron-transport layer from an anode side is provided. The hole-injection layer includes a first substance and a second substance. The light-emitting layer includes a third substance and a fourth substance. The electron-transport layer (Continued)

includes a first electron-transport layer and a second electron-transport layer. The first electron-transport layer includes a fifth substance. A first LUMO level of the fifth substance is lower than a second LUMO level of the fourth substance and a difference between the first LUMO level and the second LUMO level is greater than or equal to 0.15 eV and less than or equal to 0.40 eV.

24 Claims, 37 Drawing Sheets

(51) Int. Cl.
    *H10K 50/16*     (2023.01)
    *H10K 50/17*     (2023.01)
    *H10K 101/30*    (2023.01)
    *H10K 101/40*    (2023.01)

(52) U.S. Cl.
    CPC ..... *H10K 2101/30* (2023.02); *H10K 2101/40* (2023.02)

(58) Field of Classification Search
    CPC ............. H10K 2101/40; H10K 50/155; H10K 50/166; H10K 59/32; H10K 50/17; H10K 50/84
    See application file for complete search history.

(56) References Cited

U.S. PATENT DOCUMENTS

| | | | |
|---|---|---|---|
| 9,698,354 B2 | 7/2017 | Seo et al. | |
| 9,985,233 B2 | 5/2018 | Hashimoto et al. | |
| 10,263,194 B2 | 4/2019 | Seo et al. | |
| 10,388,900 B2 | 8/2019 | Seo et al. | |
| 10,483,474 B2 | 11/2019 | Kim | |
| 10,570,113 B2 | 2/2020 | Ogita et al. | |
| 10,573,837 B2 | 2/2020 | Hashimoto et al. | |
| 10,756,287 B2 | 8/2020 | Seo et al. | |
| 10,892,414 B2 * | 1/2021 | Béalle | H10K 50/11 |
| 10,984,755 B2 | 4/2021 | Chida | |
| 11,046,667 B2 | 6/2021 | Ogita et al. | |
| 11,094,903 B2 | 8/2021 | Ohsawa et al. | |
| 11,233,201 B2 | 1/2022 | Li et al. | |
| 11,943,944 B2 * | 3/2024 | Takita | H10K 85/6574 |
| 11,974,447 B2 * | 4/2024 | Seo | H10K 85/321 |
| 2015/0359816 A1 | 12/2015 | Parsons | |
| 2018/0138416 A1 | 5/2018 | Seo et al. | |
| 2019/0088897 A1 | 3/2019 | Seo et al. | |
| 2019/0392786 A1 | 12/2019 | Chida | |
| 2020/0199135 A1 | 6/2020 | Kurihara et al. | |
| 2021/0193081 A1 | 6/2021 | Chida | |
| 2021/0249619 A1 | 8/2021 | Seo et al. | |
| 2021/0367177 A1 | 11/2021 | Seo et al. | |
| 2021/0376275 A1 | 12/2021 | Ohsawa et al. | |
| 2022/0106286 A1 | 4/2022 | Ogita et al. | |
| 2022/0149308 A1 * | 5/2022 | Seo | H10K 50/16 |
| 2022/0328784 A1 | 10/2022 | Seo et al. | |

FOREIGN PATENT DOCUMENTS

| | | |
|---|---|---|
| CN | 110476267 A | 11/2019 |
| DE | 112018001877 | 12/2019 |
| EP | 2330652 A | 6/2011 |
| EP | 3276698 A | 1/2018 |
| EP | 3567646 A | 11/2019 |
| JP | 2015-126140 A | 7/2015 |
| JP | 2018-193597 A | 12/2018 |
| JP | 2018-201012 A | 12/2018 |
| JP | 2019-006763 A | 1/2019 |
| JP | 2019-006783 A | 1/2019 |
| JP | 2019-035933 A | 3/2019 |
| JP | 2019-052151 A | 4/2019 |
| KR | 2019-0094376 A | 8/2019 |
| KR | 2019-0131569 A | 11/2019 |
| TW | 201840028 | 11/2018 |
| TW | 201902904 | 1/2019 |
| TW | 201906846 | 2/2019 |
| WO | WO-2011/065136 | 6/2011 |
| WO | WO-2014/171986 | 10/2014 |
| WO | WO-2018/116112 | 6/2018 |
| WO | WO-2018/185642 | 10/2018 |
| WO | WO-2018/234926 | 12/2018 |
| WO | WO-2019/001182 | 1/2019 |

OTHER PUBLICATIONS

Written Opinion (Application No. PCT/IB2020/054305) Dated Jul. 7, 2020.

Taiwanese Office Action (Application No. 109114984) Dated Mar. 26, 2024.

* cited by examiner

LIGHT-EMITTING DEVICE, LIGHT-EMITTING APPARATUS, ELECTRONIC DEVICE, AND LIGHTING DEVICE

CROSS REFERENCE TO RELATED APPLICATIONS

This application is a U.S. National Phase Application under 35 U.S.C. § 371 of International Application PCT/IB2020/054305, filed on May 7, 2020, which is incorporated by reference and claims the benefit of foreign priority applications filed in Japan on May 17, 2019, as Application No. 2019-094017 and on Nov. 29, 2019, as Application No. 2019-216119.

TECHNICAL FIELD

One embodiment of the present invention relates to a light-emitting device, a light-emitting apparatus, an electronic device, and a lighting device. However, embodiments of the present invention are not limited thereto. That is, one embodiment of the present invention relates to an object, a method, a manufacturing method, or a driving method. Another embodiment of the present invention relates to a process, a machine, manufacture, or a composition of matter.

BACKGROUND ART

Light-emitting devices (also referred to as organic EL devices or organic EL elements) utilizing electroluminescence (EL) using organic compounds have increasingly been put into practical use. In the basic structure of such light-emitting devices, an organic compound layer containing a light-emitting substance (an EL layer) is sandwiched between a pair of electrodes. Carriers are injected by application of voltage to the element, and recombination energy of the carriers is used, whereby light emission from the light-emitting substance can be obtained.

Such light-emitting devices are of self-light-emitting type and thus have advantages over liquid crystal, such as high visibility and no need for backlight when used for pixels of a display, and are suitable as flat panel display elements. Displays including such light-emitting devices are also highly advantageous in that they can be thin and lightweight. Moreover, an extremely fast response speed is also a feature.

Since light-emitting layers of such light-emitting devices can be successively formed two-dimensionally, planar light emission can be achieved. This feature is difficult to realize with point light sources typified by incandescent lamps and LEDs or linear light sources typified by fluorescent lamps; thus, the light-emitting devices also have great potential as planar light sources, which can be applied to lighting and the like.

Displays and lighting devices including light-emitting devices have been applied to a variety of electronic devices as described above, and further research and development of light-emitting devices have progressed for higher efficiency and a longer lifetime.

In a structure disclosed in Patent Document 1, a hole-transport material whose HOMO level is between the HOMO level of a first hole-injection layer and the HOMO level of a host material is provided between a light-emitting layer and a first hole-transport layer in contact with a hole-injection layer.

REFERENCE

Patent Document

[Patent Document 1] PCT International Publication No. WO2011/065136

SUMMARY OF THE INVENTION

Problems to be Solved by the Invention

Although having been dramatically improved so far, the characteristics of light-emitting devices cannot be deemed sufficient to meet high demands for characteristics such as efficiency and reliability.

In view of the above, an object of one embodiment of the present invention is to provide a novel light-emitting device. Another object is to provide a light-emitting device with high emission efficiency. Another object is to provide a light-emitting device with a long lifetime. Another object is to provide a light-emitting device with low driving voltage.

An object of another embodiment of the present invention is to provide a light-emitting apparatus, an electronic device, and a display device each having high reliability. An object of another embodiment of the present invention is to provide a light-emitting apparatus, an electronic device, and a display device each having low power consumption.

Note that the description of these objects does not preclude the existence of other objects. Note that one embodiment of the present invention does not have to achieve all of these objects. Note that objects other than these will be apparent from the description of the specification, the drawings, the claims, and the like, and objects other than these can be derived from the description of the specification, the drawings, the claims, and the like.

Means for Solving the Problems

According to one embodiment of the present invention, in a light-emitting device that includes an EL layer between a pair of electrodes, the carrier balance is controlled with a hole-injection layer and an electron-transport layer of the EL layer having certain structures, so that the carrier balance spontaneously changes during driving and the initial degradation of the light-emitting device is inhibited. In addition, the rate of the spontaneous change is low when an electron-injection barrier at the interface between a light-emitting layer and the electron-transport layer of the EL layer which are stacked is high; thus, it is possible to obtain a light-emitting device which is excellent in terms of long-term degradation. As a result, a decay curve at the time of driving the light-emitting device is close to a flatter shape both at the initial stage of driving and over a long period. Note that the electron-injection barrier can inhibit the electrons injected from a cathode side into the light-emitting layer from reaching a hole-transport layer and can also inhibit degradation of the hole-transport layer accompanying the electron injection.

One embodiment of the present invention is a light-emitting device which includes an EL layer between an anode and a cathode and in which the EL layer includes a hole-injection layer, a light-emitting layer, and an electron-transport layer from the anode side; the hole-injection layer is in contact with the anode; the hole-injection layer contains a first substance and a second substance; the first substance has an electron-accepting property with respect to the second substance; the second substance has a HOMO level higher than or equal to −5.7 eV and lower than or equal to −5.4 eV; the light-emitting layer contains a third substance and a fourth substance, which is a host material; the electron-transport layer includes a first electron-transport layer and a second electron-transport layer; the first electron-transport layer is in contact with the light-emitting layer; the first electron-transport layer contains a fifth substance; the second electron-transport layer contains a sixth substance; the fifth substance is an electron-transport material; the sixth substance is a metal, a metal salt, a metal oxide, or a metal complex; and the LUMO level of the fifth substance is deeper than the LUMO level of the fourth substance and the difference therebetween is greater than or equal to 0.15 eV and less than or equal to 0.40 eV. At this time, the second electron-transport layer can further contain a seventh substance that is an electron-transport material.

Another embodiment of the present invention is a light-emitting device which includes an EL layer between an anode and a cathode and in which the EL layer includes a hole-injection layer, a light-emitting layer, and an electron-transport layer from the anode side; the hole-injection layer is in contact with the anode; the hole-injection layer contains a first substance and a second substance; the first substance has an electron-accepting property with respect to the second substance; the second substance has a HOMO level higher than or equal to −5.7 eV and lower than or equal to −5.4 eV; the light-emitting layer contains a third substance and a fourth substance, which is a host material; the electron-transport layer includes a first electron-transport layer and a second electron-transport layer; the first electron-transport layer is in contact with the light-emitting layer; the first electron-transport layer contains a fifth substance and a sixth substance; the second electron-transport layer contains a seventh substance; the fifth substance and the seventh substance are an electron-transport material; the sixth substance is a metal, a metal salt, a metal oxide, or a metal complex; and the LUMO level of the fifth substance is deeper than the LUMO level of the fourth substance and the difference therebetween is greater than or equal to 0.15 eV and less than or equal to 0.40 eV.

Another embodiment of the present invention is a light-emitting device which includes an EL layer between an anode and a cathode and in which the EL layer includes a hole-injection layer, a light-emitting layer, and an electron-transport layer from the anode side; the hole-injection layer is in contact with the anode; the hole-injection layer contains a first substance and a second substance; the first substance has an electron-accepting property with respect to the second substance; the second substance has a HOMO level higher than or equal to −5.7 eV and lower than or equal to −5.4 eV; the light-emitting layer contains a third substance and a fourth substance, which is a host material; the electron-transport layer includes a first electron-transport layer and a second electron-transport layer; the first electron-transport layer is in contact with the light-emitting layer; the first electron-transport layer contains a fifth substance and a sixth substance; the second electron-transport layer contains a seventh substance and an eighth substance; the proportion of the sixth substance in the first electron-transport layer is higher than the proportion of the eighth substance in the second electron-transport layer; the fifth substance and the seventh substance are an electron-transport material; the sixth substance and the eighth substance are a metal, a metal salt, a metal oxide, or a metal complex; and the LUMO level of the fifth substance is deeper than the LUMO level of the fourth substance and the difference therebetween is greater than or equal to 0.15 eV and less than or equal to 0.40 eV.

At this time, the proportions of the sixth substance and the eighth substance in the layers are preferably weight %.

In the above structure, the sixth substance and the eighth substance are preferably the same. Moreover, in any of the above structures, the fifth substance and the seventh substance are preferably the same.

In any of the above structures, it is preferable that the LUMO level of the fifth substance be deeper than the LUMO level of the fourth substance and the difference therebetween be greater than or equal to 0.20 eV and less than or equal to 0.40 eV.

In any of the above structures, the fifth substance preferably has a HOMO level higher than or equal to −6.0 eV.

In any of the above structures, the fifth substance preferably has an electron mobility higher than or equal to $1 \times 10^{-7}$ cm$^2$/Vs and lower than or equal to $5 \times 10^{-5}$ cm$^2$/Vs when the square root of the electric field strength [V/cm] is 600.

In any of the above structures, it is preferable that the light-emitting layer further contain a ninth substance and a combination of the fourth substance and the ninth substance form an exciplex. Note that the fourth substance is preferably an electron-transport material and the ninth substance is preferably a hole-transport material.

In any of the above structures, it is preferable that the EL layer include a hole-transport layer, the hole-transport layer be positioned between the hole-injection layer and the light-emitting layer, the hole-transport layer contain a tenth substance, the tenth substance be lower than or equal to the HOMO level of the second substance and higher than the HOMO level of the fourth substance. Note that the tenth substance preferably has at least one of a carbazole skeleton, a dibenzofuran skeleton, a dibenzothiophene skeleton, and a fluorene skeleton. Note that the tenth substance is preferably the same as the second substance.

In any of the above structures, the sixth substance and the eighth substance are preferably a metal complex containing an alkali metal or an alkaline earth metal.

In any of the above structures, the sixth substance and the eighth substance are preferably a metal complex that contains an alkali metal or an alkaline earth metal and a ligand containing nitrogen and oxygen.

In any of the above structures, the sixth substance and the eighth substance are preferably a metal complex that contains a monovalent metal ion and a ligand containing nitrogen and oxygen.

In any of the above structures, the sixth substance and the eighth substance are preferably a metal complex that contains a monovalent metal ion and a ligand including an 8-hydroxyquinolinato structure.

In any of the above structures, the sixth substance and the eighth substance are preferably a lithium complex that contains a ligand including an 8-hydroxyquinolinato structure.

Note that one embodiment of the present invention includes, in its category, in addition to a light-emitting apparatus including the above-described light-emitting device (also referred to as light-emitting element), an electronic device including a light-emitting device or a light-emitting apparatus (specifically, an electronic device including a light-emitting device or a light-emitting apparatus and a connection terminal or an operation key) and a lighting device including a light-emitting device or a light-emitting apparatus (specifically, a lighting device including a light-emitting device or a light-emitting apparatus and a housing). Accordingly, a light-emitting apparatus in this specification refers to an image display device or a light source (including a lighting apparatus). Moreover, a light-emitting apparatus includes a module in which a light-emitting apparatus is connected to a connector such as an FPC (Flexible Printed Circuit) or a TCP (Tape Carrier Package), a module in which a printed wiring board is provided on the tip of a TCP, and a module in which an IC (integrated circuit) is directly mounted on a light-emitting device by a COG (Chip On Glass) method.

Effect of the Invention

According to one embodiment of the present invention, a novel light-emitting device can be provided. A light-emitting device with a long lifetime can be provided. A light-emitting device with high emission efficiency can be provided.

According to another embodiment of the present invention, a light-emitting apparatus, an electronic device, and a display device each having high reliability can be provided. According to another embodiment of the present invention, a light-emitting apparatus, an electronic device, and a display device each having low power consumption can be provided.

Note that the description of these effects does not preclude the existence of other effects. One embodiment of the present invention does not have to have all of these effects. Note that effects other than these will be apparent from the description of the specification, the drawings, the claims, and the like, and effects other than these can be derived from the description of the specification, the drawings, the claims, and the like.

MODE FOR CARRYING OUT THE INVENTION

Embodiments of the present invention will be described in detail below with reference to the drawings. Note that the present invention is not limited to the following description, and it will be readily appreciated by those skilled in the art that modes and details of the present invention can be modified in various ways without departing from the spirit and scope of the present invention. Thus, the present invention should not be construed as being limited to the description in the following embodiments.

Embodiment 1

In this embodiment, a structure of a light-emitting device of one embodiment of the present invention is described with reference to FIG. 1.

Figure 1A:
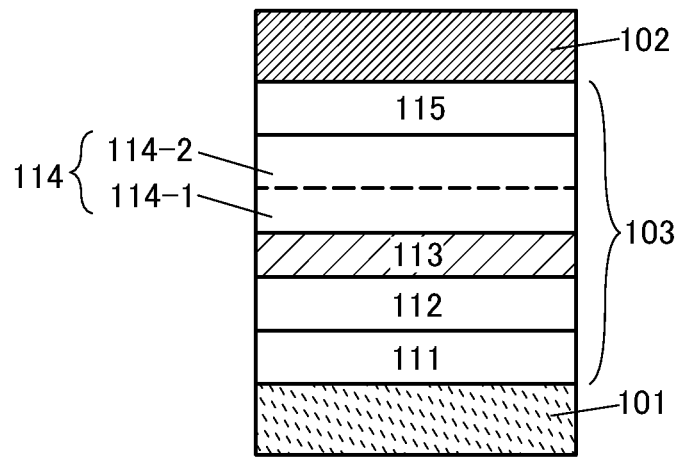
FIG. 1A, FIG. 1B, and FIG. 1C are diagrams showing structures of a light-emitting device.

FIG. 1A shows a light-emitting device having a structure in which an EL layer 103 is sandwiched between a first electrode 101 functioning as an anode and a second electrode 102 functioning as a cathode. The EL layer 103 has a structure in which a hole-injection layer 111, a hole-transport layer 112, a light-emitting layer 113, an electron-transport layer 114, and an electron-injection layer 115 are sequentially stacked as functional layers.

The hole-injection layer 111 contains a first substance and a second substance. The first substance is a substance that exhibits an electron-accepting property with respect to the second substance. It is preferable that the second substance be a substance having a relatively deep HOMO level which is higher than or equal to −5.7 eV and lower than or equal to −5.4 eV and the second substance be a hole-transport material. The second substance with a relatively deep HOMO level facilitates hole injection into the hole-transport layer 112 and the light-emitting layer 113. Meanwhile, the relatively deep HOMO level of the second substance moderately weakens the interaction with the first substance exhibiting an electron-accepting property; thus, the generation amount of holes in the hole-injection layer 111 is relatively small and hole injection from the first electrode 101 (the anode) into the hole-injection layer 111 is moderately controlled. The above-mentioned range of the HOMO level is set for striking this balance appropriately.

Specific examples of the first substance and the second substance are described in detail in Embodiment 2.

The light-emitting layer 113 contains a third substance and a fourth substance. It is preferable that the third substance be a guest material and be a light-emitting material in the light-emitting layer 113. The fourth substance is preferably a host material. Specific examples of the third substance and the fourth substance are described in detail in Embodiment 2.

Here, in the light-emitting device of one embodiment of the present invention, there is an electron-injection barrier at the interface where the light-emitting layer 113 and the electron-transport layer 114 in the EL layer 103 are in contact with each other. Note that in the case where the electron-transport layer 114 includes a stacked structure of a plurality of layers, such as a stacked-layer structure including two layers of a first electron-transport layer 114-1 and a second electron-transport layer 114-2 as shown in FIG. 1A, there is an electron-injection barrier at the interface where the light-emitting layer 113 and the first electron-transport layer 114-1 are in contact with each other.

"There is an electron-injection barrier at the interface where the light-emitting layer 113 and the electron-transport layer 114 are in contact with each other" means that the LUMO level of the electron-transport material contained in the electron-transport layer 114 is deeper than the LUMO level of the host material contained in the light-emitting layer 113 and the difference therebetween is in a desired range. Accordingly, in the case of the structure in FIG. 1A in which the light-emitting layer 113 and the first electron-transport layer 114-1 are in contact with each other, the LUMO level of the electron-transport material (a fifth substance) contained in the first electron-transport layer 114-1 is deeper than the LUMO level of the host material (the fourth substance) contained in the light-emitting layer 113 and the difference therebetween is in a desired range. The desired range is described later.

Furthermore, the electron-transport layer 114 in the light-emitting device of one embodiment of the present invention contains a metal, a metal salt, a metal oxide, or a metal complex as a sixth substance. Examples of the metal include an alkali metal, an alkaline earth metal, and a rare earth metal.

The sixth substance is preferably a metal complex. Here, it is particularly preferable to use a metal complex containing an alkali metal or an alkaline earth metal. The sixth substance is further preferably a metal complex that contains an alkali metal or an alkaline earth metal and a ligand containing nitrogen and oxygen. Specific examples of the above alkali metal, alkaline earth metal, and rare earth metal include Li, Na, K, Rb, Cs, Mg, Ca, Sr, and Ba.

The above metal complex is preferably a metal complex that contains a monovalent metal ion and a ligand containing nitrogen and oxygen. The monovalent metal ion is preferably Ag, Au, or any of the above alkali metal ions.

Note that in the ligand containing nitrogen and oxygen, the nitrogen and the oxygen preferably chelate the metal.

The metal complex is preferably a metal complex that contains a monovalent metal ion and a ligand including an 8-hydroxyquinolinato structure. Examples of the ligand including an 8-hydroxyquinolinato structure are 8-hydroxyquinolinato, methyl-substituted (e.g., 2-methyl substituted or 5-methyl substituted) 8-hydroxyquinolinato, and the like. Note that the 8-hydroxyquinolinato structure refers to a structure in which a proton of a —OH group in substituted or unsubstituted 8-hydroxyquinolinol has been detached. The monovalent metal ion is preferably Ag, Au, or any of the above alkali metal ions.

Thus, examples of the above metal complex that contains an alkali metal or an alkaline earth metal include 8-(hydroxyquinolinato) lithium (abbreviation: Liq), which is a lithium complex having a ligand including an 8-hydroxyquinolinato structure, 8-(hydroxyquinolinato) sodium (abbreviation: Naq), which is a sodium complex having a ligand including an 8-hydroxyquinolinato structure, 8-(hydroxyquinolinato) potassium (abbreviation: Kq), which is a potassium complex having a ligand including an 8-hydroxyquinolinato structure, and bis(8-hydroxyquinolinato) magnesium (abbreviation: Mgq$_2$), which is a magnesium complex having a ligand including an 8-hydroxyquinolinato structure, and examples of other metal complexes include bis(8-hydroxyquinolinato) zinc (abbreviation: Znq$_2$), which is a zinc complex having a ligand including an 8-hydroxyquinolinato structure. Note that examples of the ligand including an 8-hydroxyquinolinato structure include not only 8-hydroxyquinolinato but also methyl-substituted (e.g., 2-methyl substituted or 5-methyl substituted) 8-hydroxyquinolinato. Furthermore, the 8-hydroxyquinolinato structure refers to a structure in which a proton of a —OH group in substituted or unsubstituted 8-hydroxyquinolinol has been detached.

Note that such a metal, metal salt, metal oxide, or metal complex, i.e., the sixth substance, is included in any region of the electron-transport layer 114 and for example, the sixth substance is included in any layer or both layers of the electron-transport layer 114 in the case where the electron-transport layer 114 has a stacked-layer structure.

For example, in a preferred structure, the electron-transport layer 114-1 in contact with the light-emitting layer 113 contains the fifth substance (the electron-transport material) and the electron-transport layer 114-2 contains the above sixth substance. At this time, it is further preferable that the electron-transport layer 114-2 further contain a seventh substance (an electron-transport material). In another preferred structure, the electron-transport layer 114-1 in contact with the light-emitting layer 113 contains the fifth substance (the electron-transport material) and the above sixth substance and the electron-transport layer 114-2 contains the seventh substance (the electron-transport material). In still another preferred structure, the first electron-transport layer 114-1 in contact with the light-emitting layer contains the fifth substance (the electron-transport material) and the sixth substance, the second electron-transport layer 114-2 contains the seventh substance (the electron-transport material) and an eighth substance (a metal, a metal salt, a metal oxide, or a metal complex like the sixth substance), and the proportion of the sixth substance in the first electron-transport layer 114-1 is higher than the proportion of the eighth substance in the second electron-transport layer 114-2. Note that in this case, the proportions of the sixth substance and the eighth substance in the layers are preferably weight %.

Note that in the above structure, the same material may be used as the sixth substance and the eighth substance. This can reduce the manufacturing cost. In addition, the effect of extending the lifetime of the present invention, which is described below, can be easily achieved.

In the above structure, the fifth substance and the seventh substance (each of which is an electron-transport material) may be the same material. This can reduce the manufacturing cost. In addition, the effect of extending the lifetime of the present invention, which is described below, can be easily achieved.

Figure 1B:
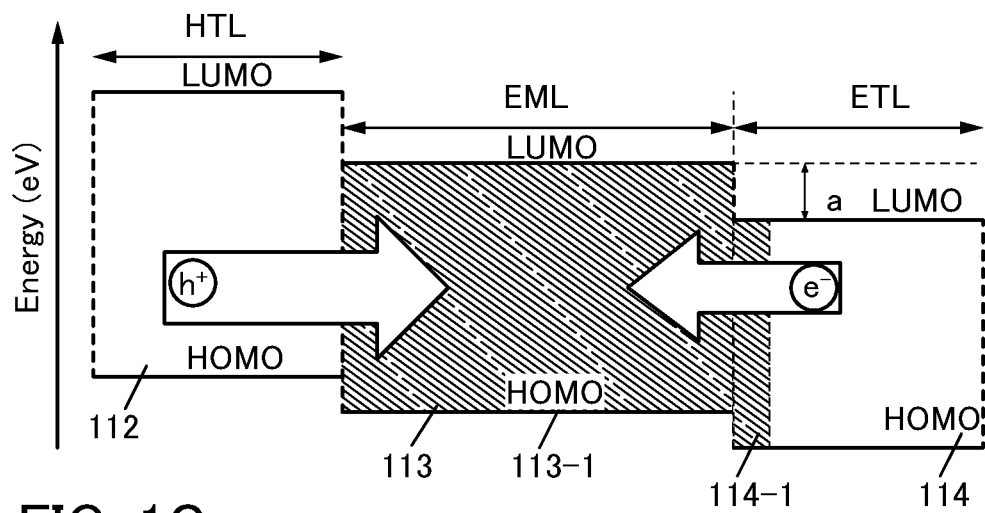

The above-described structure makes it possible to provide a light-emitting device having a long lifetime. Hereinafter, description is made with reference to FIG. 1B and FIG. 1C. FIG. 1B shows the state of the initial carrier movement in the light-emitting device of one embodiment of the present invention. In the light-emitting device of one embodiment of the present invention, as described above, the second substance having a relatively deep HOMO level facilitates hole injection into the hole-transport layer (HTL) 112 and the light-emitting layer (EML) 113. Meanwhile, since the LUMO level of the electron-transport material contained in the electron-transport layer 114 (ETL) is deeper than the LUMO level of the host material contained in the light-emitting layer 113 and the difference therebetween is in a desired range, electron injection and electron transport from the second electrode 102 (the cathode) to the light-emitting layer 113 are inhibited to the extent that does not significantly impair emission efficiency. As a result, in the initial state of the light-emitting device, a recombination region 113-1 in the light-emitting layer 113 slightly spreads into the first electron-transport layer 114-1, which is part of the electron-transport layer 114 (FIG. 1B).

Figure 1C:
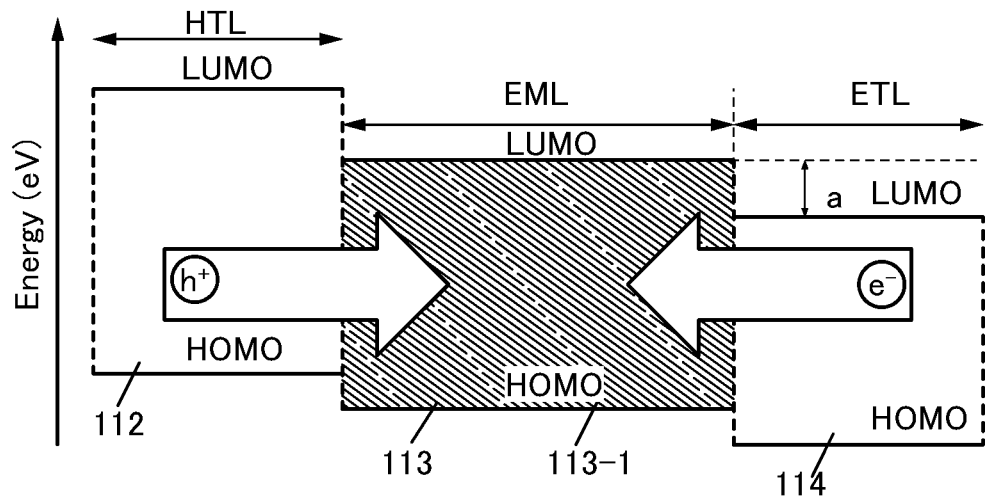

Next, at the time of driving this light-emitting device, a change as described below is caused at the initial stage of driving. First, a change in the quality of the sixth substance (and the eighth substance) contained in the electron-transport layer 114 gradually improves the electron-transport property of the electron-transport layer 114. Meanwhile, as described above, the generation amount of holes in the hole-injection layer 111 is relatively small and hole injection from the first electrode 101 (the anode) into the hole-injection layer 111 is moderately controlled. Thus, the recombination region that has slightly spread into part of the electron-transport layer changes, so that recombination occurs at an inner portion of the light-emitting layer (FIG. 1C).

This means that driving leads to a spontaneous change toward slight improvement of the emission efficiency. This change offsets degradation, offering a light-emitting device with less initial degradation. In some cases, the luminance demonstrates a tendency to temporarily increase, as can be seen in a region (d) in the graph of the reliability of the light-emitting device in FIG. 2A.

Moreover, since there is an electron-injection barrier at the interface where the light-emitting layer 113 and the electron-transport layer 114 are in contact with each other, the proportion of electrons injected from the electron-transport layer (ETL) 114 toward the light-emitting layer 113 is controlled. This means that the rate of the above-described spontaneous change is low and the effect of the spontaneous change can be obtained over a long period, which makes the light-emitting device excellent also in terms of long-term degradation. As a result, a decay curve at the time of driving the light-emitting device is close to a flatter shape both at the initial stage of driving and over a long period. Note that the proportion of electrons injected into the hole-transport layer 112 through the light-emitting layer 113 decreases and thus, degradation of the hole-transport layer 112 due to electron injection can be inhibited and the effect of increasing the reliability of the light-emitting device can be achieved.

It is known that such a spontaneous change in electron-injection and electron-transport properties is induced by the sixth substance (and the eighth substance) at a certain content or more in the electron-transport layer. The effect is particularly easily achieved in the case where the sixth substance (and the eighth substance) is a metal complex as described above. This effect is brought to the fore when the sixth substance (and the eighth substance) is a metal complex containing an alkali metal or an alkaline earth metal; a metal complex that contains an alkali metal or an alkaline earth metal and a ligand containing nitrogen and oxygen; a metal complex that contains a monovalent metal ion and a ligand containing nitrogen and oxygen; or a metal complex that contains a monovalent metal ion and a ligand including an 8-hydroxyquinolinato structure.

A commonality between these metal complexes is relatively high planarity. It can be thus deemed that the above-described spontaneous change in electron-injection and electron-transport properties is caused by the phase change of any of these metal complexes or the interaction between any of these metal complexes and the electron-transport material (the fifth substance or the seventh substance). Note that the mechanism for extending the lifetime of the light-emitting device of one embodiment of the present invention is not limited to this mechanism.

Note that as described above, the electron-transport layer needs to contain the sixth substance (and the eighth substance) at a certain content or more. The proportion is preferably higher than or equal to 55% and lower than or equal to 80% by weight % in each layer that contains the sixth substance (and the eighth substance). The proportion is further preferably higher than or equal to 65% and lower than or equal to 80%.

Next, a desired range of the above-described electron-injection barrier at the interface where the light-emitting layer 113 and the electron-transport layer 114 are in contact with each other is described. The electron-injection barrier is the difference between the LUMO level of the electron-transport material contained in the electron-transport layer 114 and the LUMO level of the host material contained in the light-emitting layer 113, and corresponds to the step denoted by a in FIG. 1B and FIG. 1C.

Note that too high an electron-injection barrier provided at the interface where the light-emitting layer 113 and the electron-transport layer 114 are in contact with each other hinders carrier recombination and accordingly reduces the emission efficiency. Thus, a plurality of light-emitting devices different in the electron-transport material used for the electron-transport layer 114 were fabricated, where 9-(1-naphthyl)-10-[4-(2-naphthyl)phenyl]anthracene (abbreviation: αN-BNP Anth) was used as an example of the host material in the light-emitting layer 113, and the reliability of the light-emitting devices was evaluated to find out the above desired range. Actual evaluation results are described in Example 1 and Example 2.

Note that the electron-transport materials used in Example 1 and Example 2 are 2-{4-[9,10-di(naphthalen-2-yl)-2-anthryl]phenyl}-1-phenyl-1H-benzimidazole (abbreviation: ZADN), 2-[3'-(dibenzothiophen-4-yl) biphenyl-3-yl] dibenzo[f,h]quinoxaline (abbreviation: 2mDBTBPDBq-II), and 2-phenyl-3-{4-[10-(3-pyridyl)-9-anthryl] phenyl}quinoxaline (abbreviation: PyA1PQ). Note that the LUMO levels of these electron-transport materials used for the electron-transport layer 114 and αN-BNP Anth used for the light-emitting layer 113 and the difference between the LUMO level of each of these electron-transport materials and that of αN-βNPAnth are as listed in Table 1 below.

TABLE 1

| Name of substance (abbreviation) | LUMO level (eV) | Δ: Difference from αN-βNP Anth (eV) |
|---|---|---|
| αN-βNPAnth | −2.74 | 0 |
| ZADN | −2.87 | 0.13 |
| 2mDBTBPDBq-II | −2.94 | 0.20 |
| PyA1PQ | −3.00 | 0.26 |

In Example 1 and Example 2, 2mDBTBPDBq-II and PyA1PQ having a large difference from αN-βNPAnth of 0.20 eV or more showed high reliability as compared to ZADN with a small difference from αN-βNPanth of 0.13 eV. In other words, the devices were obtained in which long-term degradation was inhibited as well as initial degradation. It was thus found that the LUMO level of the electron-transport material contained in the electron-transport layer 114 and the LUMO level of the host material contained in the light-emitting layer 113 preferably have the following relationship to form an electron-injection barrier at the interface where the light-emitting layer 113 and the electron-transport layer 114 are in contact with each other so that the reliability of a device is improved within such a range as not to adversely affect the device characteristics of the light-emitting device. That is, it was found that the LUMO level of the electron-transport material used for the electron-transport layer 114 is preferably deeper than the LUMO level of the host material contained in the light-emitting layer 113, and that the difference therebetween is preferably greater than or equal to 0.15 eV and less than or equal to 0.40 eV, greater than or equal to 0.20 eV and less than or equal to 0.40 eV, or greater than or equal to 0.20 eV and less than or equal to 0.35 eV.

In view of the above, besides N-βNPAnth described above, 9-(1-naphthyl)-10-[3-(1-naphthyl)phenyl]anthracene (abbreviation: αN-mαNPAnth), 9-(2-naphthyl)-10-[3-(1-naphthyl)phenyl]anthracene (abbreviation: βN-mαNPAnth), and 9-(2-naphthyl)-10-[3-(2-naphthyl) phenyl]anthracene (abbreviation: βN-mβNPAnth) which are represented by the following structural formulae and are deemed to exhibit physical properties similar to those of αN-βNPAnth can be used as the host material in the light-emitting layer 113 of the light-emitting device of one embodiment of the present invention, for example. Note that the host material is not limited thereto.

[Chemical Formula 1]

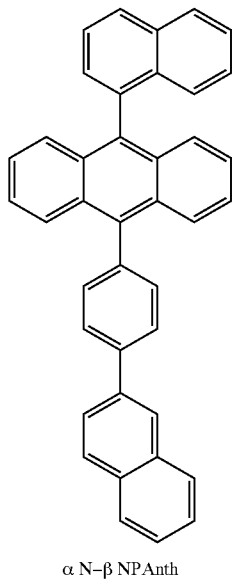

αN–β NPAnth

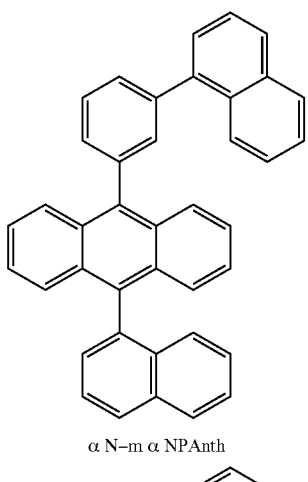

αN–m α NPAnth

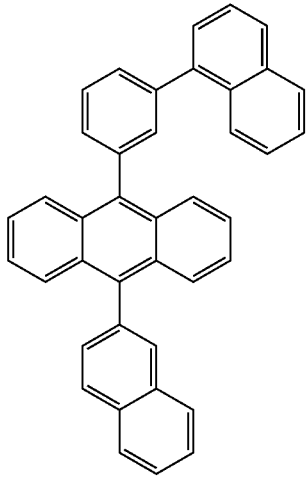

β N–m α NPAnth

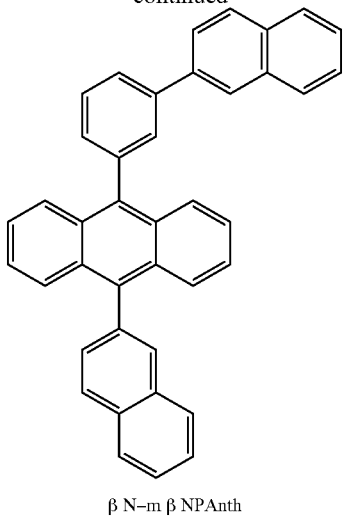

β N–m β NPAnth

Note that the LUMO levels of these host materials are as listed in Table 2 below.

TABLE 2

| Host material (abbreviation) | LUMO level (eV) |
|---|---|
| αN-βNP Anth | −2.74 |
| αN-mαNP Anth | −2.74 |
| βN-mαNP Anth | −2.74 |
| βN-mβNP Anth | −2.73 |

The electron-transport material (particularly, the fifth substance) used for the electron-transport layer 114 of the light-emitting device of one embodiment of the present invention is required to have a relatively deep LUMO level. Thus, the electron-transport material is preferably a compound having a six-membered heteroaromatic ring containing two or three nitrogens. Specifically, the electron-transport material preferably has a diazine skeleton (a pyrimidine skeleton, a pyrazine skeleton, or a pyridazine skeleton) or a triazine skeleton. In particular, a compound having a fused heteroaromatic ring in which an aromatic ring or a heteroaromatic ring is further fused to the above diazine skeleton is preferred. Examples of such a fused heteroaromatic ring include a quinoxaline ring, a dibenzoquinoxaline ring, a benzofuropyrimidine ring, a benzothiopyrimidine ring, a naphthofuropyrazine ring, and a phenanthrofuropyrazine ring. The above compound having a six-membered heteroaromatic ring containing two or three nitrogens preferably has another heteroaromatic ring (e.g., a pyridine ring or a dibenzothiophene ring). This is because the above-described spontaneous change in electron-injection and electron-transport properties of the electron-transport layer 114 is relevant. In addition to 2mDBTBPDBq-II and PyA1PQ above, for example, it is possible to use any of the following specific compounds which are represented by structural formulae below, although one embodiment of the present invention is not limited thereto: 2-phenyl-3-{4-[10-(pyrimidin-5-yl)-9-anthryl]phenyl}quinoxaline (abbreviation: 1PQPmA), 2-phenyl-3-{4-[10-(pyrazin-2-yl)-9-anthryl]phenyl}quinoxaline (abbreviation: 1PQPrA), 2-phenyl-3-{4-[4-(3-pyridyl)-1-naphthyl]phenyl}quinoxaline (abbreviation: PyN1PQ), 2-phenyl-3-{4-[5-(3-pyridyl)-1-naphthyl]phenyl}quinoxaline (abbreviation: PyN1PQ-02), 2-phenyl-3-[4-(10-phenyl-9-anthryl)

phenyl]quinoxaline (abbreviation: PA1PQ), 2-phenyl-3-[4-(2-pyridyl)phenyl]quinoxaline (abbreviation: 2Py1PQ), 2-phenyl-3-[4-(3-pyridyl)phenyl]quinoxaline (abbreviation: 3Py1PQ), 2,3-bis[4-(3-pyridyl)phenyl]quinoxaline (abbreviation: 3Py2PQ), 2-phenyl-3-[4'-(3-pyridyl)biphenyl-4-yl]quinoxaline (abbreviation: PPy1PQ), 2,2'-(pyridine-2,6-diyl)bis[4-phenylbenzo[h]quinazoline](abbreviation: 2,6(P-Bqn)2Py), 2-[3-(dibenzothiophen-4-yl)phenyl]dibenzo[f,h]quinoxaline (abbreviation: 2mDBTPDBq-II), 2-[3-(dibenzofuran-4-yl)phenyl]dibenzo[f,h]quinoxaline (abbreviation: 2mDBFPDBq-II), 2-[3-(3,6-diphenyl-9H-carbazol-9-yl)phenyl]dibenzo[f,h]quinoxaline (abbreviation: 2mCzPDBq-III), 2-[3'-(9H-carbazol-9-yl)biphenyl-3-yl]dibenzo[f,h]quinoxaline (abbreviation: 2mCzBPDBq), 2-[4-(9-phenyl-9H-carbazol-3-yl)phenyl]dibenzo[f,h]quinoxaline (abbreviation: PCPDBq), 2,2'-(pyridine-2,6-diyl)bis(4-phenylbenzo[h]quinazoline) (abbreviation: 2,6(P-Bqn)2Py), 4-[3'-(dibenzothiophen-4-yl)biphenyl-3-yl]benzofuro[3,2-d]pyrimidine (abbreviation: 4mDBTBPBfpm-II), 4-[3'-(9H-carbazol-9-yl)biphenyl-3-yl]benzofuro[3,2-d]pyrimidine (abbreviation: 4mCzBPBfpm), 4,8-bis[3-(dibenzothiophen-4-yl)phenyl]benzofuro[3,2-d]pyrimidine (abbreviation: 4,8mDBtP2Bfpm), 4,8-bis[3-(dibenzothiophen-4-yl)phenyl]benzothio[3,2-d]pyrimidine (abbreviation: 4,8mDBtP2Btpm), 4,6-bis[3-(dibenzothiophen-4-yl)phenyl]benzofuro[3,2-d]pyrimidine (abbreviation: 4,6mDBtP2Bfpm), 4,8-bis[3-(9H-carbazol-9-yl)phenyl]benzofuro[3,2-d]pyrimidine (abbreviation: 4,8mCzP2Bfpm), 9-[3'-(dibenzothiophen-4-yl)biphenyl-3-yl]naphtho[1',2':4,5]furo[2,3-b]pyrazine (abbreviation: 9mDBtBPNfpr), 10-[3'-(dibenzothiophen-4-yl)biphenyl-3-yl]naphtho[1',2':4,5]furo[2,3-b]pyrazine (abbreviation: 10mDBtBPNfpr), 12-[3'-(dibenzothiophen-4-yl)biphenyl-3-yl]phenanthro[9',10':4,5]furo[2,3-b]pyrazine (abbreviation: 12mDBtBPPnfpr), 9-[3'-(6-phenylbenzo[b]naphtho[1,2-d]furan-8-yl)biphenyl-3-yl]naphtho[1',2':4,5]furo[2,3-b]pyrazine (abbreviation: 9mBnfBPNfpr), and the like. Note that any of these substances can also be used as the seventh substance.

[Chemical Formula 2]

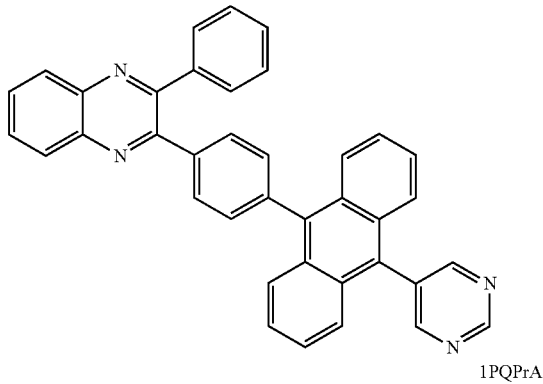

1PQPmA

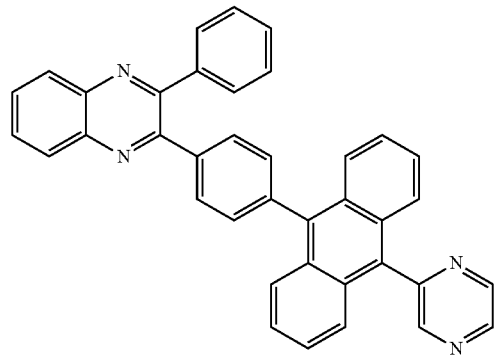

1PQPrA

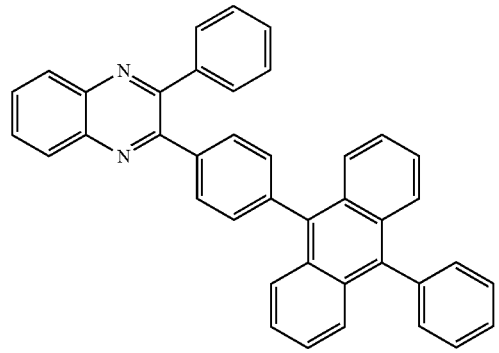

PA1PQ

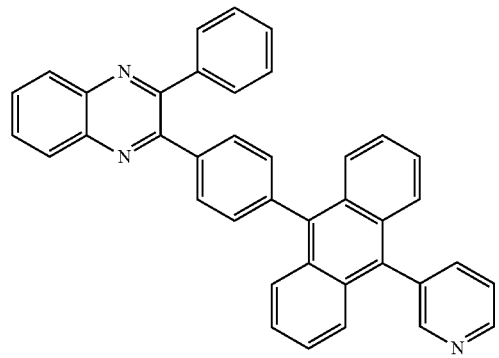

PyA1PQ

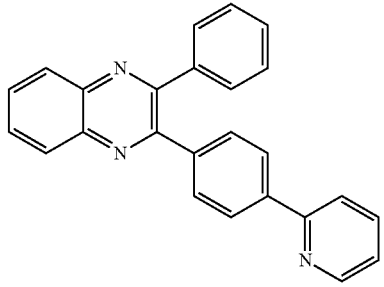

2Py1PQ

-continued
3Py1PQ
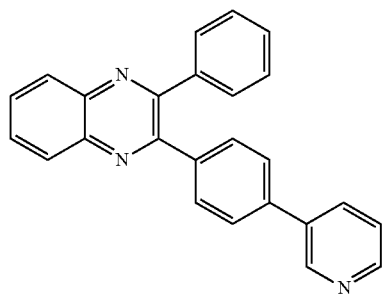
3Py2PQ
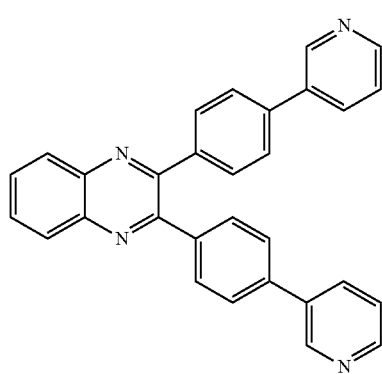
PPy1PQ
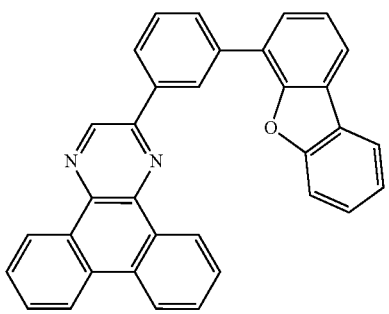
2mDBTPDBq-II
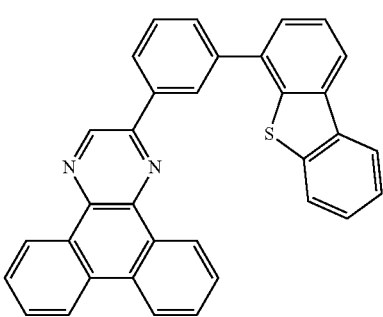
-continued
2mDBFPDBq-II
2mDBTBPDBq-II
2mCzPDBq-III
[Chemical Formula 3]
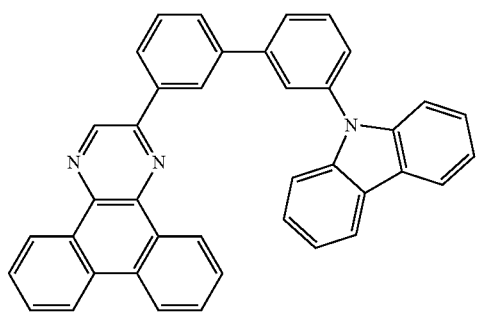
2mCzBPDBq

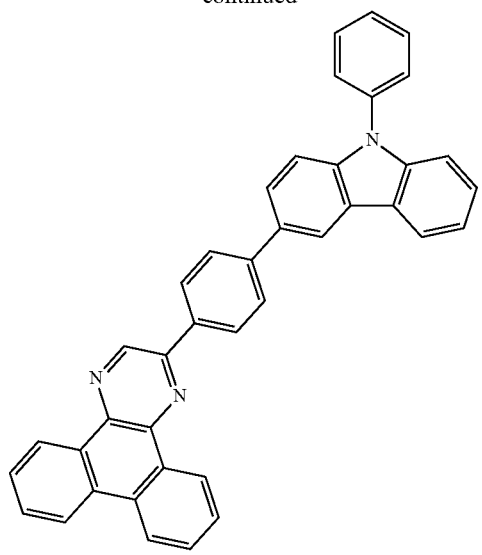
PCPDBq
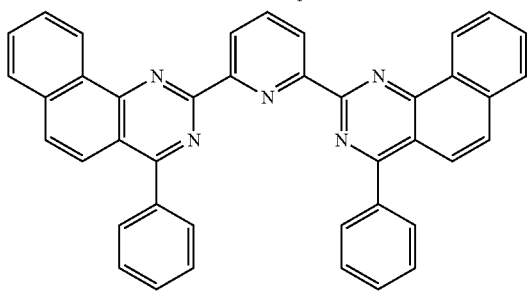
2,6(P-Bqn)2Py
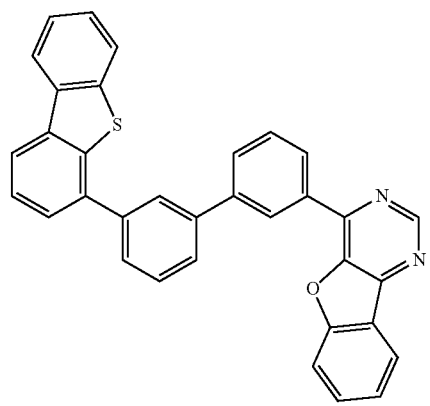
4mDBTBPBfpm-II
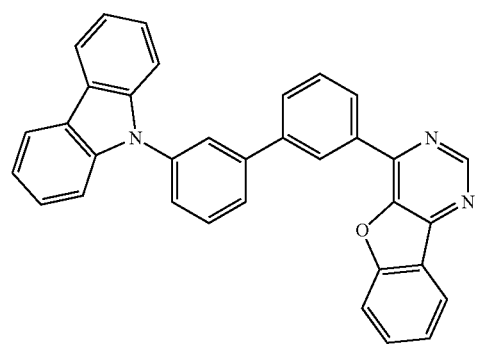
4mCzBPBfpm
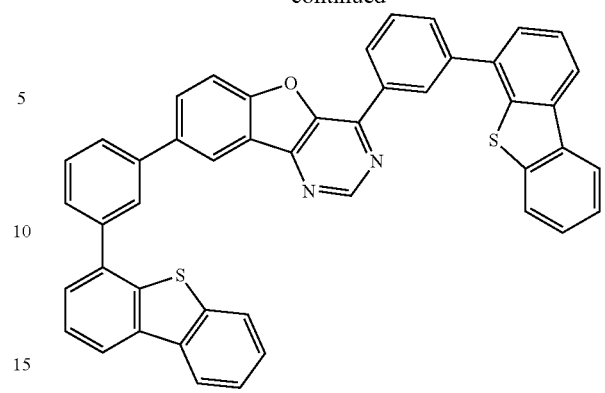
4,8mDBtP2Bfpm
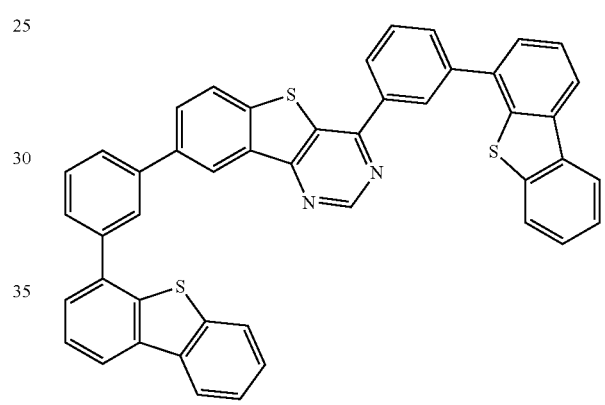
4,8mDBtP2Btpm
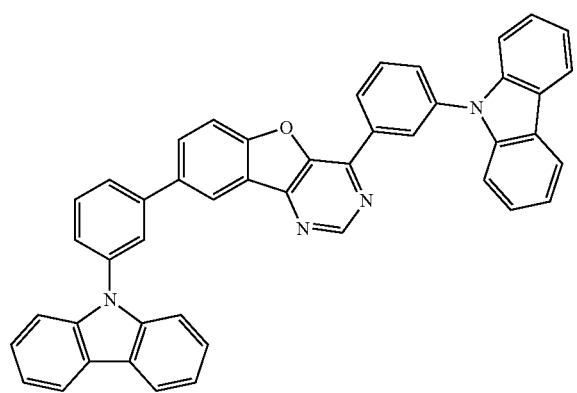
4,8mCzP2Bfpm -continued
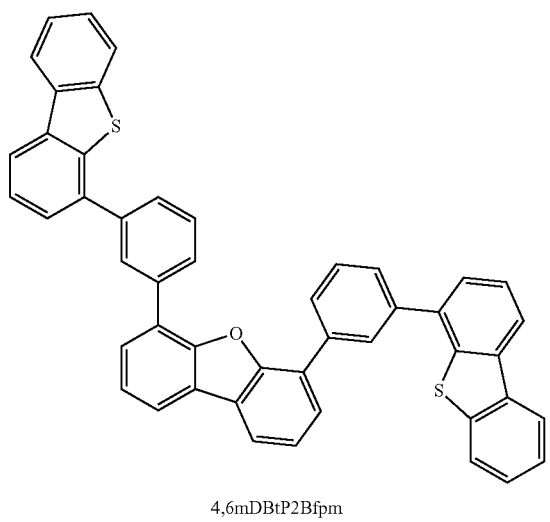 [SMILES: c1cc(-c2cccc3c2oc2c(-c4cccc(-c5cccc6c5sc5ccccc56)c4)cccc23)cc(-c2cccc3c2sc2ccccc23)c1]
4,6mDBtP2Bfpm
[Chemical Formula 4]
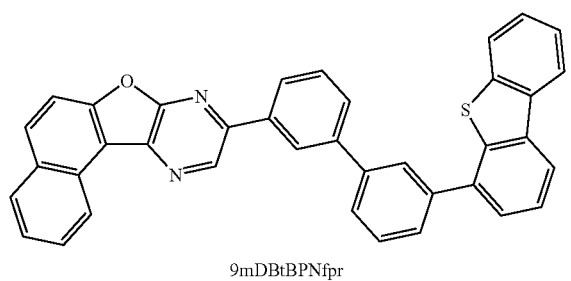
9mDBtBPNfpr
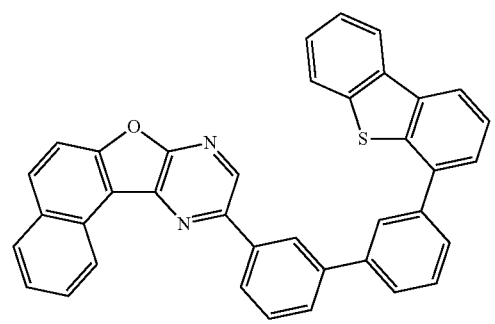
10mDBtBPNfpr
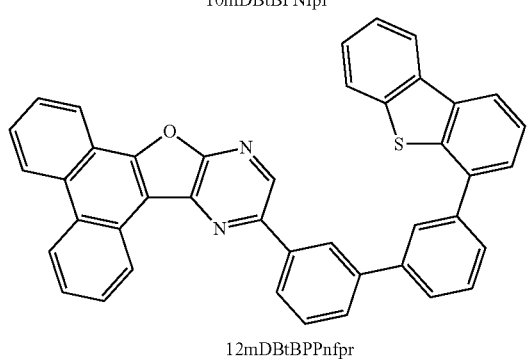
12mDBtBPPnfpr
-continued
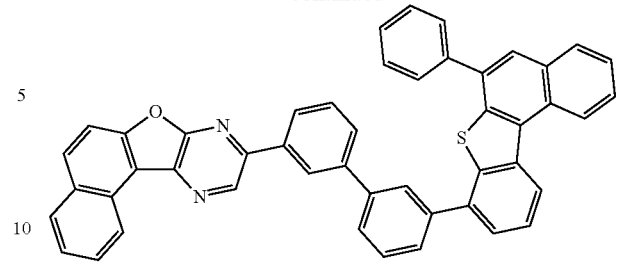
9mBnfBPNfpr
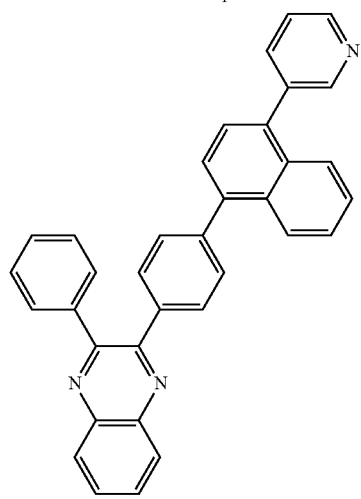
PyN1PQ
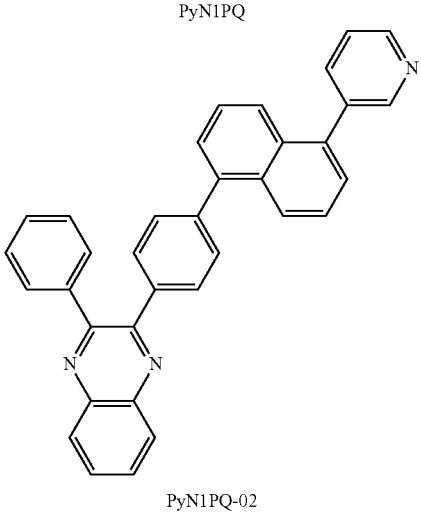
PyN1PQ-02
Note that the LUMO levels of these electron-transport materials are as listed in Table 3 below.
TABLE 3
| Electron-transport material (abbreviation) | LUMO level (eV) |
| --- | --- |
| PyA1PQ | −3.00 |
| 1PQPmA | −3.00 |
| 1PQPrA | −3.00 |
| PyN1PQ | −3.00 |
| PyN1PQ-02 | −3.00 |
| PA1PQ | −3.00 |
| 2Py1PQ | −3.01 |
| 3Py1PQ | −3.01 |

TABLE 3-continued

| Electron-transport material (abbreviation) | LUMO level (eV) |
|---|---|
| 3Py2PQ | −3.04 |
| PPy1PQ | −3.01 |
| 2mDBTPDBq-II | −2.95 |
| 2mDBFPDBq-II | −2.94 |
| 2mDBTBPDBq-II | −2.94 |
| 2mCzPDBq-III | −2.99 |
| 2mCzBPDBq | −2.95 |
| PCPDBq | −2.93 |
| 2,6(P-Bqn)2Py | −2.92 |
| 4mDBTBPBfpm-II | −2.96 |
| 4mCzBPBfpm | −2.97 |
| 4,8mDBtP2Bfpm | −3.02 |
| 4,8mDBtP2Btpm | −3.01 |
| 4,6mDBtP2Bfpm | −3.02 |
| 4,8mCzP2Bfpm | −3.06 |
| 9mDBtBPNfpr | −3.05 |
| 10mDBtBPNfpr | −2.97 |
| 12mDBtBPNfpr | −2.96 |
| 9mBnfBPNfpr | −3.03 |

As the electron-transport material used for the electron-transport layer 114 of the light-emitting device of one embodiment of the present invention, it is preferable to use an electron-transport material having a HOMO level higher than or equal to −6.0 eV and a LUMO level fulfilling the above conditions. This is because accepting a slight amount of holes at the initial stage of driving induces the mechanism shown in FIG. 1. Moreover, the electron mobility of this electron-transport material is preferably higher than or equal to $1\times10^{-7}$ cm$^2$/Vs and lower than or equal to $1\times10^{-5}$ cm$^2$/Vs, further preferably higher than or equal to $1\times10^{-7}$ cm$^2$/Vs and lower than or equal to $5\times10^{-5}$ cm$^2$/Vs in the case where the square root of the electric field strength [V/cm] is 600.

In the light-emitting device of one embodiment of the present invention, the relationship between the HOMO level of the hole-transport material (the second substance) used for the hole-injection layer 111 and that of the hole-transport material (a ninth substance) used for the hole-transport layer 112 is preferably as follows: the HOMO level of the hole-transport material used for the hole-transport layer 112 is lower than or equal to (deeper than or equal to) the HOMO level of the hole-transport material used for the hole-injection layer 111 and the difference therebetween is less than or equal to 0.2 eV. These hole-transport materials are preferably hole-transport materials each having a carbazole skeleton, a dibenzofuran skeleton, a dibenzothiophene skeleton, and a fluorene skeleton. Note that the hole-transport material (the second substance) used for the hole-injection layer 111 and the hole-transport material (the ninth substance) used for the hole-transport layer 112 are preferably the same substance. In this manner, the manufacturing cost can be reduced. In addition, a simple manufacturing apparatus can be used. Specific compounds are described in detail in Embodiment 2.

Note that although not shown in FIG. 1, a second hole-transport layer (e.g., an electron-blocking layer) may be provided between the hole-transport layer 112 and the light-emitting layer. In this case, it is preferable that the HOMO level of the hole-transport material contained in the second hole-transport layer be deeper than the HOMO level of the hole-transport material (the ninth substance) used for the hole-transport layer 112 and the difference therebetween be less than or equal to 0.2 eV. A compound that does not have a triarylamine structure is suitably used as the hole-transport material contained in the second hole-transport layer so that the HOMO level of the hole-transport material is close to the HOMO level of the host material of the light-emitting layer 113 (so that the hole-transport material has a deep HOMO level). Specific compounds are described in detail in Embodiment 2.

Figure 2A:
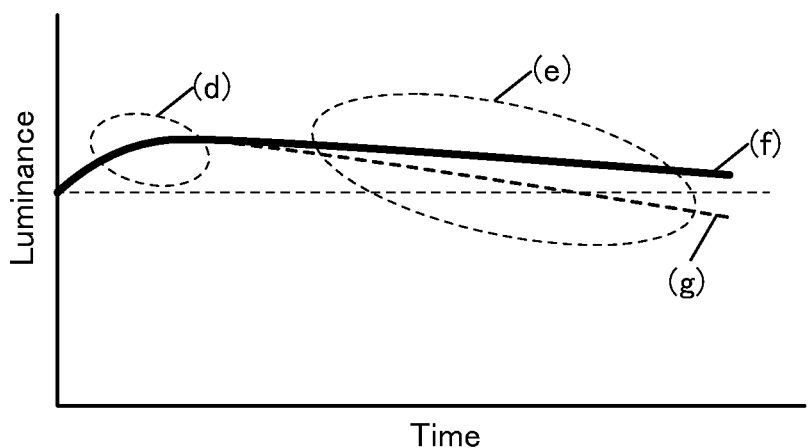
FIG. 2A and FIG. 2B are diagrams illustrating a mechanism of a light-emitting device.
Figure 2B:
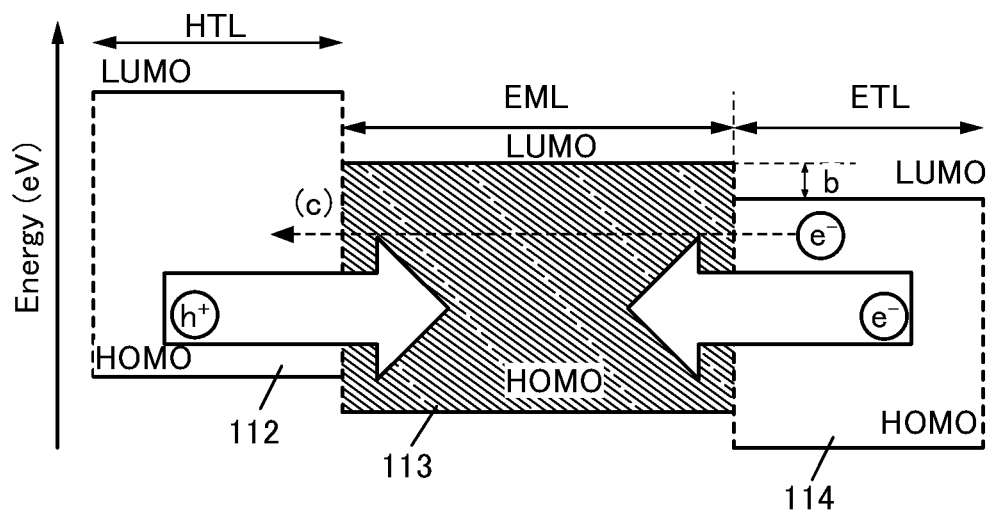

In FIG. 2A, the solid line indicates a decay curve (f) of the light-emitting device of one embodiment of the present invention shown in FIG. 1A, FIG. 1B, and FIG. 1C, whereas the dashed line indicates a decay curve (g) of another light-emitting device having a device structure shown in FIG. 2B. Note that in the graph shown in FIG. 2A, the horizontal axis represents time and the vertical axis represents emission luminance. Note that the light-emitting device having the device structure shown in FIG. 2B does not have the step (the electron-injection barrier) denoted by a in FIG. 1B and FIG. 1C at the interface where the light-emitting layer 113 and the electron-transport layer 114 are in contact with each other but has a step denoted by b (note that b<a). (Note that FIG. 2B shows a state after a predetermined time has elapsed after the start of driving).

Here, it is assumed that in each of the light-emitting devices shown in FIG. 1A, FIG. 1B, FIG. 1C, and FIG. 2B, the electron-injection and electron-transport properties of the electron-transport layer 114 spontaneously change toward slight improvement of the emission efficiency (it is assumed that the electron-injection and electron-transport properties are increased by driving). In this case, the initial degradation is inhibited as described above and the luminance sometimes slightly increases as shown by (d) in FIG. 2A. However, in the light-emitting device shown in FIG. 2B, the step b (note that b<a) at the interface where the light-emitting layer 113 and the electron-transport layer 114 are in contact with each other is insufficient as an electron-injection barrier. Thus, the rate of the spontaneous change cannot be low and the effect of the spontaneous change cannot be obtained over a long period, which is disadvantageous in terms of long-term degradation. Moreover, electrons which have been injected from the electron-transport layer 114 into the light-emitting layer 113 are injected into the hole-transport layer 112 as denoted by the arrow (c) with an increased probability. Usually, trapping of electrons in the hole-transport layer 112 leads to degradation of the light-emitting device and causes a problem of a reduction in the reliability of the light-emitting device (the gradient of long-term degradation ((e) in FIG. 2A) becomes steep).

It is thus found that the decay curve of the light-emitting device described with FIG. 2B shows low reliability in terms of long-term degradation as compared to that of the light-emitting device shown in FIG. 1A.

As described above, the light-emitting device of one embodiment of the present invention having an electron-injection barrier at the interface where the light-emitting layer 113 and the electron-transport layer 114 of the EL layer 103 are in contact with each other has a structure in which electrons injected from the electron-transport layer 114 into the light-emitting layer are not easily injected into the hole-transport layer 112; thus, degradation of the light-emitting device due to trapping of electrons in the hole-transport layer 112 can be inhibited and a highly reliable light-emitting device can be provided.

Embodiment 2

In this embodiment, a light-emitting device of one embodiment of the present invention is described.

Structure Example of Light-Emitting Device

Figure 3A:
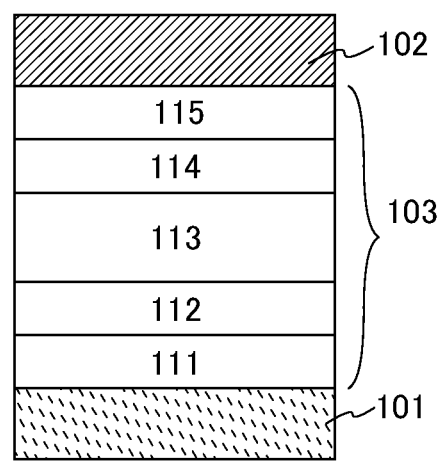
FIG. 3A and FIG. 3B are diagrams illustrating structures of light-emitting devices.

FIG. 3A shows an example of a light-emitting device that includes, between a pair of electrodes, an EL layer including a light-emitting layer. Specifically, the light-emitting device has a structure in which the EL layer 103 is sandwiched between the first electrode 101 and the second electrode 102. For example, in the case where the first electrode 101 serves as an anode, the EL layer 103 has a structure in which the hole-injection layer 111, the hole-transport layer 112, the light-emitting layer 113, the electron-transport layer 114, and the electron-injection layer 115 are sequentially stacked as functional layers.

Embodiments of the present invention also include light-emitting devices having other structures, for example, a light-emitting device that can be driven at a low voltage by having a structure in which a plurality of EL layers, between which a charge-generation layer is sandwiched, are provided between a pair of electrodes (a tandem structure), and a light-emitting device that has improved optical characteristics by having a micro-optical resonator (microcavity) structure between a pair of electrodes. Note that the charge-generation layer has a function of injecting electrons into one of the adjacent EL layers and injecting holes into the other of the EL layers when a voltage is applied to the first electrode 101 and the second electrode 102.

Note that at least one of the first electrode 101 and the second electrode 102 of the above light-emitting device is an electrode having a light-transmitting property (e.g., a transparent electrode or a transflective electrode). In the case where the electrode having a light-transmitting property is a transparent electrode, the visible light transmittance of the transparent electrode is 40% or higher. In the case where the electrode having a light-transmitting property is a transflective electrode, the visible light reflectance of the transflective electrode is higher than or equal to 20% and lower than or equal to 80%, preferably higher than or equal to 40% and lower than or equal to 70%. The resistivity of these electrodes is preferably $1\times10^{-2}$ Ωcm or lower.

In the case where one of the first electrode 101 and the second electrode 102 is an electrode having reflectivity (a reflective electrode) in the above light-emitting device of one embodiment of the present invention, the visible light reflectance of the electrode having reflectivity is higher than or equal to 40% and lower than or equal to 100%, preferably higher than or equal to 70% and lower than or equal to 100%. The resistivity of this electrode is preferably $1\times10^{-2}$ Ωcm or lower.

<First Electrode and Second Electrode>

As materials for forming the first electrode 101 and the second electrode 102, any of the following materials can be used in an appropriate combination as long as the functions of the electrodes described above can be fulfilled. For example, a metal, an alloy, an electrically conductive compound, and a mixture of these can be used as appropriate. Specific examples include In—Sn oxide (also referred to as ITO), In—Si—Sn oxide (also referred to as ITSO), In—Zn oxide, and In—W—Zn oxide. It is also possible to use a metal such as aluminum (Al), titanium (Ti), chromium (Cr), manganese (Mn), iron (Fe), cobalt (Co), nickel (Ni), copper (Cu), gallium (Ga), zinc (Zn), indium (In), tin (Sn), molybdenum (Mo), tantalum (Ta), tungsten (W), palladium (Pd), gold (Au), platinum (Pt), silver (Ag), yttrium (Y), or neodymium (Nd) or an alloy containing an appropriate combination of any of these metals. It is also possible to use an element belonging to Group 1 or Group 2 in the periodic table, which is not listed above as an example (e.g., lithium (Li), cesium (Cs), calcium (Ca), or strontium (Sr)), a rare earth metal such as europium (Eu) or ytterbium (Yb), an alloy containing an appropriate combination of any of these elements, graphene, or the like.

Note that for fabrication of these electrodes, a sputtering method or a vacuum evaporation method can be used.

<Hole-Injection Layer>

The hole-injection layer 111 has a function of facilitating injection of holes into the EL layer 103. For example, the hole-injection layer 111 can have a function of injecting, into the hole-transport layer 112 (or the light-emitting layer 113, for example), the holes that have been injected from the anode. For example, the hole-injection layer 111 can have a function of generating holes and injecting the holes into the hole-transport layer 112 (or the light-emitting layer 113, for example). The hole-injection layer 111 contains an organic acceptor material (an electron-accepting material: the first substance) and a hole-transport material (the second substance) with a relatively deep HOMO level. The organic acceptor material is a substance that exhibits an electron-accepting property with respect to the hole-transport material with a deep HOMO level. The hole-transport material with a deep HOMO level is a substance that has a relatively deep HOMO level which is higher than or equal to −5.7 eV and lower than or equal to −5.4 eV. The hole-transport material with a relatively deep HOMO level allows easy hole injection into the hole-transport layer 112.

As the organic acceptor material, organic compounds having an electron-withdrawing group (in particular, a cyano group or a halogen group such as a fluoro group) can be used, for example. A substance that exhibits an electron-accepting property with respect to the second substance is selected from such substances as appropriate. Examples of such organic compounds include a quinodimethane derivative, a chloranil derivative, and a hexaazatriphenylene derivative. Specific examples include 7,7,8,8-tetracyano-2,3,5,6-tetrafluoroquinodimethane (abbreviation: $F_4$-TCNQ), chloranil, 2,3,6,7,10,11-hexacyano-1,4,5,8,9,12-hexaazatriphenylene (abbreviation: HAT-CN), 1,3,4,5,7,8-hexafluorotetracyano-naphthoquinodimethane (abbreviation: F6-TCNNQ), and 2-(7-dicyanomethylen-1,3,4,5,6,8,9,10-octafluoro-7H-pyren-2-ylidene)malononitrile. A compound in which electron-withdrawing groups are bonded to a condensed aromatic ring having a plurality of heteroatoms, such as HAT-CN, is particularly preferable because it is thermally stable. A [3]radialene derivative having an electron-withdrawing group (in particular, a cyano group or a halogen group such as a fluoro group) has a very high electron-accepting property and thus is preferable. Specific examples include α,α',α"-1,2,3-cyclopropanetriylidenetris [4-cyano-2,3,5,6-tetrafluorobenzeneacetonitrile], α,α',α"-1,2,3-cyclopropanetriylidenetris[2,6-dichloro-3,5-difluoro-4-(trifluoromethyl)benzeneacetonitrile], and α,α',α"-1,2,3-cyclopropanetriylidenetris[2,3,4,5,6-pentafluorobenzeneacetonitrile].

The above hole-transport material with a deep HOMO level preferably has a hole-transport skeleton. Examples of the hole-transport skeleton include a carbazole skeleton, a dibenzofuran skeleton, a dibenzothiophene skeleton, and a fluorene skeleton, with which the HOMO level of the hole-transport material does not become too high (shallow), and the hole-transport material preferably has any of these. In particular, an aromatic amine having a substituent that includes a dibenzofuran ring or a dibenzothiophene ring, an aromatic monoamine that has a naphthalene ring, or an aromatic monoamine in which a 9-fluorenyl group is bonded to nitrogen of the amine through an arylene group may be used.

The above hole-transport material with a deep HOMO level is preferably a substance having a hole mobility such that an electron mobility when the square root of the electric field strength [V/cm] is 600 is higher than or equal to $1\times10^{-6}$ cm$^2$/Vs. Note that other substances can also be used as long as they have a hole-transport property higher than an electron-transport property. Note that the material is preferably a substance having an N,N'-bis(4-biphenyl)amino group, in which case a light-emitting device with a long lifetime can be fabricated.

Specific examples of the above hole-transport material with a deep HOMO level include N-(4-biphenyl)-6,N-diphenylbenzo[b]naphtho[1,2-d]furan-8-amine (abbreviation: BnfABP), N,N'-bis(4-biphenyl)-6-phenylbenzo[b]naphtho[1,2-d]furan-8-amine (abbreviation: BBABnf), 4,4'-bis(6-phenylbenzo[b]naphtho[1,2-d]furan-8-yl-4"-phenyltriphenylamine (abbreviation: BnfBB1BP), N,N'-bis(4-biphenyl) benzo[b]naphtho[1,2-d]furan-6-amine (abbreviation: BBABnf(6)), N,N'-bis(4-biphenyl)benzo[b]naphtho[1,2-d] furan-8-amine (abbreviation: BBABnf(8)), N,N'-bis(4-biphenyl)benzo[b]naphtho[2,3-d]furan-4-amine (abbreviation: BBABnf(II)(4)), N,N'-bis[4-(dibenzofuran-4-yl) phenyl]-4-amino-p-terphenyl (abbreviation: DBfBB1TP), N-[4-(dibenzothiophen-4-yl)phenyl]-N-phenyl-4-biphenylamine (abbreviation: ThBA1BP), 4-(2-naphthyl)-4',4"-diphenyltriphenylamine (abbreviation: BBAβNB), 4-[4-(2-naphthyl)phenyl]-4',4"-diphenyltriphenylamine (abbreviation: BBAβNBi), 4,4'-diphenyl-4"-(6;1'-binaphthyl-2-yl)triphenylamine (abbreviation: BBAαNβNB), 4,4'-diphenyl-4"-(7;1'-binaphthyl-2-yl)triphenylamine (abbreviation: BBAαNβNB-03), 4,4'-diphenyl-4"-(7-phenyl) naphthyl-2-yltriphenylamine (abbreviation: BBAPβNB-03), 4,4'-diphenyl-4"-(6;2'-binaphthyl-2-yl)triphenylamine (abbreviation: BBA(βN2)B), 4,4'-diphenyl-4"-(7;2'-binaphthyl-2-yl)triphenylamine (abbreviation: BBA(βN2)B-03), 4,4'-diphenyl-4"-(4;2'-binaphthyl-1-yl)triphenylamine (abbreviation: BBAβNαNB), 4,4'-diphenyl-4"-(5;2'-binaphthyl-1-yl)triphenylamine (abbreviation: BBAβNαNB-02), 4-(4-biphenylyl)-4'-(2-naphthyl)-4"-phenyltriphenylamine (abbreviation: TPBiAβNB), 4-(3-biphenylyl)-4'-[4-(2-naphthyl)phenyl]-4"-phenyltriphenylamine (abbreviation: mTPBiAβNBi), 4-(4-biphenylyl)-4'-[4-(2-naphthyl)phenyl]-4"-phenyltriphenylamine (abbreviation: TPBiAβNBi), 4-phenyl-4'-(1-naphthyl)triphenylamine (abbreviation: αNBA1BP), 4,4'-bis(1-naphthyl)triphenylamine (abbreviation: αNBB1BP), 4,4'-diphenyl-4"-[4'-(carbazol-9-yl)biphenyl-4-yl]triphenylamine (abbreviation: YGTBi1BP), 4'-[4-(3-phenyl-9H-carbazol-9-yl)phenyl]tris(1,1'-biphenyl-4-yl) amine (abbreviation: YGTBi1BP-02), 4-diphenyl-4'-(2-naphthyl)-4"-{9-(4-biphenylyl)carbazole)}triphenylamine (abbreviation: YGTBij3NB), N-[4-(9-phenyl-9H-carbazol-3-yl)phenyl]-N-[4-(1-naphthyl)phenyl]-9,9'-spirobi(9H-fluoren)-2-amine (abbreviation: PCBNBSF), N,N'-bis(4-biphenylyl)-9,9'-spirobi[9H-fluoren]-2-amine (abbreviation: BBASF), N,N'-bis(1,1'-biphenyl-4-yl)-9,9'-spirobi[9H-fluoren]-4-amine (abbreviation: BBASF(4)), N-(1,1'-biphenyl-2-yl)-N-(9,9-dimethyl-9H-fluoren-2-yl)-9,9'-spirobi(9H-fluoren)-4-amine (abbreviation: oFBiSF), N-(4-biphenyl)-N-(dibenzofuran-4-yl)-9,9-dimethyl-9H-fluoren-2-amine (abbreviation: FrBiF), N-[4-(1-naphthyl)phenyl]-N-[3-(6-phenyldibenzofuran-4-yl)phenyl]-1-naphthylamine (abbreviation: mPDBfBNBN), 4-phenyl-4'-(9-phenylfluoren-9-yl) triphenylamine (abbreviation: BPAFLP), 4-phenyl-3'-(9-phenylfluoren-9-yl)triphenylamine (abbreviation: mBPAFLP), 4-phenyl-4'-[4-(9-phenylfluoren-9-yl)phenyl] triphenylamine (abbreviation: BPAFLBi), 4-phenyl-4'-(9-phenyl-9H-carbazol-3-yl)triphenylamine (abbreviation: PCBA1BP), 4,4'-diphenyl-4"-(9-phenyl-9H-carbazol-3-yl) triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), N-phenyl-N-[4-(9-phenyl-9H-carbazol-3-yl)phenyl]spiro-9,9'-bifluoren-2-amine (abbreviation: PCBASF), N-(1,1'-biphenyl-4-yl)-9,9-dimethyl-N-[4-(9-phenyl-9H-carbazol-3-yl)phenyl]-9H-fluoren-2-amine (abbreviation: PCBBiF), 3,3'-(naphthalene-1,4-diyl)bis(9-phenyl-9H-carbazole (abbreviation: PCzN2), and 4-(10-phenyl-9-anthryl)-4'-(9-phenyl-9H-fluoren-9-yl)triphenylamine (abbreviation: FLPAPA).

Note that the hole-injection layer 111 can be formed by any of various known deposition methods, and can be formed by a vacuum evaporation method, for example.

<Hole-Transport Layer>

The hole-transport layer 112 is a layer transporting holes, which have been injected from the first electrode 101 by the hole-injection layer 111, to the light-emitting layer 113.

A hole-transport material is used for the hole-transport layer 112. Note that any of the hole-transport materials described above can also be used. Note that the relationship between the HOMO level of the hole-transport material used for the hole-injection layer 111 and that of the hole-transport material used for the hole-transport layer 112 is preferably as follows: the HOMO level of the hole-transport material used for the hole-transport layer 112 is lower than or equal to (deeper than or equal to) the HOMO level of the hole-transport material used for the hole-injection layer 111 and the difference therebetween is less than or equal to 0.2 eV. It is further preferable that these hole-transport materials be the same material, in which case holes can be injected smoothly.

Note that the second hole-transport layer may be provided between the hole-transport layer 112 and the light-emitting layer 113. Note that when the second hole-transport layer is provided, the layer may have a function of an electron-blocking layer.

In the case where the second hole-transport layer is provided between the hole-transport layer 112 and the light-emitting layer 113 and the HOMO level of the hole-transport material used for the hole-transport layer 112 and the HOMO level of the hole-transport material used for the second hole-transport layer are compared, the latter HOMO level is preferably deeper than the former HOMO level. Furthermore, the materials are preferably selected so that the difference between the HOMO levels is less than or equal to 0.2 eV. Owing to the above-described relationship between the HOMO levels of the hole-transport materials used for the hole-injection layer 111 and the hole-transport layer having a stacked-layer structure, holes are injected into each layer smoothly, which prevents an increase in driving voltage and deficiency of holes in the light-emitting layer 113.

Preferably, the hole-transport materials used for the hole-injection layer 111 and the hole-transport layer 112 having a stacked-layer structure each have a hole-transport skeleton. The hole-transport skeleton is preferably any of a carbazole skeleton, a dibenzofuran skeleton, a dibenzothiophene skeleton, and a fluorene skeleton, with which the HOMO levels of these hole-transport materials do not become too shallow. The hole-transport materials used for the adjacent layers in the hole-injection layer 111 and the hole-transport layer 112 having a stacked-layer structure preferably have the same hole-transport skeleton, in which case holes can be injected smoothly. In particular, the hole-transport skeleton for these layers is preferably a dibenzofuran skeleton. It is preferable that a triarylamine structure be included.

The hole-transport materials used for the adjacent layers in the hole-injection layer 111 and the hole-transport layer 112 having a stacked-layer structure are preferably the same, in which case holes can be injected more smoothly into the adjacent layer in the cathode direction.

In the case where the second hole-transport layer is included between the hole-transport layer 112 and the light-emitting layer 113, the second hole-transport layer preferably has a function of an electron-blocking layer. Note that in this case, for the second hole-transport layer functioning as an electron-blocking layer, any of the hole-transport materials described above as being able to be used for the hole-injection layer 111 can be used. Specifically, at least one of a carbazole skeleton, a dibenzofuran skeleton, a dibenzothiophene skeleton, and a fluorene skeleton is preferably included. The HOMO level of the compound used for the second hole-transport layer is preferably lower than or equal to the HOMO level of the hole-transport material used for the hole-transport layer on which the second hole-transport layer is stacked and the difference therebetween is preferably less than or equal to 0.2 eV. It is further preferable that the compound used for the second hole-transport layer be a compound that does not have a triarylamine structure. This is for the sake of making the HOMO level closer to the HOMO level of the host material of the light-emitting layer 113 (achieving a deep HOMO level). As specific examples, a compound having a carbazole skeleton and a compound having a naphthalene ring such as 3,3'-(naphthalene-1,4-diyl)bis(9-phenyl-9H-carbazole (abbreviation: PCzN2), 3,3'-(naphthalene-1,5-diyl)bis(9-phenyl-9H-carbazole (abbreviation: 1,5PC2N), 8,8'-(naphthalene-1,4-diyl)bis(11-phenyl-11H-benzo[a]carbazole) (abbreviation: PaBC2N), 12,12'-(naphthalene-1,4-diyl)bis(9-phenyl-9H-dibenzo[a,c]carbazole) (abbreviation: PacDBC2N), 10,10'-(naphthalene-1,4-diyl)bis(7-phenylbenzo[c]carbazole) (abbreviation: PcBC2N), 11-phenyl-8-[4-(9-phenylcarbazol-3-yl)-1-naphthyl]benzo[a]carbazole (abbreviation: PCNPaBC), 7-phenyl-10-[4-(9-phenylcarbazol-3-yl)-1-naphthyl]benzo[c]carbazole (abbreviation: PCNPcBC), 7-phenyl-10-[5-(9-phenylcarbazol-3-yl)-1-naphthyl]benzo[c]carbazole (abbreviation: 1,5PCNPcBC), and 2,2'-(naphthalene-1,4-diyl)bis(5-phenyl-5H-benzo[b]carbazole) (abbreviation: PbBC2N) can be given.

<Light-Emitting Layer>

The light-emitting layer 113 in the light-emitting device of one embodiment of the present invention includes the light-emitting substance (guest material) and the host material in which the light-emitting substance is dispersed.

Note that as the light-emitting substance (the guest material), a substance exhibiting fluorescence (a fluorescent substance), a substance exhibiting phosphorescence (a phosphorescent substance), a thermally activated delayed fluorescent (TADF) material exhibiting thermally activated delayed fluorescence, other light-emitting substances, or the like can be used. As the host material, various carrier-transport materials such as the TADF material as well as an electron-transport material and a hole-transport material can be used. Moreover, as the host material, a hole-transport material, an electron-transport material, or the like can be used. As a specific example of a hole-transport material, an electron-transport material, and the like, one or more kinds of the materials described in this specification and known materials can be used as appropriate.

Examples of the fluorescent substance that can be used as the guest material in the light-emitting layer 113 are as follows. Fluorescent substances other than those given below can also be used.

Examples include 5,6-bis[4-(10-phenyl-9-anthryl)phenyl]-2,2'-bipyridine (abbreviation: PAP2BPy), 5,6-bis[4'-(10-phenyl-9-anthryl)biphenyl-4-yl]-2,2'-bipyridine (abbreviation: PAPP2BPy), N,N'-diphenyl-N,N'-bis[4-(9-phenyl-9H-fluoren-9-yl)phenyl]pyrene-1,6-diamine (abbreviation: 1,6FLPAPrn), N,N'-bis(3-methylphenyl)-N,N'-bis[3-(9-phenyl-9H-fluoren-9-yl)phenyl]pyrene-1,6-diamine (abbreviation: 1,6mMemFLPAPm), N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), perylene, 2,5,8,11-tetra-tert-butylperylene (abbreviation: TBP), 4-(10-phenyl-9-anthryl)-4'-(9-phenyl-9H-carbazol-3-yl)triphenylamine (abbreviation: PCBAPA), N,N''-(2-tert-butylanthracene-9,10-diyldi-4,1-phenylene)bis[N,N',N'-triphenyl-1,4-phenylenediamine](abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N',N'-triphenyl-1,4-phenylenediamine (abbreviation: 2DPAPPA), N,N,N',N',N'',N'',N''',N'''-octaphenyldibenzo[g,p]chrysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), coumarin 545T, N,N'-diphenylquinacridone, (abbreviation: DPQd), rubrene, 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), N,N,N',N'-tetrakis(4-methylphenyl)tetracene-5,11-diamine (abbreviation: p-mPhTD), 7,14-diphenyl-N,N,N',N'-tetrakis(4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H,5H-benzo[iy]quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJTM), N,N'-diphenyl-N,N'-(1,6-pyrene-diyl)bis[(6-phenylbenzo[b]naphtho[1,2-d]furan)-8-amine](abbreviation: 1,6BnfAPm-03), 3,10-bis[N-(9-phenyl-9H-carbazol-2-yl)-N-phenylamino]naphtho[2,3-b;6,7-b']bisbenzofuran (abbreviation: 3,10PCA2Nbf(IV)-02), and 3,10-bis[N-(dibenzofuran-3-yl)-N-phenylamino]naphtho[2,3-b;6,7-b']bisbenzofuran (abbreviation: 3,10FrA2Nbf(IV)-02). Condensed aromatic diamine compounds typified by pyrenediamine compounds such as 1,6FLPAPrn, 1,6mMemFLPAPrn, and 1,6BnfAPrn-03 are particularly preferable because of their high hole-trapping properties, high emission efficiency, and high reliability.

Examples of the phosphorescent substance that can be used as the guest material in the light-emitting layer 113 are as follows.

Examples include organometallic iridium complexes having a 4H-triazole skeleton, such as tris{2-[5-(2-methylphenyl)-4-(2,6-dimethylphenyl)-4H-1,2,4-triazol-3-yl-κN2]phenyl-κC}iridium(III) (abbreviation: [Ir(mpptz-dmp)$_3$]), tris(5-methyl-3,4-diphenyl-4H-1,2,4-triazolato)iridium(III) (abbreviation: [Ir(Mptz)$_3$]), and tris[4-(3-biphenyl)-5-isopropyl-3-phenyl-4H-1,2,4-triazolato]iridium(III) (abbreviation: [Ir(iPrptz-3b)$_3$]); organometallic iridium complexes having a 1H-triazole skeleton, such as tris[3-methyl-1-(2-methylphenyl)-5-phenyl-1H-1,2,4-triazolato]iridium(III) (abbreviation: [Ir(Mptz1-mp)$_3$]) and tris(1-methyl-5-phenyl-3-propyl-1H-1,2,4-triazolato)iridium(III) (abbreviation: [Ir(Prptz1-Me)$_3$]); organometallic iridium complexes having an imidazole skeleton, such as fac-tris[(1-2,6-diisopropylphenyl)-2-phenyl-TH-imidazole]iridium(III) (abbreviation: [Ir(iPrpmi)$_3$]) and tris[3-(2,6-dimethylphenyl)-7-methylimidazo[1,2-f]phenanthridinato]iridium(III) (abbreviation: [Ir(dmpimpt-Me)$_3$]); and organometallic iridium complexes in which a phenylpyridine derivative having an electron-withdrawing group is a ligand, such as bis[2-(4',6'-difluorophenyl)pyridinato-N,C$^{2'}$]iridium(III) tetrakis(1-pyrazolyl)borate (abbreviation: FIr6), bis[2-(4',6'-difluorophenyl)pyridinato-N,C$^{2'}$]iridium(III) picolinate (abbreviation: FIrpic), bis{2-[3',5'-bis(trifluoromethyl)phenyl]pyridinato-N,C$^{2'}$}iridium(III) picolinate (abbreviation: [Ir(CF$_3$ppy)$_2$(pic)]), and bis[2-(4',6'-difluorophenyl)pyridinato-N,C$^{2'}$]iridium(III) acetylacetonate (abbreviation: FIracac). These compounds exhibit blue phosphorescence and have an emission peak at 440 nm to 520 nm.

Other examples include organometallic iridium complexes having a pyrimidine skeleton, such as tris(4-methyl-6-phenylpyrimidinato)iridium(III) (abbreviation: [Ir(mppm)$_3$]), tris(4-t-butyl-6-phenylpyrimidinato)iridium(III) (abbreviation: [Ir(tBuppm)$_3$]), (acetylacetonato)bis(6-methyl-4-phenylpyrimidinato)iridium(III) (abbreviation: [Ir(mppm)$_2$(acac)]), (acetylacetonato)bis(6-tert-butyl-4-phenylpyrimidinato)iridium(III) (abbreviation: [Ir(tBuppm)$_2$(acac)]), (acetylacetonato)bis[6-(2-norbomyl)-4-phenylpyrimidinato]iridium(III) (abbreviation: [Ir(nbppm)$_2$(acac)]), (acetylacetonato)bis[5-methyl-6-(2-methylphenyl)-4-phenylpyrimidinato]iridium(III) (abbreviation: [Ir(mpmppm)$_2$(acac)]), and (acetylacetonato)bis(4,6-diphenylpyrimidinato)iridium(III) (abbreviation: [Ir(dppm)$_2$(acac)]); organometallic iridium complexes having a pyrazine skeleton, such as (acetylacetonato)bis(3,5-dimethyl-2-phenylpyrazinato)iridium(III) (abbreviation: [Ir(mppr-Me)$_2$(acac)]) and (acetylacetonato)bis(5-isopropyl-3-methyl-2-phenylpyrazinato)iridium(III) (abbreviation: [Ir(mppr-iPr)$_2$(acac)]); organometallic iridium complexes having a pyridine skeleton, such as tris(2-phenylpyridinato-N,C$^{2'}$)iridium(III) (abbreviation: [Ir(ppy)$_3$]), bis(2-phenylpyridinato-N,C$^2$)iridium(III) acetylacetonate (abbreviation: [Ir(ppy)$_2$(acac)]), bis(benzo[h]quinolinato)iridium(III) acetylacetonate (abbreviation: [Ir(bzq)$_2$(acac)]), tris(benzo[h]quinolinato)iridium(III) (abbreviation: [Ir(bzq)$_3$]), tris(2-phenylquinolinato-N,C$^{2'}$)iridium(III) (abbreviation: [Ir(pq)$_3$]), and bis(2-phenylquinolinato-N,C$^{2'}$)iridium(III) acetylacetonate (abbreviation: [Ir(pq)$_2$(acac)]); and rare earth metal complexes such as tris(acetylacetonato)(monophenanthroline)terbium(III) (abbreviation: [Tb(acac)$_3$(Phen)]). These are mainly compounds that exhibit green phosphorescence and have an emission peak at 500 nm to 600 nm. Note that organometallic iridium complexes having a pyrimidine skeleton have distinctively high reliability and emission efficiency and thus are particularly preferable.

Other examples include organometallic iridium complexes having a pyrimidine skeleton, such as (diisobutyrylmethanato)bis[4,6-bis(3-methylphenyl)pyrimidinato]iridium(III) (abbreviation: [Ir(5mdppm)$_2$(dibm)]), bis[4,6-bis(3-methylphenyl)pyrimidinato](dipivaloylmethanato)iridium(III) (abbreviation: [Ir(5mdppm)$_2$(dpm)]), and bis[4,6-di(naphthalen-1-yl)pyrimidinato](dipivaloylmethanato)iridium(III) (abbreviation: [Ir(d1npm)$_2$(dpm)]); organometallic iridium complexes having a pyrazine skeleton, such as (acetylacetonato)bis(2,3,5-triphenylpyrazinato)iridium(III) (abbreviation: [Ir(tppr)$_2$(acac)]), bis(2,3,5-triphenylpyrazinato)(dipivaloylmethanato)iridium(III) (abbreviation: [Ir(tppr)$_2$(dpm)]), and (acetylacetonato)bis[2,3-bis(4-fluorophenyl)quinoxalinato]iridium(III) (abbreviation: [Ir(Fdpq)$_2$(acac)]); organometallic iridium complexes having a pyridine skeleton, such as tris(1-phenylisoquinolinato-N,C$^2$)iridium(III) (abbreviation: [Ir(piq)$_3$]) and bis(1-phenylisoquinolinato-N,C$^2$)iridium(III) acetylacetonate (abbreviation: [Ir(piq)$_2$(acac)]); platinum complexes such as 2,3,7,8,12,13,17,18-octaethyl-21H,23H-porphyrinplatinum(II) (abbreviation: PtOEP); and rare earth metal complexes such as tris(1,3-diphenyl-1,3-propanedionato)(monophenanthroline)europium(III) (abbreviation: [Eu(DBM)$_3$(Phen)]) and tris[1-(2-thenoyl)-3,3,3-trifluoroacetonato](monophenanthroline)europium(III) (abbreviation: [Eu(TTA)$_3$(Phen)]). These compounds exhibit red phosphorescence and have an emission peak at 600 nm to 700 nm. Furthermore, organometallic iridium complexes having a pyrazine skeleton can provide red light emission with favorable chromaticity.

Besides the above-described materials, known phosphorescent substances can also be used.

Examples of the TADF material that can be used as the guest material in the light-emitting layer 113 are as follows.

A fullerene, a derivative thereof, an acridine, a derivative thereof, an eosin derivative, or the like can be used. Furthermore, a metal-containing porphyrin, such as a porphyrin containing magnesium (Mg), zinc (Zn), cadmium (Cd), tin (Sn), platinum (Pt), indium (In), or palladium (Pd), can be given. Examples of the metal-containing porphyrin include a protoporphyrin-tin fluoride complex (SnF$_2$(Proto IX)), a mesoporphyrin-tin fluoride complex (SnF$_2$(Meso IX)), a hematoporphyrin-tin fluoride complex (SnF$_2$(Hemato IX)), a coproporphyrin tetramethyl ester-tin fluoride complex (SnF$_2$(Copro III-4Me)), an octaethylporphyrin-tin fluoride complex (SnF$_2$(OEP)), an etioporphyrin-tin fluoride complex (SnF$_2$(Etio I)), and an octaethylporphyrin-platinum chloride complex (PtCl$_2$OEP), which are represented by the following structural formulae.

[Chemical Formula 5]
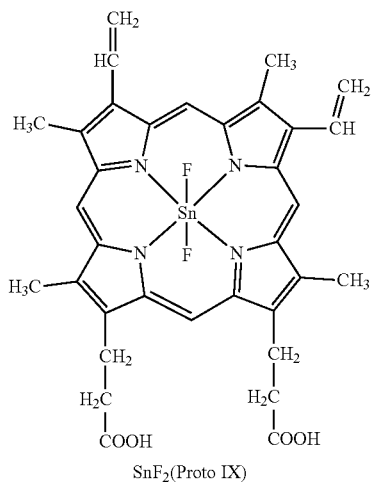
SnF$_2$(Proto IX)
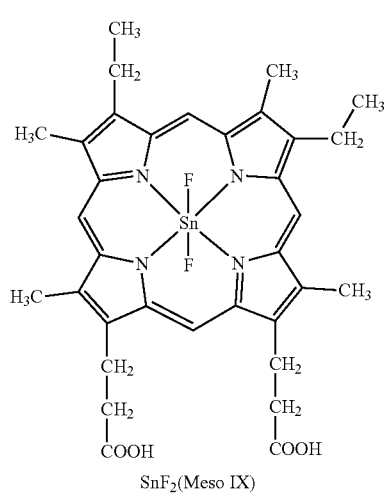
SnF$_2$(Meso IX)
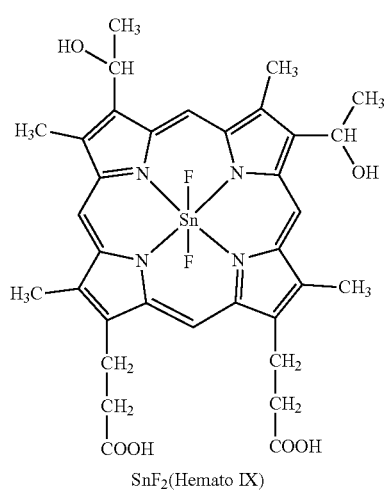
SnF$_2$(Hemato IX)
-continued
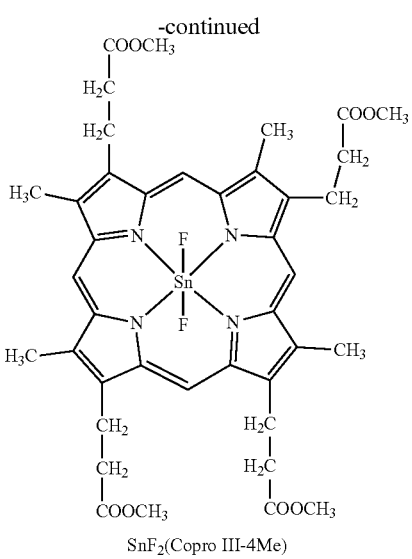
SnF$_2$(Copro III-4Me)
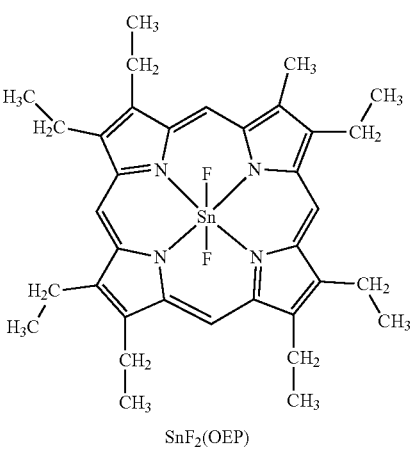
SnF$_2$(OEP)
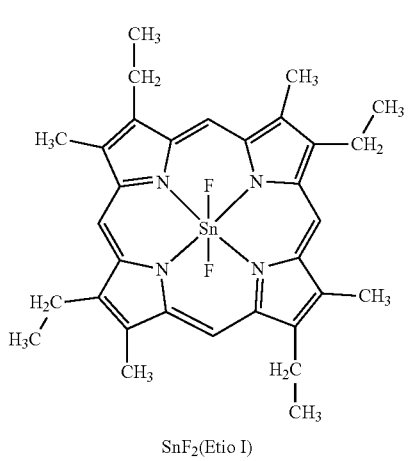
SnF$_2$(Etio I)

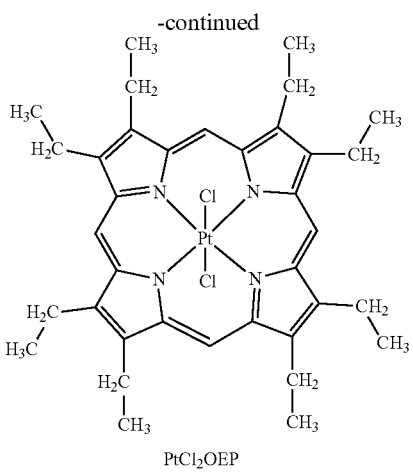

PtCl₂OEP

In addition, heterocyclic compounds having a π-electron rich heteroaromatic ring and a π-electron deficient heteroaromatic ring, such as 2-(biphenyl-4-yl)-4,6-bis(12-phenylindolo[2,3-a]carbazol-11-yl)-1,3,5-triazine (abbreviation: PIC-TRZ), 2-{4-[3-(N-phenyl-9H-carbazol-3-yl)-9H-carbazol-9-yl]phenyl}-4,6-diphenyl-1,3,5-triazine (abbreviation: PCCzPTzn), 2-[4-(10H-phenoxazin-10-yl)phenyl]-4,6-diphenyl-1,3,5-triazine (abbreviation: PXZ-TRZ), 3-[4-(5-phenyl-5,10-dihydrophenazin-10-yl)phenyl]-4,5-diphenyl-1,2,4-triazole (abbreviation: PPZ-3TPT), 3-(9,9-dimethyl-9H-acridin-10-yl)-9H-xanthen-9-one (abbreviation: ACRXTN), bis[4-(9,9-dimethyl-9,10-dihydroacridine)phenyl]sulfone (abbreviation: DMAC-DPS), 10-phenyl-10H,10'H-spiro[acridin-9,9'-anthracen]-10'-one (abbreviation: ACRSA), 4-(9'-phenyl-3,3'-bi-9H-carbazol-9-yl)benzofuro[3,2-d]pyrimidine (abbreviation: 4PCCzBfpm), 4-[4-(9'-phenyl-3,3'-bi-9H-carbazol-9-yl)phenyl]benzofuro[3,2-d]pyrimidine (abbreviation: 4PCCzPBfpm), and 9-[3-(4,6-diphenyl-1,3,5-triazin-2-yl)phenyl]-9'-phenyl-2,3'-bi-9H-carbazole (abbreviation: mPCCzPTzn-02), which are represented by the following structural formulae, may be used.

[Chemical Formula 6]

PIC-TRZ

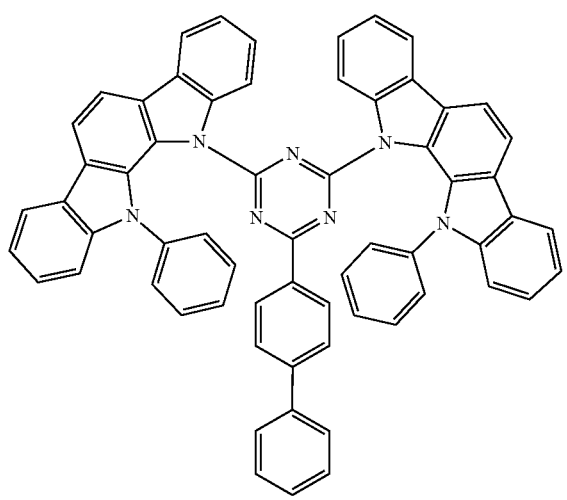

PXZ-TRZ

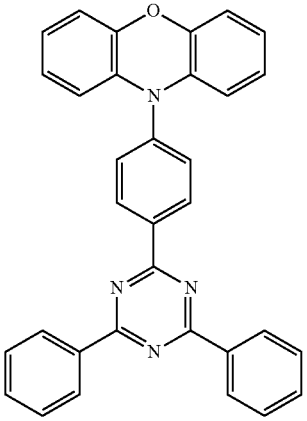

PPZ-3TPT

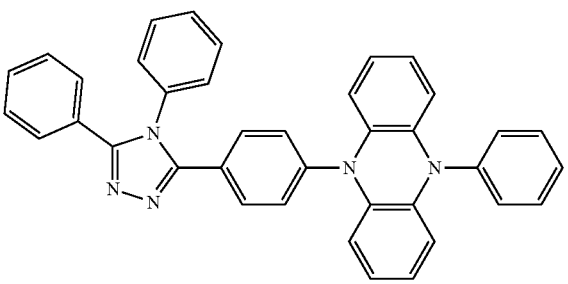

PCCzPTzn

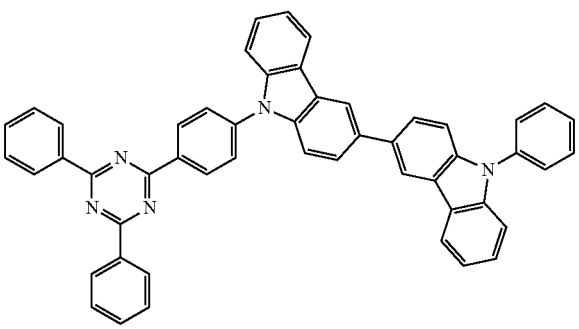

ACRSA

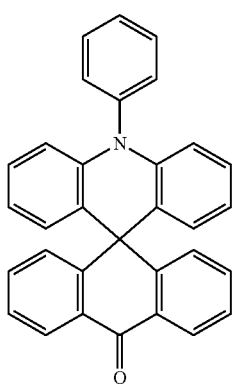

ACRZTN

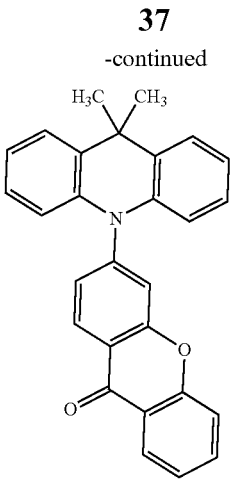

DMAC-DPS

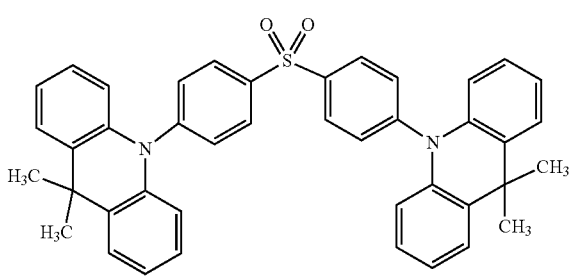

4PCCzPBfpm

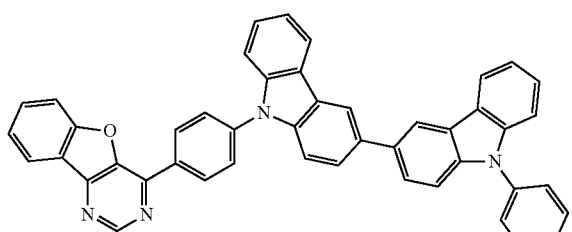

mPCCzPTzn-02

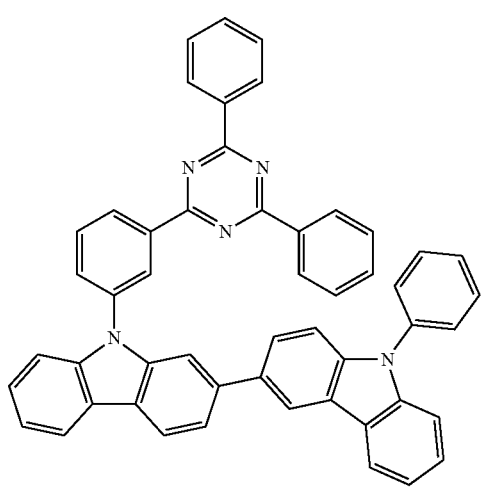

4PCCzBfpm

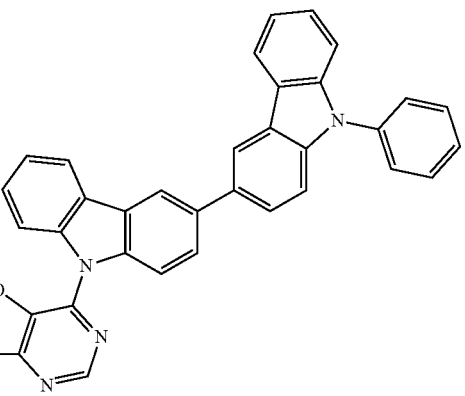

These heterocyclic compounds are preferable because of having both a high electron-transport property and a high hole-transport property owing to the π-electron rich heteroaromatic ring and the π-electron deficient heteroaromatic ring. Among skeletons having a π-electron deficient heteroaromatic ring, a pyridine skeleton, a diazine skeleton (a pyrimidine skeleton, a pyrazine skeleton, and a pyridazine skeleton), and a triazine skeleton are particularly preferable because of their high stability and reliability. In particular, a benzofuropyrimidine skeleton, a benzothienopyrimidine skeleton, a benzofuropyrazine skeleton, and a benzothienopyrazine skeleton are preferable because of their high acceptor properties and reliability.

Among skeletons having a π-electron rich heteroaromatic ring, an acridine skeleton, a phenoxazine skeleton, a phenothiazine skeleton, a furan skeleton, a thiophene skeleton, and a pyrrole skeleton have high stability and reliability; therefore, at least one of these skeletons is preferably included. Note that a dibenzofuran skeleton and a dibenzothiophene skeleton are preferable as the furan skeleton and the thiophene skeleton, respectively. As the pyrrole skeleton, an indole skeleton, a carbazole skeleton, an indolocarbazole skeleton, a bicarbazole skeleton, and a 3-(9-phenyl-9H-carbazol-3-yl)-9H-carbazole skeleton are particularly preferable.

Note that a substance in which a π-electron rich heteroaromatic ring and a π-electron deficient heteroaromatic ring are directly bonded to each other is particularly preferable because the electron-donating property of the π-electron rich heteroaromatic ring and the electron-accepting property of the π-electron deficient heteroaromatic ring are both increased and the energy difference between the $S_1$ level and the $T_1$ level becomes small, and thus thermally activated delayed fluorescence can be obtained efficiently. Note that an aromatic ring to which an electron-withdrawing group such as a cyano group is bonded may be used instead of the π-electron deficient heteroaromatic ring. As a π-electron rich skeleton, an aromatic amine skeleton, a phenazine skeleton, or the like can be used. As a π-electron deficient skeleton, a xanthene skeleton, a thioxanthene dioxide skeleton, an oxadiazole skeleton, a triazole skeleton, an imidazole skeleton, an anthraquinone skeleton, a boron-containing skeleton such as phenylborane or boranthrene, an aromatic ring or a heteroaromatic ring having a nitrile group or a cyano group, such as benzonitrile or cyanobenzene, a carbonyl skeleton such as benzophenone, a phosphine oxide skeleton, a sulfone skeleton, or the like can be used.

As described above, a π-electron deficient skeleton and a π-electron rich skeleton can be used instead of at least one of the π-electron deficient heteroaromatic ring and the π-electron rich heteroaromatic ring.

Note that the TADF material is a material that has a small difference between the S1 level and the T1 level and has a function of converting triplet excitation energy into singlet excitation energy by reverse intersystem crossing. Thus, it is possible to upconvert triplet excitation energy into singlet excitation energy (reverse intersystem crossing) using a little thermal energy and to efficiently generate a singlet excited state. In addition, the triplet excitation energy can be converted into light emission.

An exciplex whose excited state is formed by two kinds of substances has an extremely small difference between the S1 level and the T1 level and has a function of a TADF material that can convert triplet excitation energy into singlet excitation energy.

Note that a phosphorescent spectrum observed at low temperatures (e.g., 77 K to 10 K) is used for an index of the T1 level. When the level of energy with a wavelength of the line obtained by extrapolating a tangent to the fluorescent spectrum at a tail on the short wavelength side is the S1 level and the level of energy with a wavelength of the line obtained by extrapolating a tangent to the phosphorescent spectrum at a tail on the short wavelength side is the T1 level, the difference between S1 and T1 of the TADF material is preferably less than or equal to 0.3 eV, further preferably less than or equal to 0.2 eV.

In the case where the TADF material is used as the guest material in the light-emitting layer 113, the S1 level of the host material is preferably higher than the S1 level of the TADF material. In addition, the T1 level of the host material is preferably higher than the T1 level of the TADF material.

As the host material in the light-emitting layer 113, any of the host materials described below may be used as needed, although the materials which are preferable as the host material used in the light-emitting device of one embodiment of the present invention are described in Embodiment 1.

As the hole-transport material that can be used as the host material in the light-emitting layer 113, it is preferable to use a substance having a hole mobility such that an electron mobility when the square root of the electric field strength [V/cm] is 600 is higher than or equal to $1\times10^{-6}$ cm$^2$/Vs. Examples of the substance are shown below.

Examples include compounds having an aromatic amine skeleton, such as 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-(9-phenyl-9H-carbazol-3-yl)triphenylamine (abbreviation: PCBA1BP), 4,4'-diphenyl-4''-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4''-(9-phenyl-9H-carbazol-3-yl)triphenylamine (abbreviation: PCBNBB), 9,9-dimethyl-N-phenyl-N-[4-(9-phenyl-9H-carbazol-3-yl)phenyl]fluoren-2-amine (abbreviation: PCBAF), and N-phenyl-N-[4-(9-phenyl-9H-carbazol-3-yl)phenyl]spiro-9,9'-bifluoren-2-amine (abbreviation: PCBASF); compounds having a carbazole skeleton, such as 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), and 3,3'-bis(9-phenyl-9H-carbazole) (abbreviation: PCCP); compounds having a thiophene skeleton, such as 4,4',4''-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), and 4-[4-(9-phenyl-9H-fluoren-9-yl)phenyl]-6-phenyldibenzothiophene (abbreviation: DBTFLP-IV); and compounds having a furan skeleton, such as 4,4',4''-(benzene-1,3,5-triyl)tri(dibenzofuran) (abbreviation: DBF3P-II) and 4-{3-[3-(9-phenyl-9H-fluoren-9-yl)phenyl]phenyl}dibenzofuran (abbreviation: mmDBFFLBi-II). Among the above, the compound having an aromatic amine skeleton and the compound having a carbazole skeleton are preferable because these compounds are highly reliable and have high hole-transport properties to contribute to a reduction in driving voltage. In addition, the organic compounds given as examples of the above second organic compound can also be used.

As the electron-transport material that can be used as the host material in the light-emitting layer 113, it is preferable to use a substance having an electron mobility higher than or equal to $1\times10^{-6}$ cm$^2$/Vs in the case where the square root of the electric field strength [V/cm] is 600. Examples of the substance are shown below. In addition, an electron-transport material that can be used for the electron-transport layer 114, which will be described later, can also be used.

Examples include metal complexes such as bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), and bis[2-(2-benzothiazolyl)phenolato]zinc(II) (abbreviation: ZnBTZ); heterocyclic compounds having a polyazole skeleton, such as 2-(4-biphenylyl)-5-(4-tert-butylphenyl)-1,3,4-oxadiazole (abbreviation: PBD), 3-(4-biphenylyl)-4-phenyl-5-(4-tert-butylphenyl)-1,2,4-triazole (abbreviation: TAZ), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 2,2',2''-(1,3,5-benzenetriyl)tris(1-phenyl-1H-benzimidazole) (abbreviation: TPBI), and 2-[3-(dibenzothiophen-4-yl)phenyl]-1-phenyl-1H-benzimidazole (abbreviation: mDBT-BIm-II); heterocyclic compounds having a diazine skeleton, such as 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDBq), 4,6-bis[3-(phenanthren-9-yl)phenyl]pyrimidine (abbreviation: 4,6mPnP2Pm), and 4,6-bis[3-(4-dibenzothienyl)phenyl]pyrimidine (abbreviation: 4,6mDBTP2Pm-II), and heterocyclic compounds having a pyridine skeleton, such as 3,5-bis[3-(9H-carbazol-9-yl)phenyl]pyridine (abbreviation: 35DCzPPy) and 1,3,5-tri[3-(3-pyridyl)phenyl]benzene (abbreviation: TmPyPB). Among the above, the heterocyclic compound having a diazine skeleton and the heterocyclic compound having a pyridine skeleton are preferable because of having high reliability. In particular, the heterocyclic compound having a diazine (pyrimidine or pyrazine) skeleton has a high electron-transport property and contributes to a reduction in driving voltage.

In the case where the TADF material is used as the host material in the light-emitting layer 113, the above-described materials can also be used. Note that when the TADF material is used as the host material, triplet excitation energy generated in the TADF material is converted into singlet excitation energy by reverse intersystem crossing and transferred to the emission center substance, whereby the emission efficiency of the light-emitting element can be increased. At this time, the TADF material functions as an energy donor, and the emission center substance functions as an energy acceptor. Therefore, the use of the TADF material as the host material is very effective in the case where a fluorescent substance is used as the guest material. In that case, the S1 level of the TADF material is preferably higher than the S1 level of the fluorescent substance in order to achieve high emission efficiency. Furthermore, the T1 level of the TADF material is preferably higher than the S1 level of the fluorescent substance. Therefore, the T1 level of the TADF material is preferably higher than the T1 level of the fluorescent substance.

It is also preferable to use a TADF material that exhibits light emission overlapping with the wavelength of a lowest-energy-side absorption band of the fluorescent substance. This enables smooth transfer of excitation energy from the TADF material to the fluorescent substance and accordingly enables efficient light emission, which is preferable.

In order that singlet excitation energy is efficiently generated from the triplet excitation energy by reverse intersystem crossing, carrier recombination preferably occurs in the TADF material. It is also preferable that the triplet excitation energy generated in the TADF material not be transferred to the triplet excitation energy of the fluorescent substance. For that reason, the fluorescent substance preferably has a protective group around a luminophore (a skeleton that causes light emission) of the fluorescent substance. As the protective group, a substituent having no π bond and saturated hydrocarbon are preferably used. Specific examples include an alkyl group having 3 to 10 carbon atoms, a substituted or unsubstituted cycloalkyl group having 3 to 10 carbon atoms, and a trialkylsilyl group having 3 to 10 carbon atoms. It is further preferable that the fluorescent substance have a plurality of protective groups. The substituent having no π bond has a poor carrier-transport property; thus, the TADF material and the luminophore of the fluorescent substance can be made away from each other with little influence on carrier transportation or carrier recombination. Here, the luminophore refers to an atomic group (skeleton) that causes light emission in a fluorescent substance. The luminophore is preferably a skeleton having a π bond, further preferably includes an aromatic ring, and still further preferably includes a condensed aromatic ring or a condensed heteroaromatic ring. Examples of the condensed aromatic ring or the condensed heteroaromatic ring include a phenanthrene skeleton, a stilbene skeleton, an acridone skeleton, a phenoxazine skeleton, and a phenothiazine skeleton. Specifically, a fluorescent substance having any of a naphthalene skeleton, an anthracene skeleton, a fluorene skeleton, a chrysene skeleton, a triphenylene skeleton, a tetracene skeleton, a pyrene skeleton, a perylene skeleton, a coumarin skeleton, a quinacridone skeleton, and a naphthobisbenzofuran skeleton is preferable because of its high fluorescence quantum yield.

In the case where a fluorescent substance is used as the guest material in the light-emitting layer 113, a material having an anthracene skeleton is favorably used as the host material. The use of a substance having an anthracene skeleton makes it possible to obtain a light-emitting layer with high emission efficiency and high durability. Note that as the substance having an anthracene skeleton, a substance having a diphenylanthracene skeleton, in particular, a 9,10-diphenylanthracene skeleton is chemically stable and thus is preferable.

The host material preferably has a carbazole skeleton, in which case the hole-injection and hole-transport properties are improved; further preferably, the host material includes a benzocarbazole skeleton where a benzene ring is further condensed to carbazole, in which case the HOMO level thereof is shallower than that in the case of using carbazole by approximately 0.1 eV and thus holes enter the host material easily. In particular, the host material preferably includes a dibenzocarbazole skeleton, in which case the HOMO level thereof is shallower than that in the case of using carbazole by approximately 0.1 eV so that holes enter the host material easily, the hole-transport property is improved, and the heat resistance is increased.

Thus, a substance having both of a 9,10-diphenylanthracene skeleton, which is an anthracene skeleton, and a carbazole skeleton (or a benzocarbazole skeleton or a dibenzocarbazole skeleton) is further preferable as the host material. Note that in terms of improving the hole-injection and hole-transport properties described above, a benzofluorene skeleton or a dibenzofluorene skeleton may be used instead of a carbazole skeleton. Examples of such a substance include 9-phenyl-3-[4-(10-phenyl-9-anthryl)phenyl]-9H-carbazole (abbreviation: PCzPA), 3-[4-(1-naphthyl)-phenyl]-9-phenyl-9H-carbazole (abbreviation: PCPN), 9-[4-(10-phenyl-9-anthracenyl)phenyl]-9H-carbazole (abbreviation: CzPA), 7-[4-(10-phenyl-9-anthryl)phenyl]-7H-dibenzo[c,g]carbazole (abbreviation: cgDBCzPA), 6-[3-(9,10-diphenyl-2-anthryl)phenyl]-benzo[b]naphtho[1,2-d]furan (abbreviation: 2mBnfPPA), 9-phenyl-10-{4-(9-phenyl-9H-fluoren-9-yl)biphenyl-4'-yl}anthracene (abbreviation: FLPPA), and 9-(1-naphthyl)-10-[4-(2-naphthyl)phenyl]anthracene (abbreviation: αN-βNPAnth). In particular, CzPA, cgDBCzPA, 2mBnfPPA, and PCzPA are preferable because they exhibit excellent characteristics.

Note that the host material may be a mixture of a plurality of kinds of substances; in the case of using a mixed host material, it is preferable to mix an electron-transport material and a hole-transport material. By mixing the electron-transport material and the hole-transport material, the transport properties of the light-emitting layer 113 can be easily adjusted and a recombination region can be easily controlled. The weight ratio of the content of the hole-transport material to the content of the electron-transport material is the hole-transport material: the electron-transport material=1:19 to 19:1.

Note that a phosphorescent substance can be used as part of the host material in the case where the host material is formed by mixing a plurality of kinds of substances as described above. When a fluorescent substance is used as the emission center material, a phosphorescent substance can be used as an energy donor for supplying excitation energy to the fluorescent substance.

The materials mixed in the above manner may form an exciplex. When a combination of materials in this case is selected so as to form an exciplex that exhibits light emission overlapping with the wavelength of a lowest-energy-side absorption band of the light-emitting substance, energy can be transferred smoothly and light emission can be obtained efficiently. The use of such a structure is preferred because the driving voltage can be reduced.

Note that at least one of the materials forming an exciplex may be a phosphorescent substance. In this case, triplet excitation energy can be efficiently converted into singlet excitation energy by reverse intersystem crossing.

Note that a combination of materials forming an exciplex is preferably such that the HOMO level of a hole-transport material is higher than or equal to the HOMO level of an electron-transport material. In addition, the LUMO level of the hole-transport material is preferably higher than or equal to the LUMO level of the electron-transport material. Note that the LUMO levels and the HOMO levels of the materials can be derived from the electrochemical characteristics (the reduction potentials and the oxidation potentials) of the materials that are measured by cyclic voltammetry (CV).

Note that the formation of an exciplex can be confirmed by a phenomenon in which the emission spectrum of the mixed film in which the hole-transport material and the electron-transport material are mixed is shifted to the longer wavelength side than the emission spectrum of each of the materials (or has another peak on the longer wavelength side) observed by comparison of the emission spectra of the hole-transport material, the electron-transport material, and the mixed film of these materials, for example. Alternatively, the formation of an exciplex can be confirmed by a difference in transient response, such as a phenomenon in which the transient photoluminescence (PL) lifetime of the mixed film has more long-lifetime components or has a higher proportion of delayed components than that of each of the materials, observed by comparison of transient PL of the hole-transport material, the electron-transport material, and the mixed film of these materials. The transient PL can be rephrased as transient electroluminescence (EL). That is, the formation of an exciplex can also be confirmed by a difference in transient response observed by comparison of the transient EL of the hole-transport material, the material having an electron-transport property, and the mixed film of the materials.

<Electron-Transport Layer>

The electron-transport layer 114 is a layer that transports electrons, which have been injected from the second electrode 102, to the light-emitting layer 113 and is provided in contact with the light-emitting layer 113. Note that the electron-transport layer 114 contains any of a metal, a metal salt, a metal oxide, and a metal complex, in addition to an electron-transport material. In particular, a metal complex containing an alkali metal or an alkaline earth metal is preferably used. Note that such a metal, metal salt, metal oxide, or metal complex is included in any region of the electron-transport layer 114 and is included in, for example, any layer of the electron-transport layer 114 in the case where the electron-transport layer 114 has a stacked-layer structure. The LUMO level of the electron-transport material used for the electron-transport layer 114 in contact with the light-emitting layer 113 (or a layer in contact with the light-emitting layer when the electron-transport layer 114 has a stacked-layer structure) is preferably deeper (lower) than the LUMO level of the host material used for the light-emitting layer 113, and the difference therebetween is preferably greater than or equal to 0.15 eV and less than or equal to 0.40 eV or greater than or equal to 0.20 eV and less than or equal to 0.40 eV, further preferably greater than or equal to 0.20 eV and less than or equal to 0.35 eV.

As the electron-transport material of the electron-transport layer 114 (i.e., the fifth substance or the seventh substance), any of the electron-transport materials described below may be used as needed, although the materials which are preferable as the electron-transport material used in the light-emitting device of one embodiment of the present invention are described in Embodiment 1.

Note that the electron-transport material used for the electron-transport layer 114 is preferably an electron-transport material with a HOMO level higher than or equal to −6.0 eV. The electron-transport material with a HOMO level higher than or equal to −6.0 eV preferably has an electron mobility higher than or equal to $1\times10^{-7}$ cm$^2$/Vs and lower than or equal to $1\times10^{-5}$ cm$^2$/Vs, further preferably higher than or equal to $1\times10^{-7}$ cm$^2$/Vs and lower than or equal to $5\times10^{-5}$ cm$^2$/Vs in the case where the square root of the electric field strength [V/cm] is 600.

Note that the electron-transport material with a HOMO level higher than or equal to −6.0 eV preferably has an anthracene skeleton, further preferably includes an anthracene skeleton and a heterocyclic skeleton.

In addition, some of the above-described electron-transport materials that can be used as the host material, or the above-described materials given as materials that can be used as the host material in combination with the fluorescent substance can be used for the electron-transport layer 114.

As the metal, metal salt, metal oxide, or metal complex (i.e., the sixth substance or the eighth substance) of the electron-transport layer 114, although preferable examples thereof are described in Embodiment 1, any of the substances described below may be used as needed.

Examples of the metal include an alkali metal, an alkaline earth metal, and a rare earth metal. Specific examples include Li, Na, K, Rb, Cs, Mg, Ca, Sr, and Ba.

Examples of the metal salt include halides of the above metals and carbonates of the above metals. Specific examples include LiF, NaF, KF, RbF, CsF, MgF$_2$, CaF$_2$, SrF$_2$, BaF$_2$, LiCl, NaCl, KCl, RbCl, CsCl, MgCl$_2$, CaCl$_2$, SrCl$_2$, BaCl$_2$, Li$_2$CO$_3$, and Cs$_2$CO$_3$.

Examples of the metal oxide are oxides of the above metals. Specific examples include Li$_2$O, Na$_2$O, Cs$_2$O, MgO, and CaO.

As described in Embodiment 1, the sixth substance (and the eighth substance) is preferably a metal complex. The metal complex is preferably a metal complex that contains a monovalent metal ion and a ligand including an 8-hydroxyquinolinato structure. Examples of the ligand including an 8-hydroxyquinolinato structure are 8-hydroxyquinolinato, methyl-substituted (e.g., 2-methyl substituted or 5-methyl substituted) 8-hydroxyquinolinato, and the like. Note that the 8-hydroxyquinolinato structure refers to a structure in which a proton of a —OH group in substituted or unsubstituted 8-hydroxyquinolinol has been detached.

Thus, examples of the above metal complex that contains an alkali metal or an alkaline earth metal include 8-(hydroxyquinolinato)lithium (abbreviation: Liq), which is a lithium complex having a ligand including an 8-hydroxyquinolinato structure, 8-(hydroxyquinolinato)sodium (abbreviation: Naq), which is a sodium complex having a ligand including an 8-hydroxyquinolinato structure, 8-(hydroxyquinolinato)potassium (abbreviation: Kq), which is a potassium complex having a ligand including an 8-hydroxyquinolinato structure, and bis(8-hydroxyquinolinato)magnesium (abbreviation: Mgq$_2$), which is a magnesium complex having a ligand including an 8-hydroxyquinolinato structure, and examples of other metal complexes include bis(8-hydroxyquinolinato)zinc (abbreviation: Znq$_2$), which is a zinc complex having a ligand including an 8-hydroxyquinolinato structure.

<Electron-Injection Layer>

The electron-injection layer 115 is a layer for increasing the efficiency of electron injection from the cathode 102 and is preferably formed using a material whose LUMO level value has a small difference (0.5 eV or less) from the work function value of the material used for the cathode 102. Thus, the electron-injection layer 115 can be formed using an alkali metal, an alkaline earth metal, or a compound thereof, such as lithium, cesium, lithium fluoride (LiF), cesium fluoride (CsF), calcium fluoride ($CaF_2$), 8-(hydroxyquinolinato)lithium (abbreviation: Liq), 2-(2-pyridyl)phenolatolithium (abbreviation: LiPP), 2-(2-pyridyl)-3-pyridinolatolithium (abbreviation: LiPPy), 4-phenyl-2-(2-pyridyl)phenolatolithium (abbreviation: LiPPP), lithium oxide ($LiO_x$), or cesium carbonate. A rare earth metal compound such as erbium fluoride ($ErF_3$) can also be used.

Figure 3B:
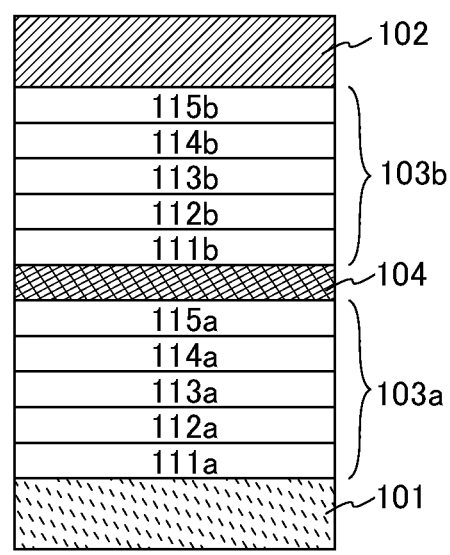

When a charge-generation layer 104 is provided between two EL layers (103a and 103b) as in the light-emitting device shown in FIG. 3B, a structure in which a plurality of EL layers are stacked between the pair of electrodes (also referred to as a tandem structure) can be achieved. Note that in this embodiment, functions and materials of the hole-injection layer (111), the hole-transport layer (112), the light-emitting layer (113), the electron-transport layer (114), and the electron-injection layer (115) that are illustrated in FIG. 3A are the same as those of hole-injection layers (111a and 111b), hole-transport layers (112a and 112b), light-emitting layers (113a and 113b), electron-transport layers (114a and 114b), and electron-injection layers (115a and 115b) that are illustrated in FIG. 3B.

<Charge-Generation Layer>

In the light-emitting device of FIG. 3B, the charge-generation layer 104 has a function of injecting electrons into the EL layer 103a closer to the first electrode 101 serving as the anode and injecting holes into the EL layer 103b closer to the second electrode 102 serving as the cathode when a voltage is applied between the first electrode (anode) 101 and the second electrode (cathode) 102. Note that the charge-generation layer 104 may have either a structure in which an electron acceptor (acceptor) is added to a hole-transport material (a P-type layer) or a structure in which an electron donor (donor) is added to an electron-transport material (an N-type layer). Alternatively, both of these structures may be stacked. Alternatively, the P-type layer may be formed in combination with either one or both of an electron-relay layer and an electron-injection buffer layer that will be described later. Note that forming the charge-generation layer 104 with the use of any of the above materials can inhibit the increase in driving voltage that would occur when the EL layers are stacked.

In the case where the charge-generation layer 104 has a structure in which an electron acceptor is added to a hole-transport material (a P-type layer), any of the materials described in this embodiment can be used as the hole-transport material. Examples of the electron acceptor include 7,7,8,8-tetracyano-2,3,5,6-tetrafluoroquinodimethane (abbreviation: $F_4$-TCNQ) and chloranil. Other examples include oxides of metals that belong to Group 4 to Group 8 of the periodic table. Specific examples include vanadium oxide, niobium oxide, tantalum oxide, chromium oxide, molybdenum oxide, tungsten oxide, manganese oxide, and rhenium oxide.

In the case where the charge-generation layer 104 has a structure in which an electron donor is added to an electron-transport material (an N-type layer), any of the materials described in this embodiment can be used as the electron-transport material. As the electron donor, an alkali metal, an alkaline earth metal, a rare earth metal, metals that belong to Groups 2 and 13 of the periodic table, or an oxide or a carbonate thereof can be used. Specifically, lithium (Li), cesium (Cs), magnesium (Mg), calcium (Ca), ytterbium (Yb), indium (In), lithium oxide, cesium carbonate, or the like is preferably used. An organic compound such as tetrathianaphthacene may be used as the electron donor.

When the electron-relay layer which is described above as preferably being combined with the P-type layer is provided between the electron-injection buffer layer and the P-type layer, the electron-relay layer has a function of preventing an interaction between the electron-injection buffer layer and the P-type layer and smoothly transferring electrons. The electron-relay layer includes at least an electron-transport material, and the LUMO level of the electron-transport material included in the electron-relay layer is preferably between the LUMO level of the electron-accepting substance in the P-type layer and the LUMO level of a substance included in the electron-injection buffer layer. A specific energy level of the LUMO level of the electron-transport material in the electron-relay layer is preferably higher than or equal to −5.0 eV, further preferably higher than or equal to −5.0 eV and lower than or equal to −3.0 eV. Note that as the electron-transport material in the electron-relay layer, a phthalocyanine-based material or a metal complex having a metal-oxygen bond and an aromatic ligand is preferably used.

A substance having a high electron-injection property, such as an alkali metal, an alkaline earth metal, a rare earth metal, or a compound thereof (an alkali metal compound (including an oxide such as lithium oxide, a halide, and a carbonate such as lithium carbonate and cesium carbonate), an alkaline earth metal compound (including an oxide, a halide, and a carbonate), or a rare earth metal compound (including an oxide, a halide, and a carbonate)), can be used for the electron-injection buffer layer.

In the case where the electron-injection buffer layer contains an electron-transport material and an electron-donating substance, an organic compound such as tetrathianaphthacene (abbreviation: TTN), nickelocene, or decamethylnickelocene, as well as an alkali metal, an alkaline earth metal, a rare earth metal, or a compound thereof (an alkali metal compound (including an oxide such as lithium oxide, a halide, and a carbonate such as lithium carbonate and cesium carbonate), an alkaline earth metal compound (including an oxide, a halide, and a carbonate), or a rare earth metal compound (including an oxide, a halide, and a carbonate)), can be used as the electron-donating substance. As the electron-transport material, a material similar to the above-described material for the electron-transport layer can be used.

Although FIG. 3B shows the structure in which two EL layers 103 are stacked, a structure may be employed in which three or more EL layers are stacked with a charge-generation layer provided between different EL layers.

The above-described charge-generation layer can be used instead of the above-described electron-injection layer. In that case, it is preferred that the electron-injection buffer layer, the electron-relay layer, and the P-type layer be stacked in this order from the anode side.

<Substrate>

The light-emitting device described in this embodiment can be formed over a variety of substrates. Note that the type of the substrate is not limited to a certain type. Examples of the substrate include semiconductor substrates (e.g., a single crystal substrate and a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, a laminate film, paper including a fibrous material, and a base material film.

Examples of the glass substrate include barium borosilicate glass, aluminoborosilicate glass, and soda lime glass. Examples of the flexible substrate, the laminate film, and the base material film include plastics typified by polyethylene terephthalate (PET), polyethylene naphthalate (PEN), and polyether sulfone (PES), a synthetic resin such as an acrylic resin, polypropylene, polyester, polyvinyl fluoride, polyvinyl chloride, polyamide, polyimide, an aramid resin, an epoxy resin, an inorganic vapor deposition film, and paper.

For fabrication of the light-emitting device in this embodiment, a vacuum process such as an evaporation method or a solution process such as a spin coating method or an ink-jet method can be used. In the case of using an evaporation method, a physical vapor deposition method (PVD method) such as a sputtering method, an ion plating method, an ion beam evaporation method, a molecular beam evaporation method, or a vacuum evaporation method, a chemical vapor deposition method (CVD method), or the like can be used. Specifically, the functional layers (the hole-injection layers (111, 111a, and 111b), the hole-transport layers (112, 112a, and 112b), the light-emitting layers (113, 113a, and 113b), the electron-transport layers (114, 114a, and 114b), and the electron-injection layers (115, 115a, and 115b)) included in the EL layers and the charge-generation layer (104) of the light-emitting device can be formed by an evaporation method (e.g., a vacuum evaporation method), a coating method (e.g., a dip coating method, a die coating method, a bar coating method, a spin coating method, or a spray coating method), a printing method (e.g., an ink-jet method, a screen printing (stencil) method, an offset printing (planography) method, a flexography (relief printing) method, a gravure printing method, a micro-contact printing method, or a nanoimprinting method), or the like.

Note that materials that can be used for the functional layers (the hole-injection layers (111, 111a, and 111b), the hole-transport layers (112, 112a, and 112b), the light-emitting layers (113, 113a, and 113b), the electron-transport layers (114, 114a, and 114b), and the electron-injection layers (115, 115a, and 115b)) included in the EL layers (103, 103a, and 103b) and the charge-generation layer (104) of the light-emitting device described in this embodiment are not limited to the above materials, and other materials can also be used in combination as long as the functions of the layers are fulfilled. For example, a high molecular compound (e.g., an oligomer, a dendrimer, and a polymer), a middle molecular compound (a compound between a low molecular compound and a high molecular compound with a molecular weight of 400 to 4000), or an inorganic compound (e.g., a quantum dot material) can be used. As the quantum dot material, a colloidal quantum dot material, an alloyed quantum dot material, a core-shell quantum dot material, a core quantum dot material, or the like can be used.

The light-emitting device of one embodiment of the present invention that has the above-described structure and is used in a light-emitting apparatus can have a long lifetime.

The structure described in this embodiment can be used in an appropriate combination with any of the structures described in the other embodiments.

Embodiment 3

Figure 4A:
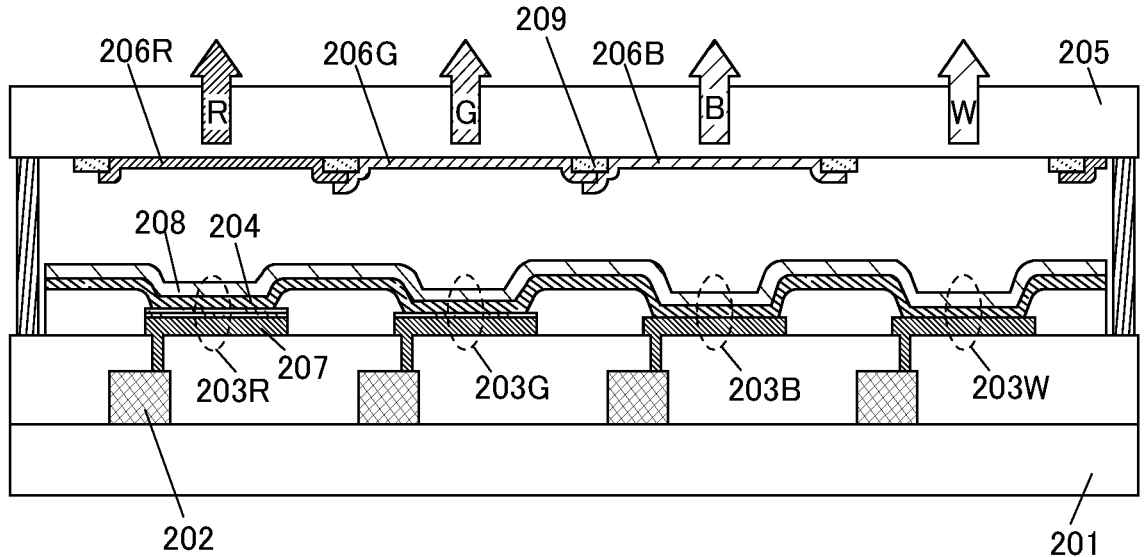
FIG. 4A, FIG. 4B, and FIG. 4C are diagrams illustrating light-emitting apparatuses.

In this embodiment, a light-emitting apparatus of one embodiment of the present invention is described. A light-emitting apparatus shown in FIG. 4A is an active-matrix light-emitting apparatus in which transistors (FETs) 202 over a first substrate 201 are electrically connected to light-emitting devices (203R, 203G, 203B, and 203W); the light-emitting devices (203R, 203G, 203B, and 203W) include a common EL layer 204 and each have a microcavity structure where the optical path length between electrodes of the light-emitting device is adjusted according to the emission color of the light-emitting device. The light-emitting apparatus is a top-emission light-emitting apparatus in which light obtained from the EL layer 204 is emitted through color filters (206R, 206G, and 206B) formed on a second substrate 205.

In the light-emitting apparatus shown in FIG. 4A, a first electrode 207 is formed so as to function as a reflective electrode. A second electrode 208 is formed to function as a transflective electrode having both properties of transmitting and reflecting light (visible light or near-infrared light). Note that the description in the other embodiments can be referred to for electrode materials forming the first electrode 207 and the second electrode 208, and appropriate materials can be used.

Figure 4B:
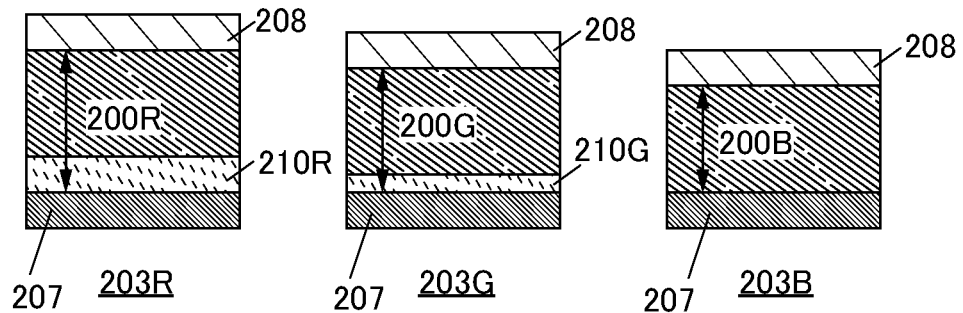

In the case where the light-emitting device 203R is a red-light-emitting device, the light-emitting device 203G is a green-light-emitting device, the light-emitting device 203B is a blue-light-emitting device, and the light-emitting device 203W is a white-light-emitting device in FIG. 4A, for example, the distance between the first electrode 207 and the second electrode 208 in the light-emitting device 203R is adjusted to have an optical path length 200R, the distance between the first electrode 207 and the second electrode 208 in the light-emitting device 203G is adjusted to have an optical path length 200G, and the distance between the first electrode 207 and the second electrode 208 in the light-emitting device 203B is adjusted to have an optical path length 200B, as shown in FIG. 4B. Note that optical adjustment can be performed in such a manner that a conductive layer 210R is stacked over the first electrode 207 in the light-emitting device 203R and a conductive layer 210G is stacked in the light-emitting device 203G as shown in FIG. 4B.

The color filters (206R, 206G, and 206B) are formed on the second substrate 205. Note that the color filter is a filter that transmits visible light in a specific wavelength range and blocks visible light in a specific wavelength range. Thus, as shown in FIG. 4A, the color filter 206R that transmits only light in the red wavelength range is provided in a position overlapping with the light-emitting device 203R, whereby red light emission can be obtained from the light-emitting device 203R. The color filter 206G that transmits only light in the green wavelength range is provided in a position overlapping with the light-emitting device 203G, whereby green light emission can be obtained from the light-emitting device 203G. The color filter 206B that transmits only light in the blue wavelength range is provided in a position overlapping with the light-emitting device 203B, whereby blue light emission can be obtained from the light-emitting device 203B. Note that the light-emitting device 203W can emit white light without a color filter. Note that a black layer (black matrix) 209 may be provided at an end portion of one type of color filter. The color filters (206R, 206G, and 206B) and the black layer 209 may be covered with an overcoat layer using a transparent material.

Figure 4C:
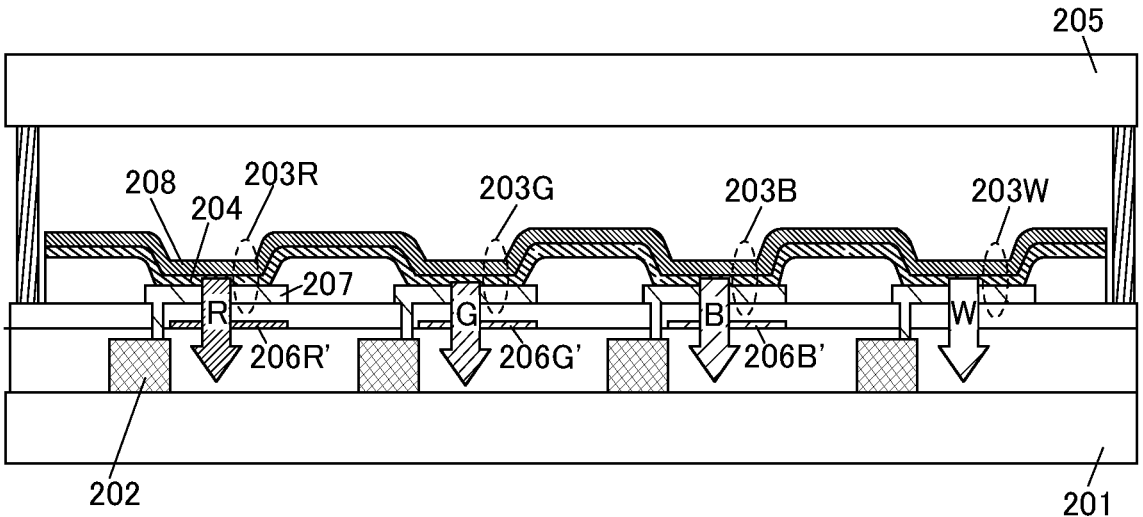

Although the light-emitting apparatus in FIG. 4A has a structure in which light is extracted from the second substrate 205 side (a top-emission structure), the light-emitting apparatus may have a structure in which light is extracted from the first substrate 201 side where the FETs 202 are formed (a bottom-emission structure) as shown in FIG. 4C. Note that for a bottom-emission light-emitting apparatus, the first electrode 207 is formed so as to function as a transflective electrode and the second electrode 208 is formed so as to function as a reflective electrode. As the first substrate 201, a substrate having at least a light-transmitting property is used. Color filters (206R', 206G', and 206B') are provided closer to the first substrate 201 than the light-emitting devices (203R, 203G, and 203B) are, as shown in FIG. 4C.

FIG. 4A shows the case where the light-emitting devices are the red-light-emitting device, the green-light-emitting device, the blue-light-emitting device, and the white-light-emitting device; however, the light-emitting devices of embodiments of the present invention are not limited to the above structures, and a yellow-light-emitting device or an orange-light-emitting device may be included. Note that the description in the other embodiments can be referred to for materials that are used for the EL layers (a light-emitting layer, a hole-injection layer, a hole-transport layer, an electron-transport layer, an electron-injection layer, a charge-generation layer, and the like) to fabricate each of the light-emitting devices, and appropriate materials can be used. In that case, a color filter needs to be appropriately selected according to the emission color of the light-emitting device.

With the above structure, a light-emitting apparatus including light-emitting devices that exhibit a plurality of emission colors can be obtained.

Note that the structure described in this embodiment can be used in an appropriate combination with any of the structures described in the other embodiments.

Embodiment 4

In this embodiment, a light-emitting apparatus of one embodiment of the present invention is described.

The use of the device structure of the light-emitting device of one embodiment of the present invention allows fabrication of an active-matrix light-emitting apparatus and a passive-matrix light-emitting apparatus. Note that an active-matrix light-emitting apparatus has a structure including a combination of a light-emitting device and a transistor (an FET). Thus, each of a passive-matrix light-emitting apparatus and an active-matrix light-emitting apparatus is included in one embodiment of the present invention. Note that any of the light-emitting devices described in the other embodiments can be used in the light-emitting apparatus described in this embodiment.

In this embodiment, an active-matrix light-emitting apparatus is described with reference to FIG. 5.

Figure 5A:
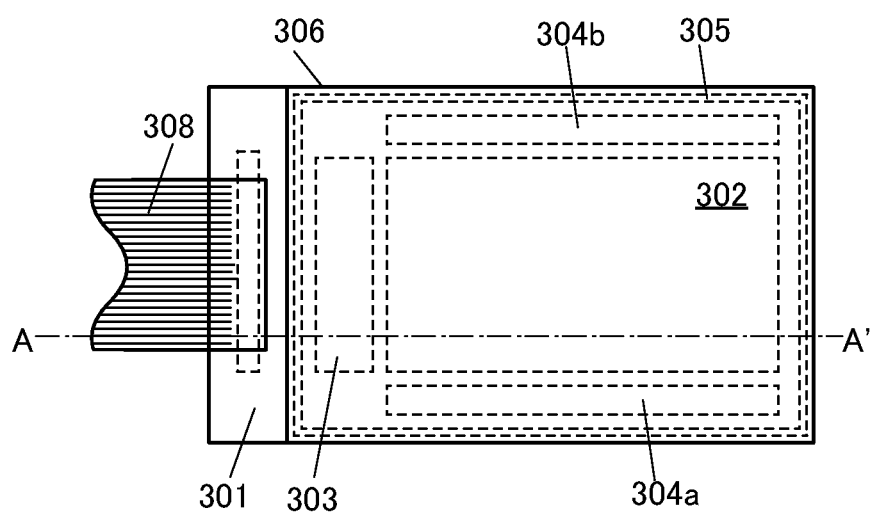
FIG. 5A is a top view illustrating a light-emitting apparatus.
Figure 5B:
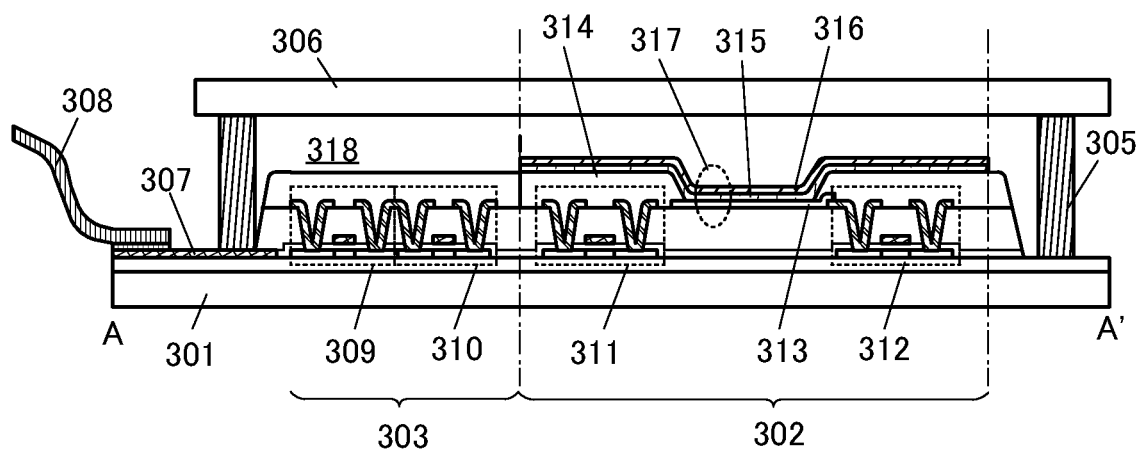
FIG. 5B is a cross-sectional view illustrating the light-emitting apparatus.

Note that FIG. 5A is a top view showing a light-emitting apparatus, and FIG. 5B is a cross-sectional view taken along the chain line A-A' in FIG. 5A. The active-matrix light-emitting apparatus includes a pixel portion 302, a driver circuit portion (source line driver circuit) 303, and driver circuit portions (gate line driver circuits) (304a and 304b) that are provided over a first substrate 301. The pixel portion 302 and the driver circuit portions (303, 304a, and 304b) are sealed between the first substrate 301 and a second substrate 306 with a sealant 305.

A lead wiring 307 is provided over the first substrate 301. The lead wiring 307 is electrically connected to an FPC 308 that is an external input terminal. The FPC 308 transmits a signal (e.g., a video signal, a clock signal, a start signal, and a reset signal) and a potential from the outside to the driver circuit portions (303, 304a, and 304b). The FPC 308 may be provided with a printed wiring board (PWB). Note that the light-emitting apparatus provided with an FPC or a PWB is included in the category of a light-emitting apparatus.

Next, FIG. 5B shows the cross-sectional structure.

The pixel portion 302 is made up of a plurality of pixels each including an FET (switching FET) 311, an FET (current control FET) 312, and a first electrode 313 electrically connected to the FET 312. Note that the number of FETs included in each pixel is not particularly limited and can be set appropriately as needed.

As FETs 309, 310, 311, and 312, for example, a staggered transistor or an inverted staggered transistor can be used without particular limitation. A top-gate transistor, a bottom-gate transistor, or the like may be used.

Note that there is no particular limitation on the crystallinity of a semiconductor that can be used for the FETs 309, 310, 311, and 312, and an amorphous semiconductor or a semiconductor having crystallinity (a microcrystalline semiconductor, a polycrystalline semiconductor, a single crystal semiconductor, or a semiconductor partly including crystal regions) may be used. Note that a semiconductor having crystallinity is preferably used, in which case degradation of the transistor characteristics can be inhibited.

For these semiconductors, a Group 14 element, a compound semiconductor, an oxide semiconductor, an organic semiconductor, or the like can be used, for example. Typically, a semiconductor containing silicon, a semiconductor containing gallium arsenide, an oxide semiconductor containing indium, or the like can be used.

The driver circuit portion 303 includes the FET 309 and the FET 310. Note that the driver circuit portion 303 may be formed with a circuit including transistors having the same conductivity type (either only n-channel transistors or only p-channel transistors) or a CMOS circuit including an n-channel transistor and a p-channel transistor. Furthermore, a driver circuit may be provided outside.

An end portion of the first electrode 313 is covered with an insulator 314. For the insulator 314, an organic compound such as a negative photosensitive resin or a positive photosensitive resin (an acrylic resin), or an inorganic compound such as silicon oxide, silicon oxynitride, or silicon nitride can be used. An upper end portion or a lower end portion of the insulator 314 preferably has a curved surface with curvature. In that case, favorable coverage with a film formed over the insulator 314 can be obtained.

An EL layer 315 and a second electrode 316 are stacked over the first electrode 313. The EL layer 315 includes a light-emitting layer, a hole-injection layer, a hole-transport layer, an electron-transport layer, an electron-injection layer, a charge-generation layer, and the like.

The structure and materials described in the other embodiments can be used for the structure of a light-emitting device 317 described in this embodiment. Note that although not shown here, the second electrode 316 is electrically connected to the FPC 308 that is an external input terminal.

Although the cross-sectional view in FIG. 5B shows only one light-emitting device 317, a plurality of light-emitting devices are arranged in a matrix in the pixel portion 302. Light-emitting devices from which three kinds of light emission (R, G, and B) is obtained are selectively formed in the pixel portion 302, whereby a light-emitting apparatus capable of full-color display can be formed. In addition to the light-emitting devices from which three kinds of light emission (R, G, and B) is obtained, for example, light-emitting devices from which light emission of white (W), yellow (Y), magenta (M), cyan (C), and the like is obtained may be formed. For example, when the light-emitting devices from which light emission of some of the kinds is obtained are added to the light-emitting devices from which three kinds of light emission (R, G, and B) is obtained, effects such as an improvement in color purity and a reduction in power consumption can be obtained. Alternatively, a light-emitting apparatus that is capable of full-color display may be fabricated by a combination with color filters. As the kinds of color filters, red (R), green (G), blue (B), cyan (C), magenta (M), and yellow (Y) color filters and the like can be used.

When the second substrate 306 and the first substrate 301 are bonded to each other with the sealant 305, the FETs (309, 310, 311, and 312) and the light-emitting device 317 over the first substrate 301 are provided in a space 318 surrounded by the first substrate 301, the second substrate 306, and the sealant 305. Note that the space 318 may be filled with an inert gas (e.g., nitrogen or argon) or an organic substance (including the sealant 305).

An epoxy resin or glass frit can be used for the sealant 305. Note that a material that transmits moisture and oxygen as little as possible is preferably used for the sealant 305. As the second substrate 306, a substrate that can be used as the first substrate 301 can be similarly used. Thus, any of the various substrates described in the other embodiments can be appropriately used. As the substrate, a glass substrate, a quartz substrate, or a plastic substrate made of FRP (Fiber-Reinforced Plastics), PVF (polyvinyl fluoride), polyester, an acrylic resin, or the like can be used. In the case where glass frit is used for the sealant, the first substrate 301 and the second substrate 306 are preferably glass substrates in terms of adhesion.

In the above manner, the active-matrix light-emitting apparatus can be obtained.

In the case where the active-matrix light-emitting apparatus is formed over a flexible substrate, the FETs and the light-emitting device may be directly formed over the flexible substrate; alternatively, the FETs and the light-emitting device may be formed over a substrate provided with a separation layer and then separated at the separation layer by application of heat, force, laser irradiation, or the like to be transferred to a flexible substrate. Note that for the separation layer, a stack of inorganic films such as a tungsten film and a silicon oxide film, or an organic resin film of polyimide or the like can be used, for example. Examples of the flexible substrate include, in addition to a substrate where a transistor can be formed, a paper substrate, a cellophane substrate, an aramid film substrate, a polyimide film substrate, a cloth substrate (including a natural fiber (silk, cotton, and hemp), a synthetic fiber (nylon, polyurethane, and polyester), a regenerated fiber (acetate, cupro, rayon, and regenerated polyester), and the like), a leather substrate, and a rubber substrate. With the use of any of these substrates, high durability, high heat resistance, a reduction in weight, and a reduction in thickness can be achieved.

The light-emitting device included in the active-matrix light-emitting apparatus may be driven to emit light in a pulsed manner (using a frequency of kHz or MHz, for example) so that the light is used for display. The light-emitting device formed using any of the above organic compounds has excellent frequency characteristics; thus, the time for driving the light-emitting device can be shortened, and the power consumption can be reduced. Furthermore, a reduction in driving time leads to inhibition of heat generation, so that the degree of degradation of the light-emitting device can be reduced.

Note that the structure described in this embodiment can be used in an appropriate combination with any of the structures described in the other embodiments.

Embodiment 5

In this embodiment, examples of a variety of electronic devices and an automobile completed using the light-emitting device of one embodiment of the present invention or a light-emitting apparatus including the light-emitting device of one embodiment of the present invention are described. Note that the light-emitting apparatus can be used mainly in a display portion of the electronic device described in this embodiment.

Electronic devices shown in FIG. 6A to FIG. 6G can include a housing 7000, a display portion 7001, a speaker 7003, an LED lamp 7004, an operation key 7005 (including a power switch or an operation switch), a connection terminal 7006, a sensor 7007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), a microphone 7008, and the like.

Figure 6A:
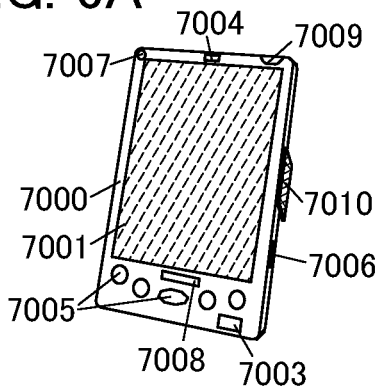
FIG. 6A is a diagram illustrating a mobile computer.

FIG. 6A shows a mobile computer that can include a switch 7009, an infrared port 7010, and the like in addition to the above components.

Figure 6B:
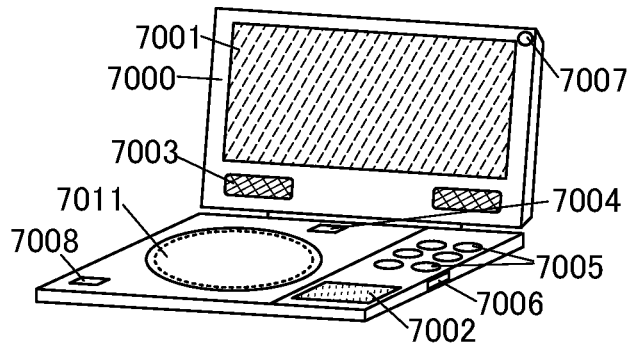
FIG. 6B is a diagram illustrating a portable image reproducing device.

FIG. 6B shows a portable image reproducing device (e.g., a DVD player) that is provided with a recording medium and can include a second display portion 7002, a recording medium reading portion 7011, and the like in addition to the above components.

Figure 6C:
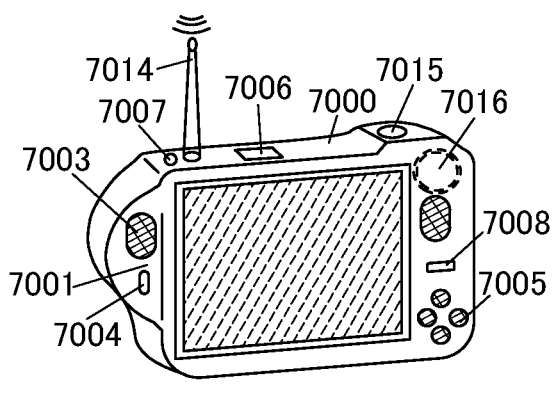
FIG. 6C is a diagram illustrating a digital camera.

FIG. 6C shows a digital camera that has a television reception function and can include an antenna 7014, a shutter button 7015, an image receiving portion 7016, and the like in addition to the above components.

Figure 6D:
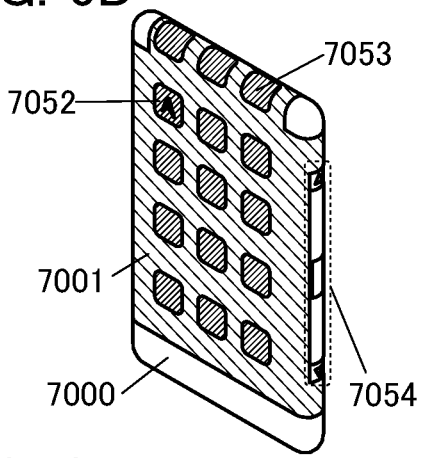
FIG. 6D is a diagram illustrating a portable information terminal.

FIG. 6D shows a portable information terminal. The portable information terminal has a function of displaying information on three or more surfaces of the display portion 7001. Here, an example in which information 7052, information 7053, and information 7054 are displayed on different surfaces is shown. For example, the user can check the information 7053 displayed in a position that can be observed from above the portable information terminal, with the portable information terminal put in a breast pocket of his/her clothes. The user can see the display without taking out the portable information terminal from the pocket and decide whether to answer the call, for example.

Figure 6E:
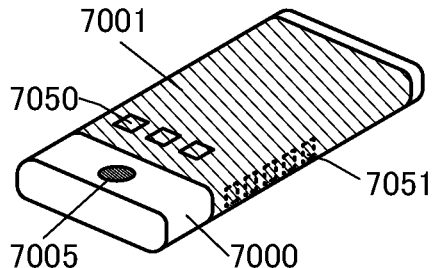
FIG. 6E is a diagram illustrating a portable information terminal.

FIG. 6E shows a portable information terminal (e.g., a smartphone) that can include the display portion 7001, the operation key 7005, and the like in the housing 7000. Note that the speaker 7003, the connection terminal 7006, the sensor 7007, or the like may be provided in the portable information terminal. The portable information terminal can display text and image information on its plurality of surfaces. Here, an example in which three icons 7050 are displayed is shown. Information 7051 indicated by the dashed rectangles can be displayed on another surface of the display portion 7001. Examples of the information 7051 include notification of reception of an e-mail, SNS, or an incoming call, the title and sender of an e-mail, SNS, or the like, the date, the time, remaining battery, and the reception strength of an antenna. Alternatively, the icon 7050 or the like may be displayed in the position where the information 7051 is displayed.

Figure 6F:
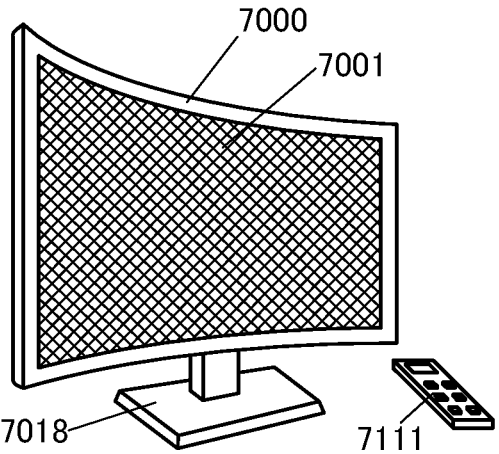
FIG. 6F is a diagram illustrating a television device.

FIG. 6F shows a large-size television set (also referred to as TV or television receiver) that can include the housing 7000, the display portion 7001, and the like. Here, a structure in which the housing 7000 is supported by a stand 7018 is shown. The television set can be operated with a separate remote controller 7111 or the like. Note that the display portion 7001 may include a touch sensor, in which case the television set may be operated by touch on the display portion 7001 with a finger or the like. The remote controller

7111 may include a display portion for displaying information output from the remote controller 7111. With operation keys or a touch panel provided in the remote controller 7111, channels and volume can be controlled and images displayed on the display portion 7001 can be controlled.

The electronic devices shown in FIG. 6A to FIG. 6F can have a variety of functions. For example, they can have a function of displaying a variety of information (e.g., a still image, a moving image, and a text image) on the display portion, a touch panel function, a function of displaying a calendar, the date, the time, or the like, a function of controlling processing with a variety of software (programs), a wireless communication function, a function of being connected to a variety of computer networks with a wireless communication function, a function of transmitting and receiving a variety of data with a wireless communication function, and a function of reading out a program or data stored in a recording medium and displaying it on the display portion. Furthermore, the electronic device including a plurality of display portions can have a function of displaying image information mainly on one display portion while displaying text information mainly on another display portion, a function of displaying a three-dimensional image by displaying images on a plurality of display portions with a parallax taken into account, or the like. Moreover, the electronic device including an image receiving portion can have a function of taking a still image, a function of taking a moving image, a function of automatically or manually correcting a taken image, a function of storing a taken image in a recording medium (an external recording medium or a recording medium incorporated in the camera), a function of displaying a taken image on the display portion, and the like. Note that functions that the electronic devices shown in FIG. 6A to FIG. 6F can have are not limited to those, and the electronic devices can have a variety of functions.

Figure 6G:
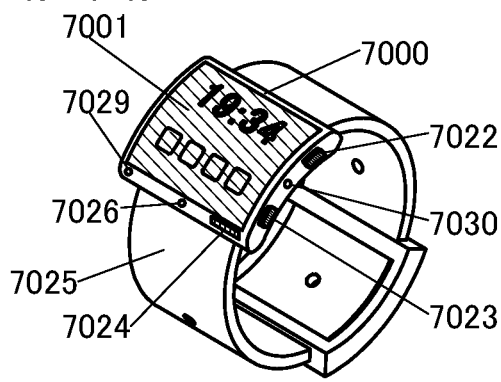
FIG. 6G is a diagram illustrating a portable information terminal.

FIG. 6G shows a watch-type portable information terminal that can be used as a smartwatch, for example. The watch-type portable information terminal includes the housing 7000, the display portion 7001, operation buttons 7022 and 7023, a connection terminal 7024, a band 7025, a microphone 7026, a sensor 7029, a speaker 7030, and the like. The display surface of the display portion 7001 is bent, and display can be performed along the bent display surface. The portable information terminal enables hands-free calling by mutually communicating with, for example, a headset capable of wireless communication. Note that with the connection terminal 7024, the portable information terminal can perform mutual data transmission with another information terminal and be charged. Wireless power feeding can also be employed for the charging operation.

The display portion 7001 mounted in the housing 7000 also serving as a bezel includes a non-rectangular display region. The display portion 7001 can display an icon indicating the time, another icon, and the like. The display portion 7001 may be a touch panel (an input/output device) including a touch sensor (an input device).

Note that the smartwatch shown in FIG. 6G can have a variety of functions. For example, it can have a function of displaying a variety of information (e.g., a still image, a moving image, and a text image) on the display portion, a touch panel function, a function of displaying a calendar, the date, the time, or the like, a function of controlling processing with a variety of software (programs), a wireless communication function, a function of being connected to a variety of computer networks with a wireless communication function, a function of transmitting and receiving a variety of data with a wireless communication function, and a function of reading out a program or data stored in a recording medium and displaying it on the display portion.

Moreover, a speaker, a sensor (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), a microphone, and the like can be included inside the housing 7000.

Note that the light-emitting apparatus of one embodiment of the present invention can be used in the display portions of the electronic devices described in this embodiment, enabling the electronic devices to have a long lifetime.

Figure 7A:
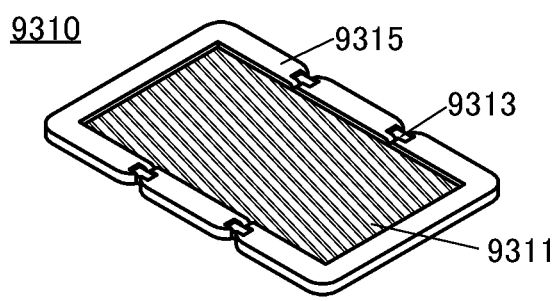
FIG. 7A, FIG. 7B, and FIG. 7C are diagrams illustrating an electronic device.
Figure 7B:
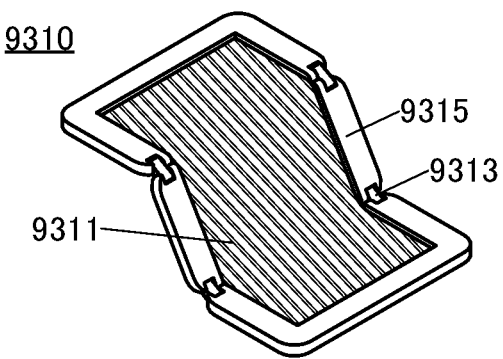
Figure 7C:
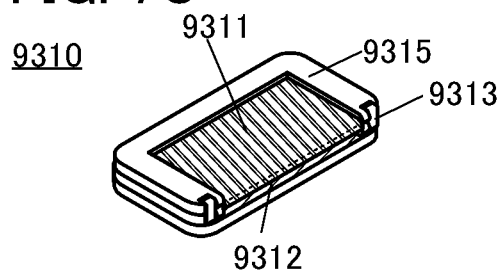

Another electronic device including the light-emitting apparatus is a foldable portable information terminal shown in FIG. 7A to FIG. 7C. FIG. 7A shows a portable information terminal 9310 in an opened state. FIG. 7B shows the portable information terminal 9310 in a state in the middle of change from one of an opened state and a folded state to the other. FIG. 7C shows the portable information terminal 9310 in a folded state. The portable information terminal 9310 is excellent in portability when in a folded state, and is excellent in display browsability when in an opened state because of a seamless large display region.

A display portion 9311 is supported by three housings 9315 joined together by hinges 9313. Note that the display portion 9311 may be a touch panel (an input/output device) including a touch sensor (an input device). By bending the display portion 9311 at a portion between two housings 9315 with the use of the hinges 9313, the portable information terminal 9310 can be reversibly changed in shape from an opened state to a folded state. Note that the light-emitting apparatus of one embodiment of the present invention can be used in the display portion 9311. An electronic device having along lifetime can be provided. A display region 9312 in the display portion 9311 is a display region that is positioned at a side surface of the portable information terminal 9310 in a folded state. On the display region 9312, information icons, file shortcuts of frequently used applications and programs, and the like can be displayed; hence, confirmation of information and start of an application can be smoothly performed.

Figure 8A:
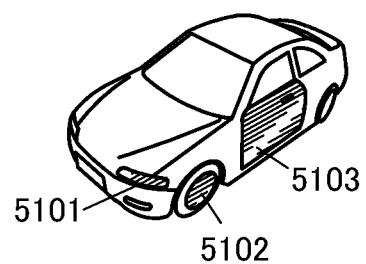
FIG. 8A and FIG. 8B are diagrams illustrating an automobile.
Figure 8B:
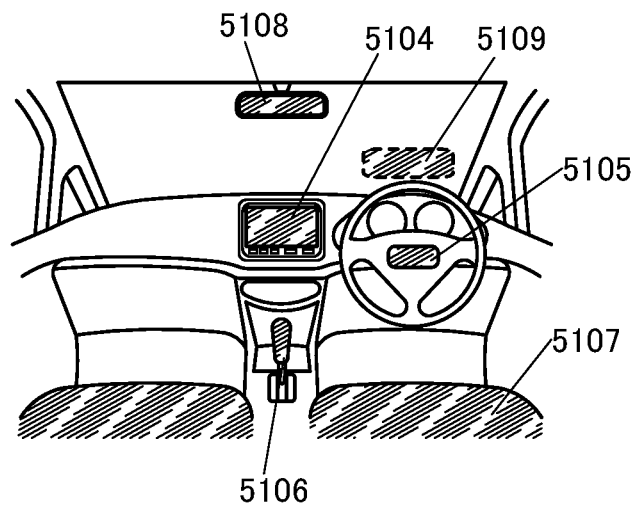

FIG. 8A and FIG. 8B show an automobile including the light-emitting apparatus. In other words, the light-emitting apparatus can be integrated into an automobile. Specifically, the light-emitting apparatus can be applied to lights 5101 (including lights of the rear part of the car), a wheel 5102, a part or the whole of a door 5103, or the like on the outer side of the automobile shown in FIG. 8A. The light-emitting apparatus can also be applied to a display portion 5104, a steering wheel 5105, a shifter 5106, a seat 5107, an inner rearview mirror 5108, a windshield 5109, or the like on the inner side of the automobile shown in FIG. 8B. The light-emitting apparatus may be applied to part of any of the other glass windows.

In the above manner, the electronic devices and the automobile each including the light-emitting apparatus of one embodiment of the present invention can be obtained. Note that in that case, a long-lifetime electronic device can be obtained. In addition, the light-emitting apparatus can be used for electronic devices and automobiles in a variety of fields without being limited to those described in this embodiment.

Note that the structure described in this embodiment can be used in an appropriate combination with any of the structures described in the other embodiments.

Embodiment 6

In this embodiment, a structure of a lighting device fabricated using the light-emitting apparatus of one embodiment of the present invention or the light-emitting device which is part of the light-emitting apparatus is described with reference to FIG. 9.

Figure 9A:
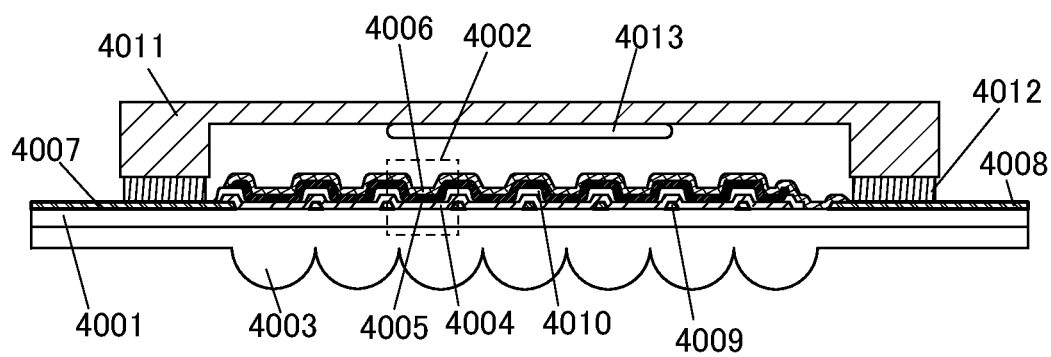
FIG. 9A and FIG. 9B are diagrams illustrating lighting devices.
Figure 9B:
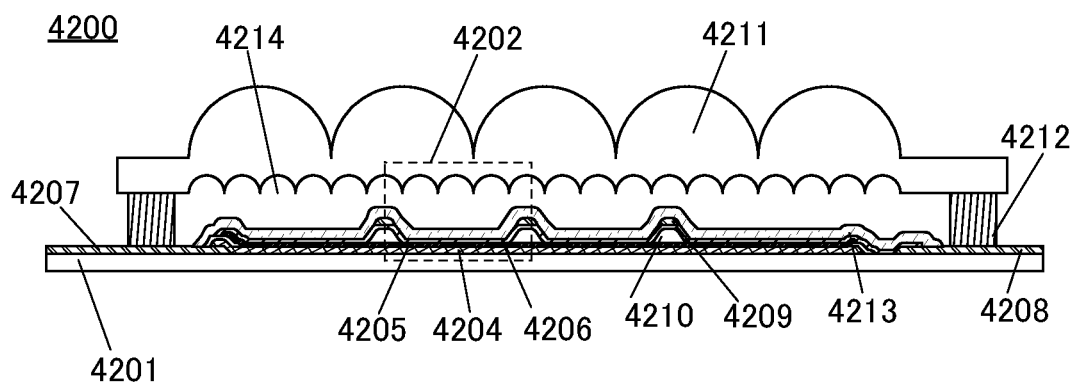

FIG. 9A and FIG. 9B show examples of cross-sectional views of lighting devices. FIG. 9A shows a bottom-emission lighting device in which light is extracted from the substrate side, and FIG. 9B shows a top-emission lighting device in which light is extracted from the sealing substrate side.

A lighting device 4000 shown in FIG. 9A includes a light-emitting device 4002 over a substrate 4001. In addition, the lighting device 4000 includes a substrate 4003 with unevenness on the outer side of the substrate 4001. The light-emitting device 4002 includes a first electrode 4004, an EL layer 4005, and a second electrode 4006.

The first electrode 4004 is electrically connected to an electrode 4007, and the second electrode 4006 is electrically connected to an electrode 4008. An auxiliary wiring 4009 electrically connected to the first electrode 4004 may be provided. Note that an insulating layer 4010 is formed over the auxiliary wiring 4009.

The substrate 4001 and a sealing substrate 4011 are bonded to each other with a sealant 4012. A desiccant 4013 is preferably provided between the sealing substrate 4011 and the light-emitting device 4002. Note that since the substrate 4003 has the unevenness shown in FIG. 9A, the extraction efficiency of light generated in the light-emitting device 4002 can be increased.

A lighting device 4200 in FIG. 9B includes a light-emitting device 4202 over a substrate 4201. The light-emitting device 4202 includes a first electrode 4204, an EL layer 4205, and a second electrode 4206.

The first electrode 4204 is electrically connected to an electrode 4207, and the second electrode 4206 is electrically connected to an electrode 4208. An auxiliary wiring 4209 electrically connected to the second electrode 4206 may be provided. An insulating layer 4210 may be provided under the auxiliary wiring 4209.

The substrate 4201 and a sealing substrate 4211 with unevenness are bonded to each other with a sealant 4212. A barrier film 4213 and a planarization film 4214 may be provided between the sealing substrate 4211 and the light-emitting device 4202. Note that since the sealing substrate 4211 has the unevenness shown in FIG. 9B, the extraction efficiency of light generated in the light-emitting device 4202 can be increased.

Application examples of such lighting devices include ceiling lights for indoor lighting. Examples of the ceiling lights include a ceiling direct mount light and a ceiling embedded light. Note that such a lighting device is fabricated using the light-emitting apparatus and a housing or a cover in combination.

As another example, such lighting devices can be used for a foot light that illuminates a floor so that safety on the floor can be improved. The foot light can be effectively used in a bedroom, on a staircase, or on a passage, for example. In such a case, the size and shape can be changed depending on the area or structure of a room. A stationary lighting device fabricated using the light-emitting apparatus and a support base in combination can also be provided.

Such lighting devices can also be used for a sheet-like lighting device (sheet-like lighting). The sheet-like lighting, which is attached to a wall when used, is space-saving and thus can be used for a wide variety of applications. Note that the area of the sheet-like lighting can be easily increased. Note that the sheet-like lighting can also be used on a wall and a housing that have a curved surface.

Note that besides the above examples, the light-emitting apparatus of one embodiment of the present invention or the light-emitting device which is a part of the light-emitting apparatus can be used as part of furniture in a room, whereby a lighting device that has a function of the furniture can be obtained.

As described above, a variety of lighting devices that include the light-emitting apparatus can be obtained. Note that these lighting devices are also embodiments of the present invention.

The structures described in this embodiment can be used in an appropriate combination with any of the structures described in the other embodiments.

Example 1

In this example, a light-emitting device 1 including 9-(1-naphthyl)-10-[4-(2-naphthyl)phenyl]anthracene (abbreviation: αN-βNPAnth) as a host material of a light-emitting layer and 2-phenyl-3-{4-[10-(3-pyridyl)-9-anthryl]phenyl}quinoxaline (abbreviation: PyA1PQ) and Liq as electron-transport materials of an electron-transport layer is described as a light-emitting device of one embodiment of the present invention. Note that in the light-emitting device 1, the difference in LUMO level between the host material (αN-βNPAnth) of the light-emitting layer and the electron-transport material (PyA1PQ) of the electron-transport layer is 0.26 eV. A comparative light-emitting device 2 fabricated as a light-emitting device for comparison includes αN-βNPAnth as a host material of a light-emitting layer and 2-{4-[9,10-di(naphthalen-2-yl)-2-anthryl]phenyl}-1-phenyl-1H-benzimidazole (abbreviation: ZADN) as an electron-transport material of an electron-transport layer, and the difference in LUMO level between the host material (αN-βNPAnth) of the light-emitting layer and the electron-transport material (ZADN) of the electron-transport layer is 0.13 eV in the comparative light-emitting device 2.

Figure 15:
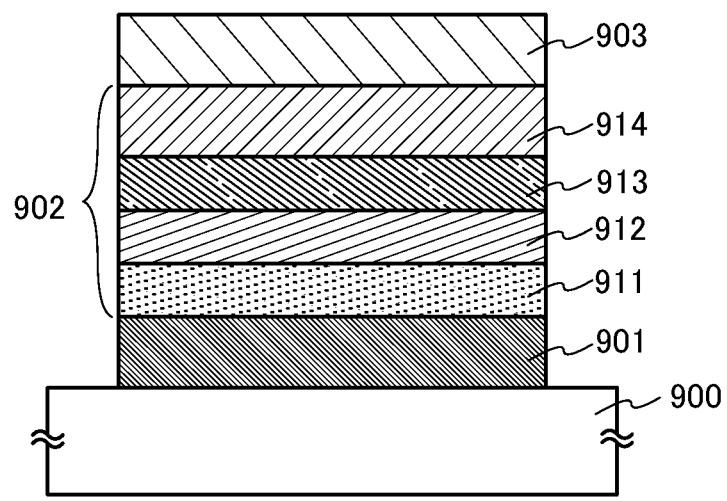
FIG. 15 is a diagram illustrating a light-emitting device.

The element structures, fabrication methods, and characteristics of these light-emitting devices are described below. Note that FIG. 15 shows the element structure of the light-emitting devices used in this example, and Table 4 shows specific compositions. The chemical formulae of the materials used in this example are shown below.

TABLE 4

| | First electrode | Hole-injection layer | Hole-transport layer | Light-emitting layer | Electron-transport layer | | Second electrode |
|---|---|---|---|---|---|---|---|
| Light-emitting device 1 | ITSO (70 nm) | BBABnf:ALD-MP001Q (1:0.1 10 nm) | BBABnf (20 nm) | PCzN2 (10 nm) | * | PyA1PQ:Liq (1:2 12.5 nm) | PyA1PQ:Liq (2:1 12.5 nm) | Al (200 nm) |
| Comparative light-emitting device 2 | ITSO (70 nm) | BBABnf:ALD-MP001Q (1:0.1 10 nm) | BBABnf (20 nm) | PCzN2 (10 nm) | * | ZADN:Liq (1:2 12.5 nm) | ZADN:Liq (2:1 12.5 nm) | Al (200 nm) |

*αN-βNP Anth:3, 10PCA2Nbf(IV)-02 (1:0.015 25 nm)

[Chemical Formula 7]
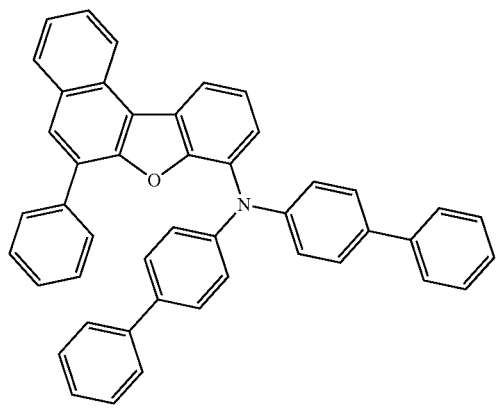
BBABnf
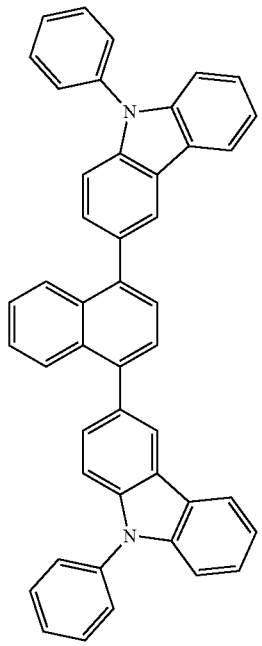
PCzN2
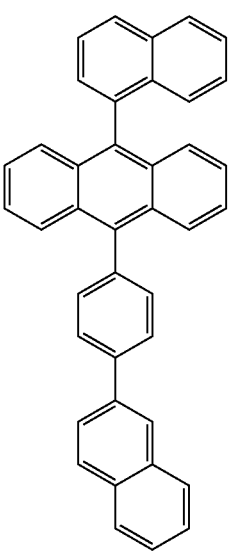
α N-β NPAnth
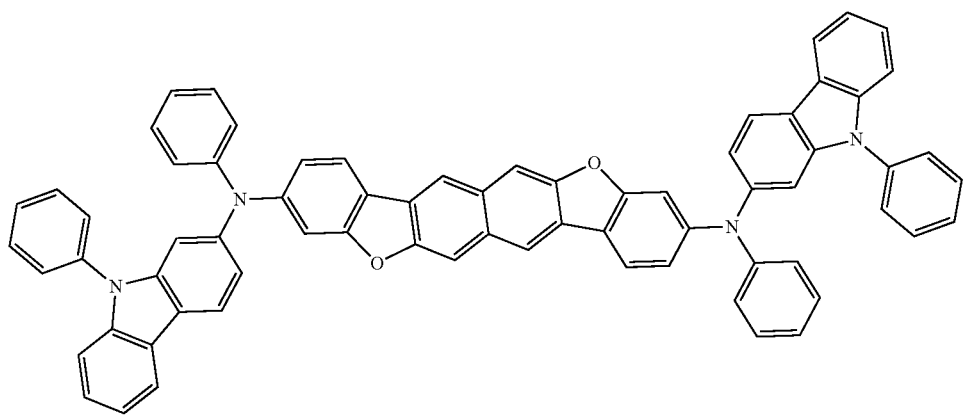
3,10PCA2Nbf(IV)-02
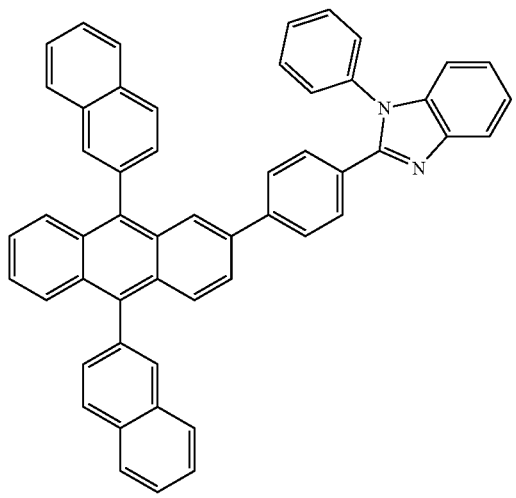
ZADN
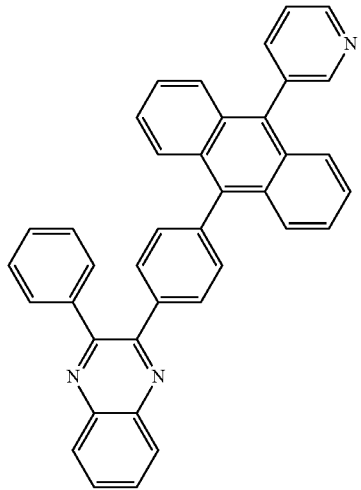
PyA1PQ
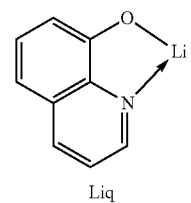
Liq <<Fabrication of Light-Emitting Devices>>

The light-emitting devices described in this example each have a structure in which a hole-injection layer 911, a hole-transport layer 912, a light-emitting layer 913, and an electron-transport layer 914 forming an EL layer 902 are stacked in this order over a first electrode 901 formed over a substrate 900, and a second electrode 903 is stacked over the electron-transport layer 914, as shown in FIG. 15.

First, the first electrode 901 was formed over the substrate 900. The electrode area was set to 4 mm² (2 mm×2 mm). A glass substrate was used as the substrate 900. The first electrode 901 was formed to a thickness of 70 nm using indium tin oxide containing silicon oxide (ITSO) by a sputtering method.

Here, as pretreatment, a surface of the substrate was washed with water, baking was performed at 200° C. for 1 hour, and then UV ozone treatment was performed for 370 seconds. After that, the substrate was transferred into a vacuum evaporation apparatus in which the pressure was reduced to approximately $1\times10^{-4}$ Pa, vacuum baking at 170° C. for 30 minutes was performed in a heating chamber in the vacuum evaporation apparatus, and then the substrate was allowed to cool down for approximately 30 minutes.

Next, the hole-injection layer 911 was formed over the first electrode 901. The hole-injection layer 911 was formed in such a manner that after the pressure in the vacuum evaporation apparatus was reduced to $1\times10^{-4}$ Pa, N,N'-bis (4-biphenyl)-6-phenylbenzo[b]naphtho[1,2-d]furan-8-amine (abbreviation: BBABnf) and ALD-MP001Q (Analysis Atelier Corporation, material serial No. 1S20180314) were co-evaporated in a weight ratio of 1:0.1 (=BBABnf: ALD-MP001Q) to have a thickness of 10 nm.

Then, the hole-transport layer 912 was formed over the hole-injection layer 911. The hole-transport layer 912 of the light-emitting devices described in this example has a stacked-layer structure of a first hole-transport layer 912-1 and a second hole-transport layer 912-2. As the first hole-transport layer 912-1, BBABnf was deposited by evaporation to a thickness of 20 nm, and then, as the second hole-transport layer 912-2, 3,3'-(naphthalene-1,4-diyl)bis(9-phenyl-9H-carbazole (abbreviation: PCzN2) was deposited by evaporation to a thickness of 10 nm, whereby the hole-transport layer 912 was formed. Note that the second hole-transport layer 912-2 also functions as an electron-blocking layer.

Next, the light-emitting layer 913 was formed over the hole-transport layer 912.

As the light-emitting layer 913, αN-βNPAnth and 3,10-bis[N-(9-phenyl-9H-carbazol-2-yl)-N-phenylamino]naph-tho[2,3-b;6,7-b']bisbenzofuran (abbreviation: 3,10PCA2Nbf (IV)-02) were deposited by co-evaporation in a weight ratio of 1:0.015 (=αN-βNPAnth: 3,10PCA2Nbf(IV)-02). The thickness was set to 25 nm.

Next, the electron-transport layer 914 was formed over the light-emitting layer 913. The electron-transport layer 914 was formed by an evaporation method using resistance heating. The electron-transport layer 914 of the light-emitting devices described in this example has a stacked-layer structure of a first electron-transport layer 914-1 and a second electron-transport layer 914-2.

In the case of the light-emitting device 1, to form the electron-transport layer 914, 2-phenyl-3-{4-[10-(3-pyridyl)-9-anthryl]phenyl}quinoxaline (abbreviation: PyA1PQ) and 8-hydroxyquinolinato lithium (abbreviation: Liq) were deposited by co-evaporation in a weight ratio of 1:2 (=PyA1PQ: Liq) to a thickness of 12.5 nm as the first electron-transport layer 914-1, and PyA1PQ and Liq were then deposited by co-evaporation in a weight ratio of 2:1 (=PyA1PQ: Liq) to a thickness of 12.5 nm as the second electron-transport layer 914-2.

In the case of the light-emitting device 2, to form the electron-transport layer 914, 2-{4-[9,10-di(naphthalen-2-yl)-2-anthryl]phenyl}-1-phenyl-1H-benzimidazole (abbreviation: ZADN) and Liq were deposited by co-evaporation in a weight ratio of 1:2 (=ZADN: Liq) to a thickness of 12.5 nm as the first electron-transport layer 914-1, and ZADN and Liq were then deposited by co-evaporation in a weight ratio of 2:1 (=ZADN: Liq) to a thickness of 12.5 nm as the second electron-transport layer 914-2.

Next, the second electrode 903 was formed over the electron-transport layer 914. The second electrode 903 was formed to a thickness of 200 nm by an evaporation method using aluminum. Note that in this example, the second electrode 903 functions as a cathode.

Through the above steps, the light-emitting devices in each of which an EL layer was provided between the pair of electrodes over the substrate 900 were formed. Note that the hole-injection layer 911, the hole-transport layer 912, the light-emitting layer 913, and the electron-transport layer 914 described in the above steps are functional layers forming the EL layer in one embodiment of the present invention. Note that an electron-injection layer 915, the charge-generation layer, or the like described in this specification may be provided as needed. In all the evaporation steps in the above fabrication method, an evaporation method by a resistance-heating method was used.

The light-emitting devices fabricated as described above were sealed using a different substrate (not shown). At the time of the sealing using the different substrate (not shown), the different substrate (not shown) coated with a sealant that solidifies by ultraviolet light was fixed onto the substrate 900 in a glove box containing a nitrogen atmosphere, and the substrates were bonded to each other such that the sealant would be attached to the periphery of the light-emitting device formed over the substrate 900. At the time of the sealing, the sealant was irradiated with 365-nm ultraviolet light at 6 J/cm² to be solidified, and heat treatment was performed at 80° C. for 1 hour to stabilize the sealant.

<<Operation Characteristics of Light-Emitting Devices>>

Figure 16:
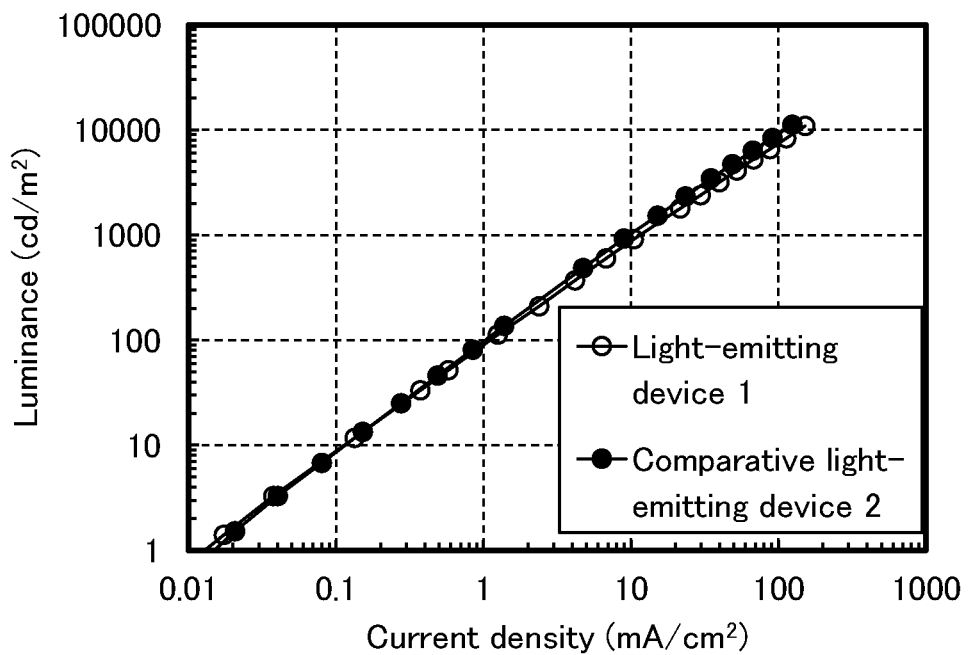
FIG. 16 is a diagram showing current density-luminance characteristics of a light-emitting device 1 and a comparative light-emitting device 2.
Figure 17:
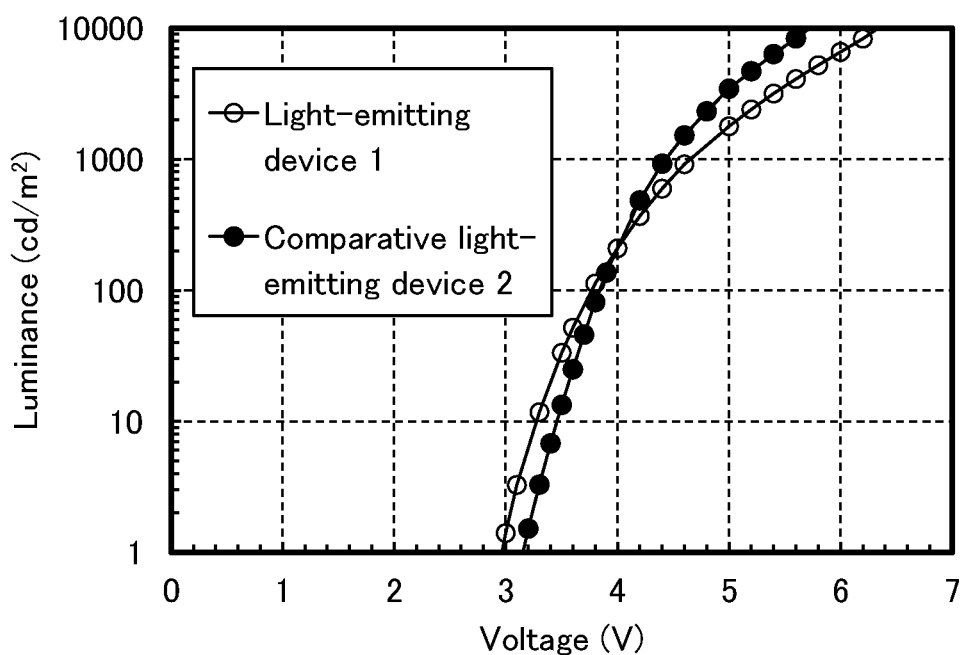
FIG. 17 is a diagram showing voltage-luminance characteristics of the light-emitting device 1 and the comparative light-emitting device 2.
Figure 18:
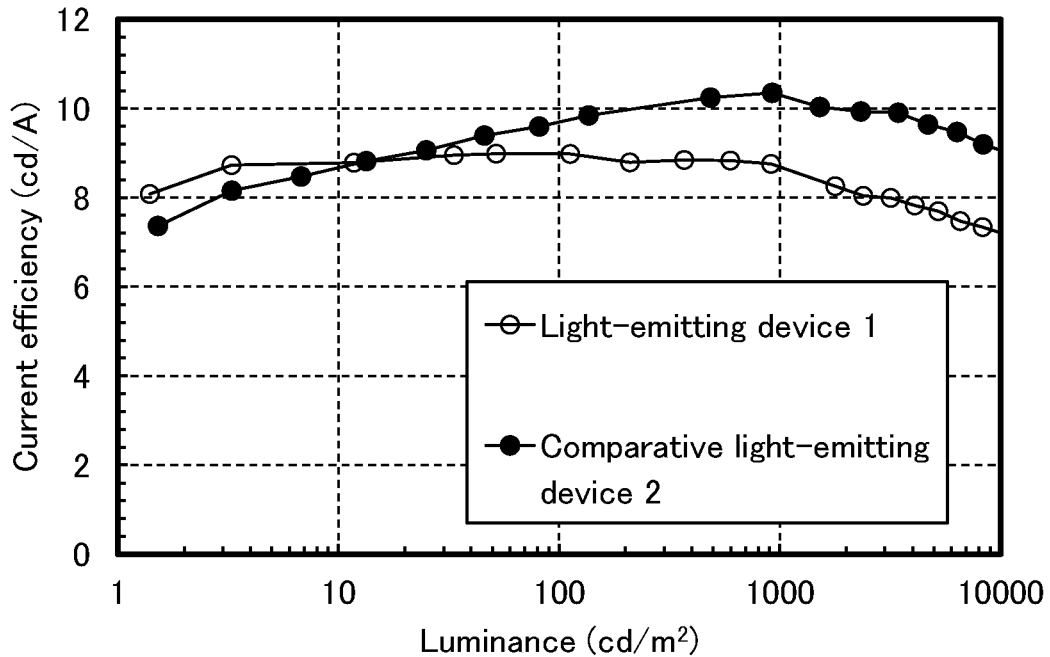
FIG. 18 is a diagram showing luminance-current efficiency characteristics of the light-emitting device 1 and the comparative light-emitting device 2.
Figure 19:
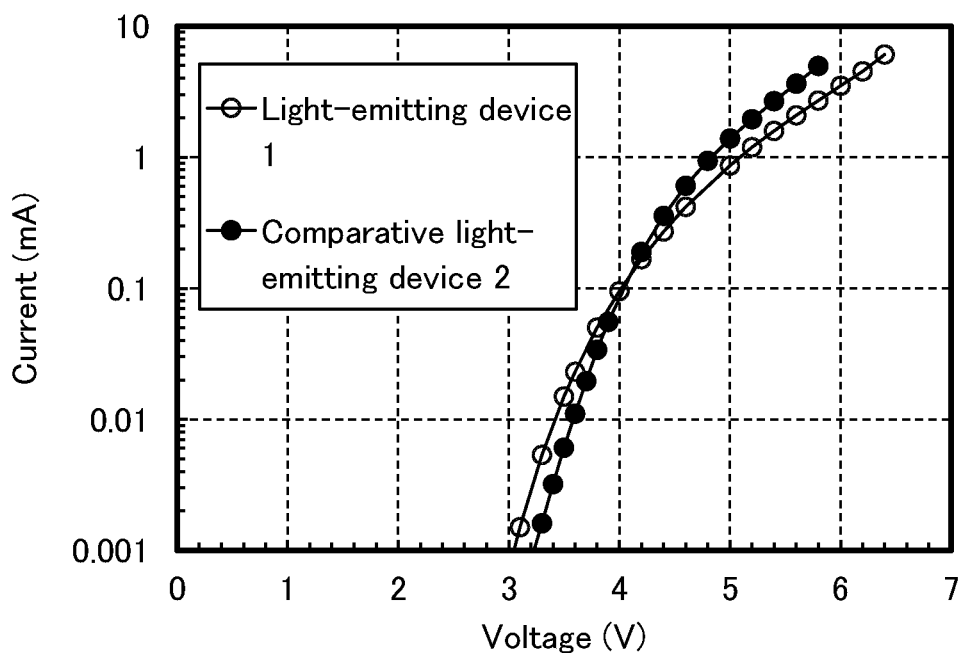
FIG. 19 is a diagram showing voltage-current characteristics of the light-emitting device 1 and the comparative light-emitting device 2.
Figure 20:
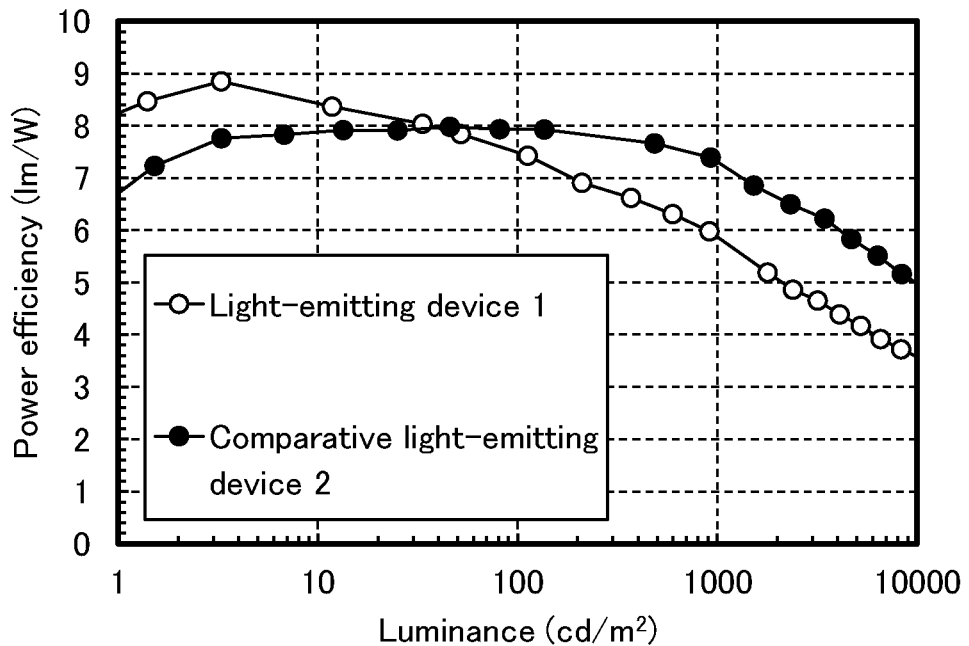
FIG. 20 is a diagram showing luminance-power efficiency characteristics of the light-emitting device 1 and the comparative light-emitting device 2.
Figure 21:
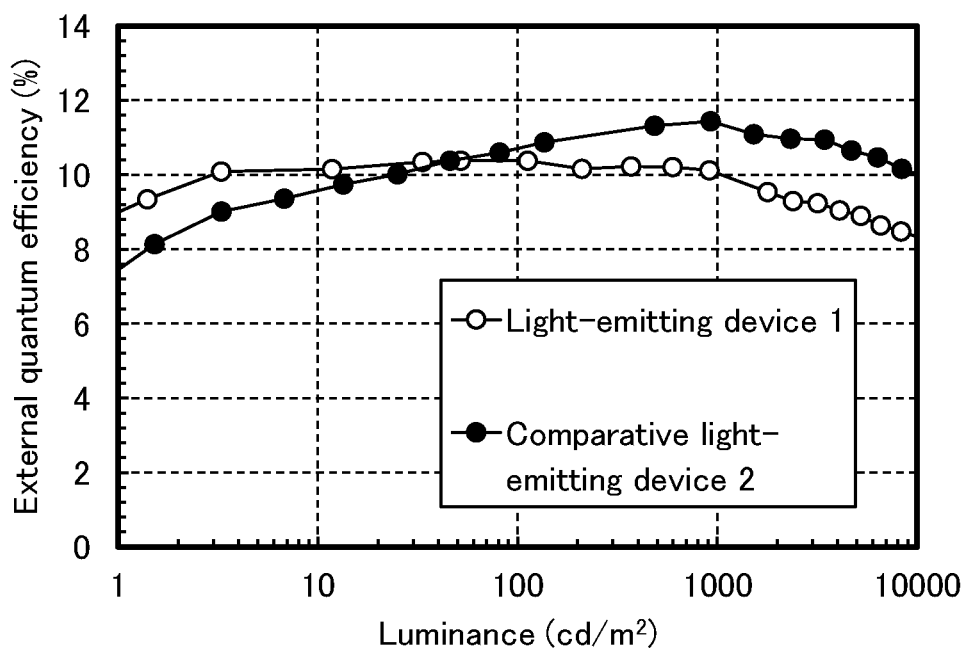
FIG. 21 is a diagram showing luminance-external quantum efficiency characteristics of the light-emitting device 1 and the comparative light-emitting device 2.

Operation characteristics of each of the fabricated light-emitting devices were measured. Note that the measurement was carried out at room temperature (an atmosphere maintained at 25° C.). As the results of the operation characteristics of the light-emitting devices, the current density-luminance characteristics are shown in FIG. 16, the voltage-luminance characteristics are shown in FIG. 17, the luminance-current efficiency characteristics are shown in FIG. 18, the voltage-current characteristics are shown in FIG. 19, the luminance-power efficiency characteristics are shown in FIG. 20, and the luminance-external quantum efficiency characteristics are shown in FIG. 21.

Table 5 below shows the initial values of the main characteristics of each of the light-emitting devices at around 1000 cd/m2.

TABLE 5

|  | Voltage (V) | Current (mA) | Current density (mA/cm$^2$) | Chromaticity (x, y) | Luminance (cd/m$^2$) | Current efficiency (cd/A) | Power efficiency (lm/W) | External quantum efficiency (%) |
|---|---|---|---|---|---|---|---|---|
| Light-emitting device 1 | 4.6 | 0.42 | 10 | (0.14, 0.10) | 910 | 8.8 | 6.0 | 10 |
| Comparative light-emitting device 2 | 4.4 | 0.36 | 8.9 | (0.14, 0.11) | 920 | 10 | 7.4 | 11 |

Figure 22:
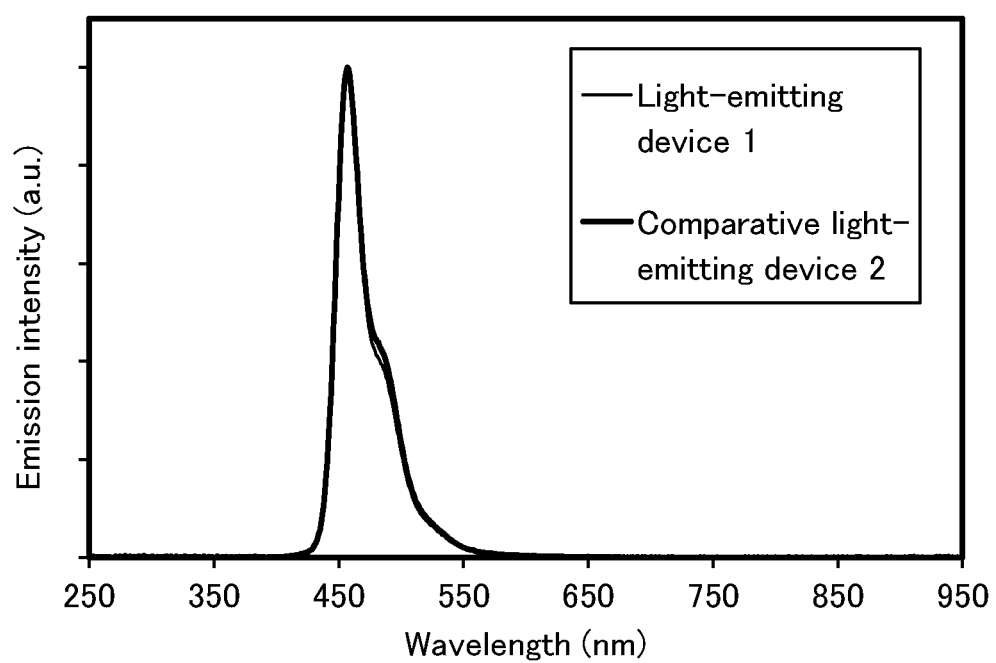
FIG. 22 is a diagram showing emission spectra of the light-emitting device 1 and the comparative light-emitting device 2.

FIG. 22 shows the emission spectra when a current at a current density of 12.5 mA/cm$^2$ was supplied to the light-emitting devices. As shown in FIG. 22, the emission spectrum of each light-emitting device has a peak at around 457 nm, suggesting that each peak is derived from light emission of 3,10PCA2Nbf(IV)-02 contained in the light-emitting layer 913.

The results shown in FIG. 16 to FIG. 21 and Table 5 showed that the light-emitting device 1 of one embodiment of the present invention including αN-βNPAnth as the host material in the light-emitting layer 913 and PyA1PQ and Liq as the electron-transport materials in the electron-transport layer 914 has more favorable current-voltage characteristics, more favorable power efficiency, and more favorable emission efficiency than the comparative light-emitting device 2. It was also shown that the emission characteristics bear comparison with those of the comparative light-emitting device 2.

Figure 23:
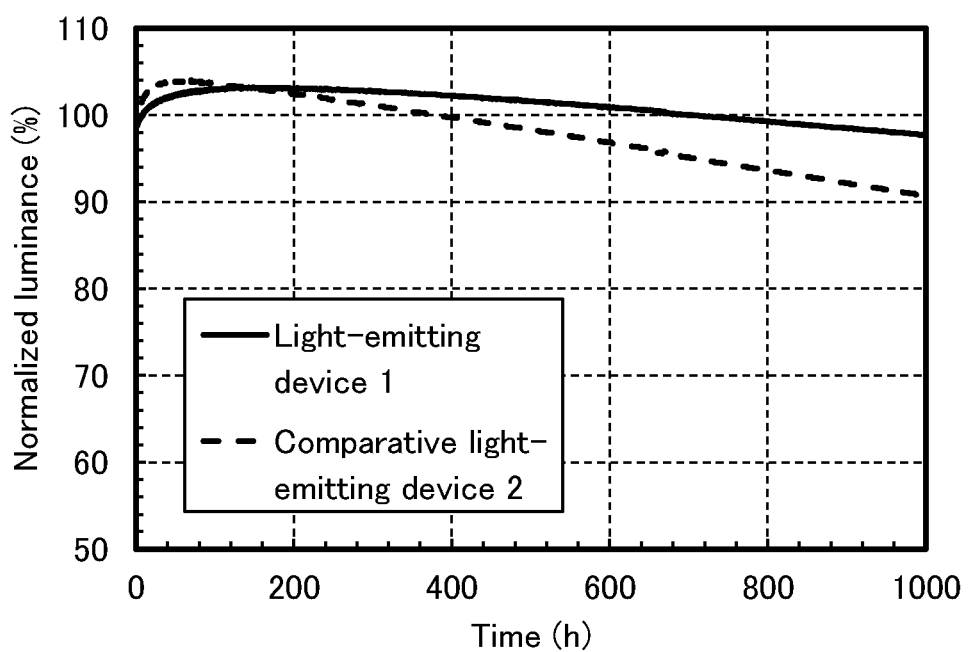
FIG. 23 is a diagram showing reliability of the light-emitting device 1 and the comparative light-emitting device 2.

FIG. 23 is a graph showing a change in luminance over driving time when each element was driven at a constant current density (50 mA/cm$^2$). As shown in FIG. 23, the light-emitting device 1 of one embodiment of the present invention was found to be a light-emitting device with a favorable lifetime with a small reduction in luminance over the accumulated driving time. This was probably caused for the following reason: the difference in LUMO level between αN-βNPAnth used as the host material in the light-emitting layer 913 and PyA1PQ used as the electron-transport material in the electron-transport layer 914 was as large as 0.26 eV and thus, the electron-injection barrier at the interface between the light-emitting layer 913 and the electron-transport layer 914 stacked was high, which inhibited the electrons injected from the cathode side into the light-emitting layer from reaching the hole-transport layer 912 and accordingly inhibited degradation of the hole-transport layer due to electron injection. By contrast, the luminance decreases more over the accumulated driving time in the comparative light-emitting device 2 than in the light-emitting device 1. In the comparative light-emitting device 2, ZADN used as the electron-transport material in the electron-transport layer 914 has a shallower LUMO level than PyA1PQ and the difference in LUMO level between ZADN and αN-βNPAnth used as the host material in the light-emitting layer 913 is only 0.13 eV. Thus, the electrons injected from the cathode side into the light-emitting layer probably easily reach the hole-transport layer 912, making the degradation of the hole-injection layer more noticeable.

Example 2

In this example, a light-emitting device 3 and a light-emitting device 4 are described which are different in the structure of the electron-transport layer in the EL layer included in the light-emitting device 1 described in Example 1 and each of which includes an electron-injection layer between an electron-transport layer and a second electrode. Note that the electron-transport layers of the light-emitting device 3 and the light-emitting device 4 each contain at least 2-[3'-(dibenzothiophen-4-yl)biphenyl-3-yl]dibenzo[f,h]quinoxaline (abbreviation: 2mDBTBPDBq-II) as an electron-transport material, 9-(1-naphthyl)-10-[4-(2-naphthyl)phenyl]anthracene (abbreviation: αN-βNPAnth) is used as the host material in the light-emitting layers, and the difference in LUMO level between the host material (αN-βNPAnth) in the light-emitting layer and the electron-transport material (2mDBTBPDBq-II) in the electron-transport layer is 0.20 eV in each of the light-emitting device 3 and the light-emitting device 4. The device structure of the light-emitting devices described in this example includes the electron-injection layer 915 between the electron-transport layer 914 and the second electrode 903 in addition to the structure in FIG. 15, and the fabrication method of the device structure is similar to that in Example 1.

The chemical formulae of the materials used in the light-emitting devices in this example are shown below. Specific structures of the light-emitting devices are shown in Table 6 below.

[Chemical Formula 8]
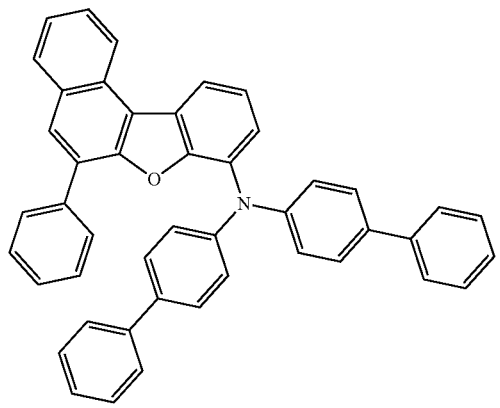
BBABnf
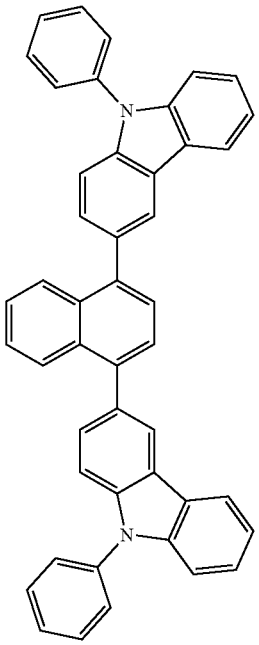
PCzN2
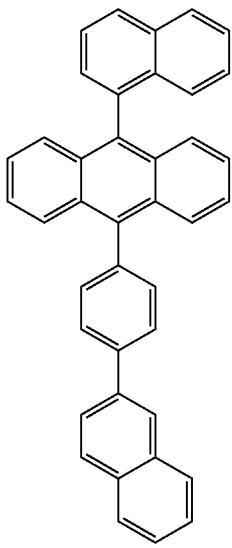
α N-β NPAnth
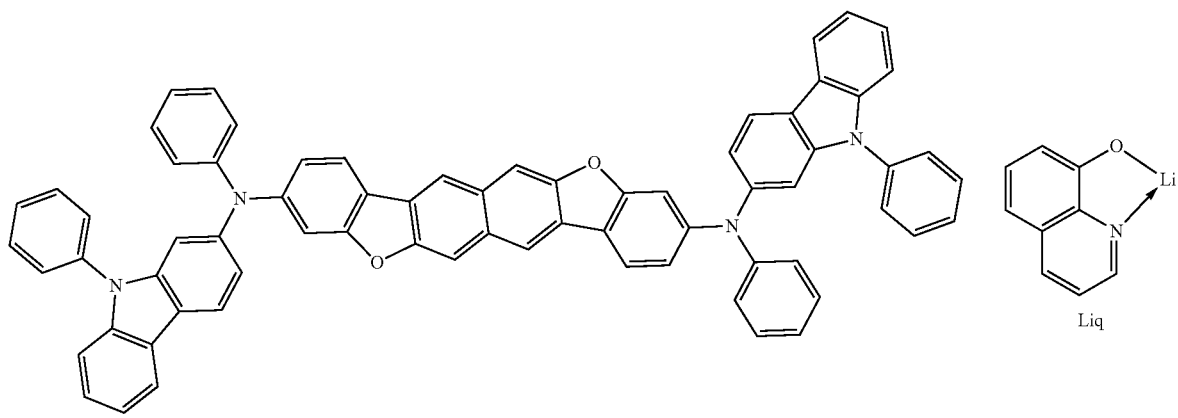
3,10PCA2Nbf(IV)-02
Liq

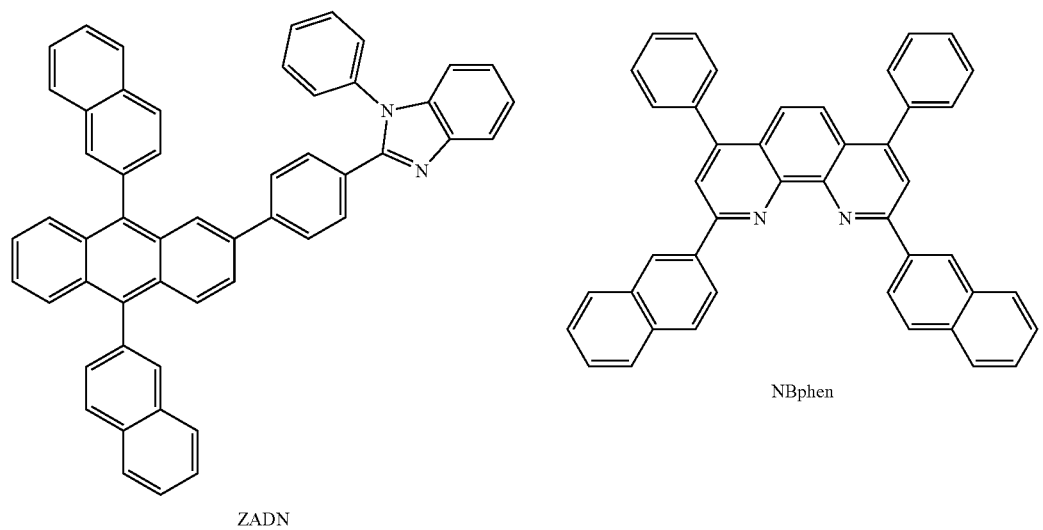

ZADN

NBphen

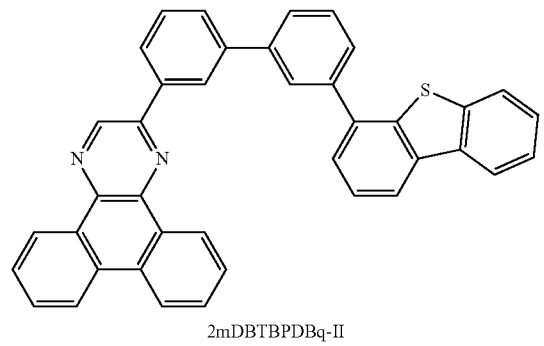

2mDBTBPDBq-II

TABLE 6

| | First electrode | Hole-injection layer | Hole-transport layer | Light-emitting layer | Electron-transport layer | Electron-injection layer | Second electrode |
|---|---|---|---|---|---|---|---|
| Light-emitting device 3 | ITSO (70 nm) | BBABnf:ALD-MP001Q (1:0.1 10 nm) | BBABnf (20 nm) | PCzN2 (10 nm) | * | 2mDBTBPDBq-II:Liq (1:2 15 nm) | NBphen (10 nm) | LiF (1 nm) | Al (200 nm) |
| Light-emitting device 4 | ITSO (70 nm) | BBABnf:ALD-MP001Q (1:0.1 10 nm) | BBABnf (20 nm) | PCzN2 (10 nm) | * | 2mDBTBPDBq-II:Liq (1:2 15 nm) | ZADN:Liq (1:1.5 10 nm) | LiF (1 nm) | Al (200 nm) |

*αN-βNP Anth:3, 10PCA2Nbf(IV)-02 (1:0.015 25 nm)

<<Operation Characteristics of Light-Emitting Devices>>

Figure 24:
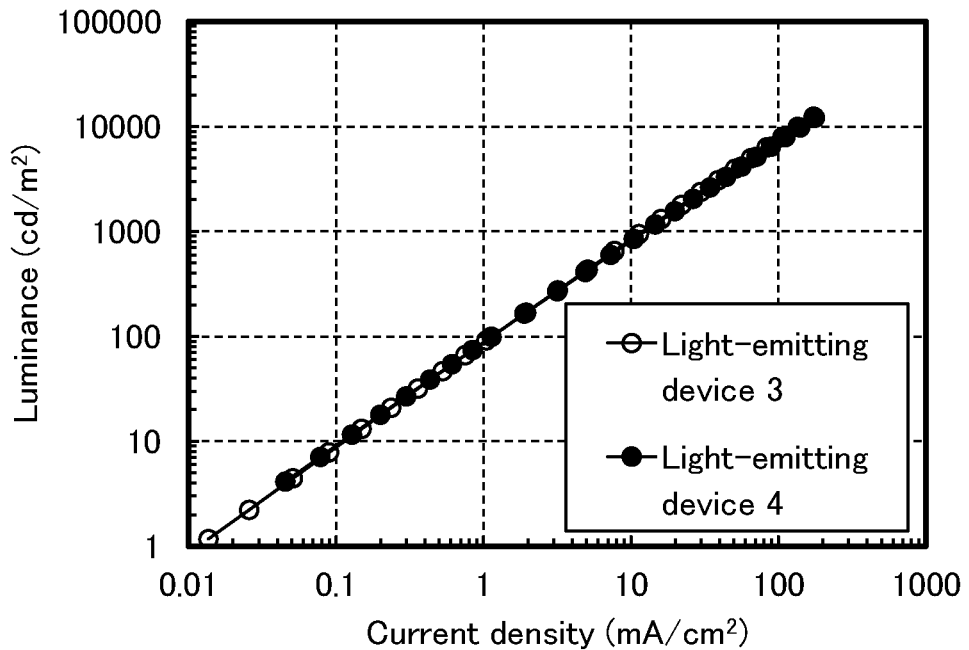
FIG. 24 is a diagram showing current density-luminance characteristics of a light-emitting device 3 and a light-emitting device 4.
Figure 25:
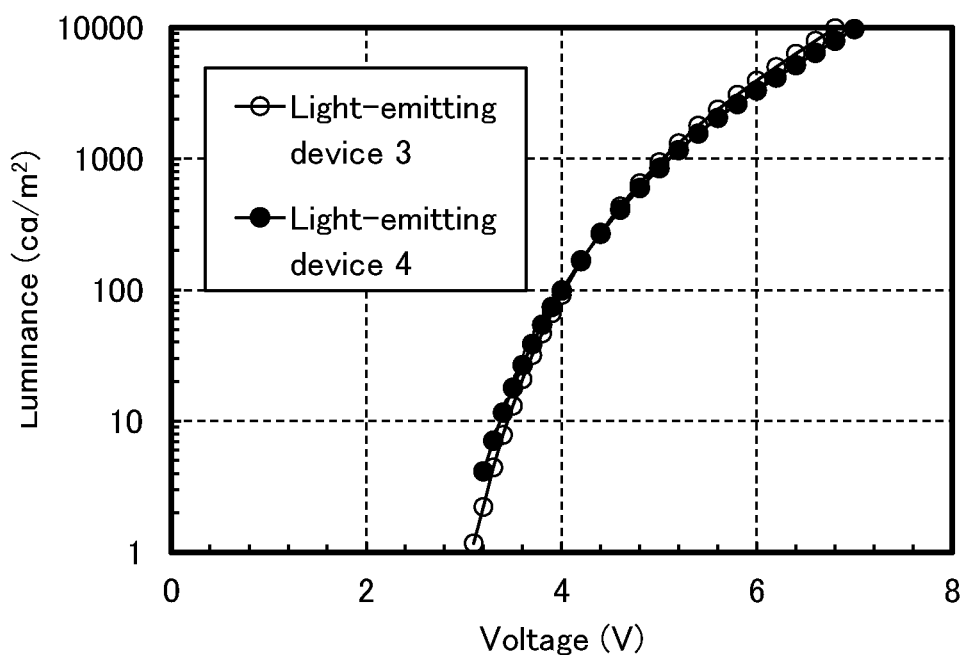
FIG. 25 is a diagram showing voltage-luminance characteristics of the light-emitting device 3 and the light-emitting device 4.
Figure 26:
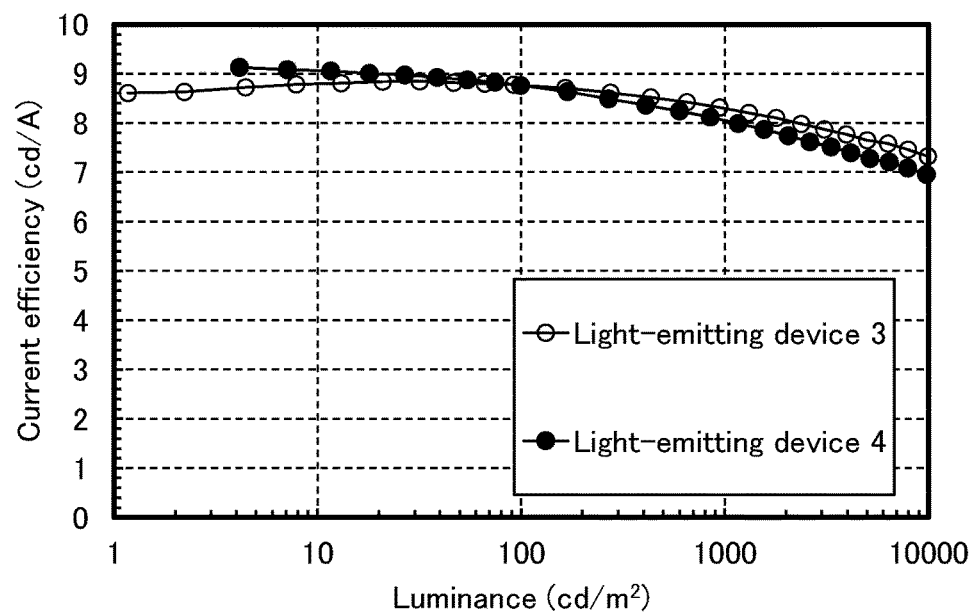
FIG. 26 is a diagram showing luminance-current efficiency characteristics of the light-emitting device 3 and the light-emitting device 4.
Figure 27:
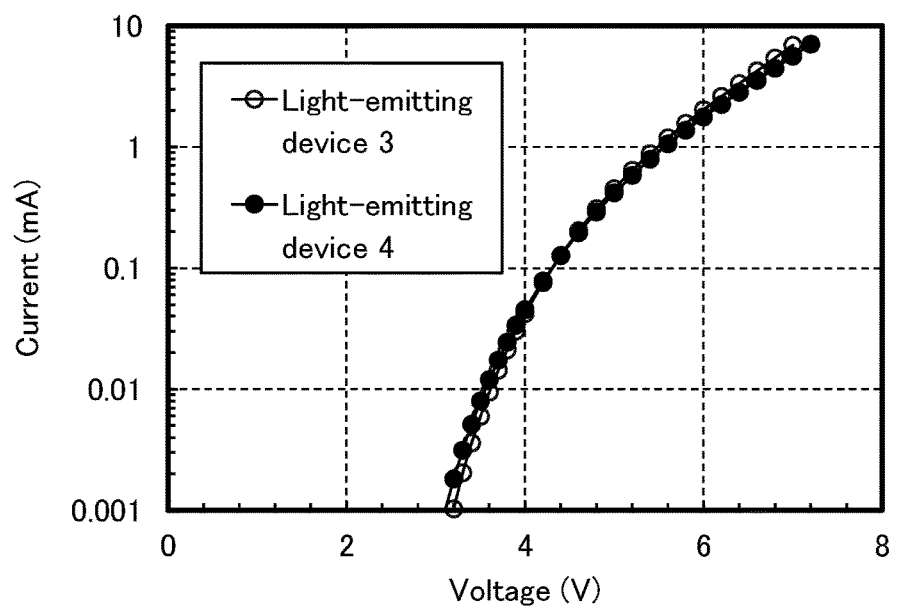
FIG. 27 is a diagram showing voltage-current characteristics of the light-emitting device 3 and the light-emitting device 4.
Figure 28:
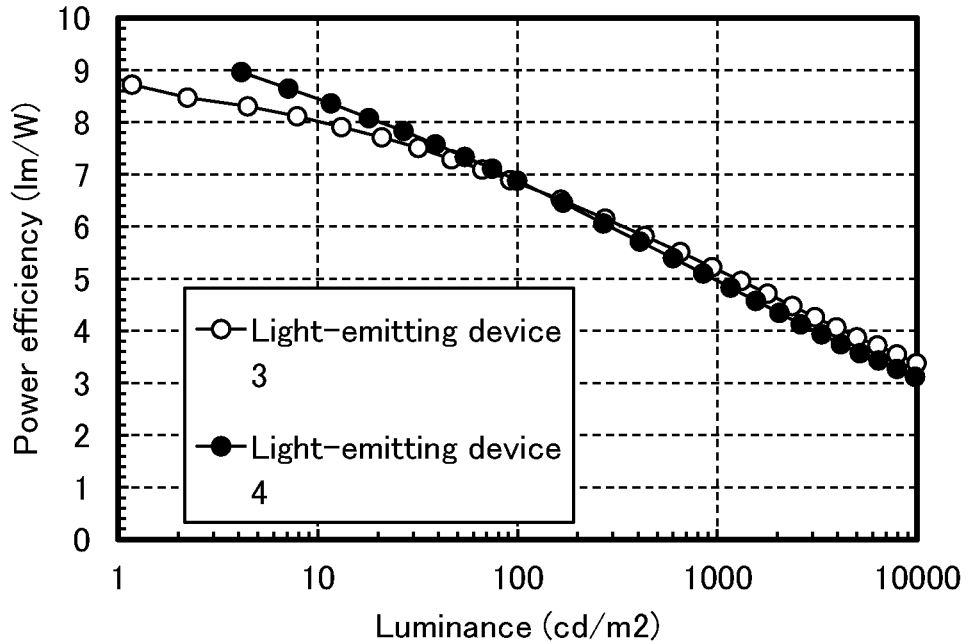
FIG. 28 is a diagram showing luminance-power efficiency characteristics of the light-emitting device 3 and the light-emitting device 4.
Figure 29:
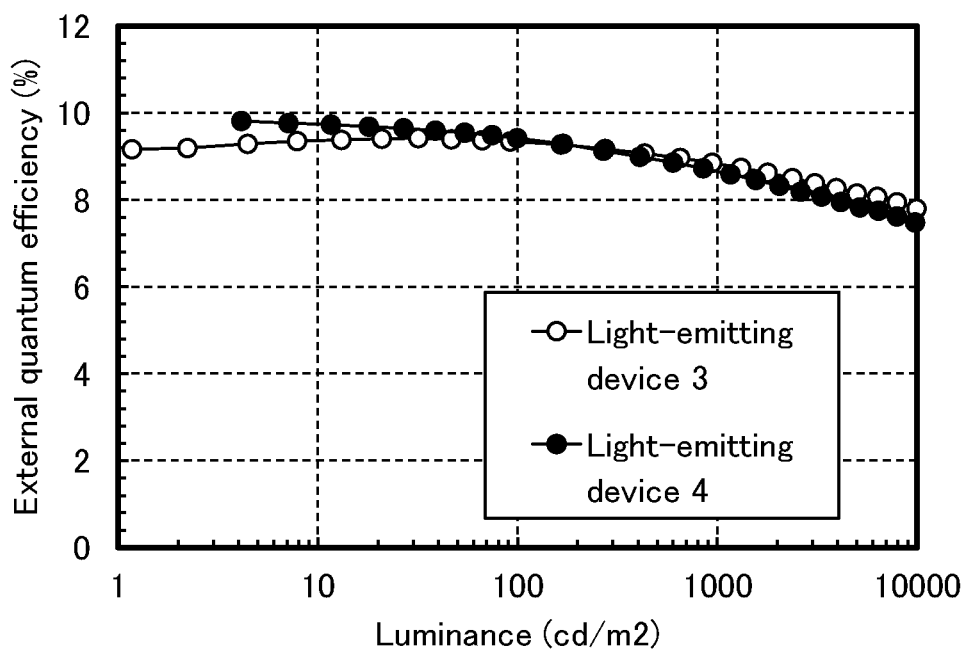
FIG. 29 is a diagram showing luminance-external quantum efficiency characteristics of the light-emitting device 3 and the light-emitting device 4.

Operation characteristics of each of the fabricated light-emitting devices were measured. Note that the measurement was carried out at room temperature (an atmosphere maintained at 25° C.). As the results of the operation characteristics of the light-emitting devices, the current density-luminance characteristics are shown in FIG. 24, the voltage-luminance characteristics are shown in FIG. 25, the luminance-current efficiency characteristics are shown in FIG. 26, the voltage-current characteristics are shown in FIG. 27, the luminance-power efficiency characteristics are shown in FIG. 28, and the luminance-external quantum efficiency characteristics are shown in FIG. 29.

Table 7 below shows the initial values of the main characteristics of each of the light-emitting devices at around 1000 cd/m$^2$.

TABLE 7

| | Voltage (V) | Current (mA) | Current density (mA/cm$^2$) | Chromaticity (x, y) | Luminance (cd/m$^2$) | Current efficiency (cd/A) | Power efficiency (lm/W) | External quantum efficiency (%) |
|---|---|---|---|---|---|---|---|---|
| Light-emitting device 3 | 5.0 | 0.45 | 11 | (0.14, 0.11) | 940 | 8.3 | 5.2 | 8.9 |
| Light-emitting device 4 | 5.0 | 0.42 | 10.0 | (0.14, 0.11) | 850 | 8.1 | 5.1 | 8.7 |

Figure 30:
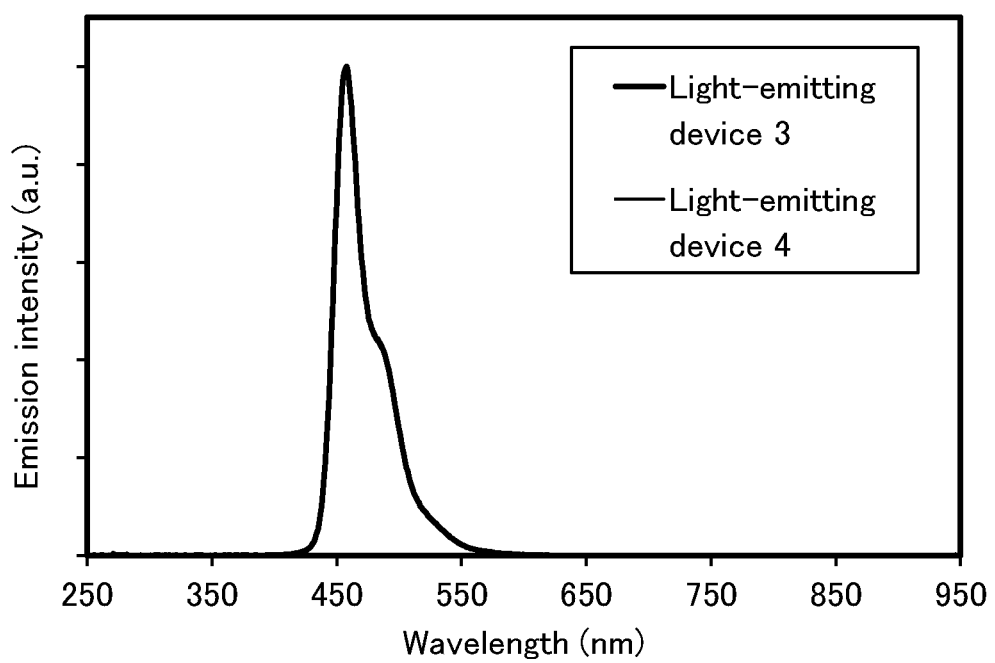
FIG. 30 is a diagram showing emission spectra of the light-emitting device 3 and the light-emitting device 4.

FIG. 30 shows the emission spectra at the time of applying the voltage that allows the light-emitting devices to achieve a luminance of 1000 cd/m$^2$. As shown in FIG. 30, the emission spectrum of each light-emitting device has a peak at around 458 nm, suggesting that each peak is derived from light emission of 3,10PCA2Nbf(IV)-02 contained in the light-emitting layer 913.

The results shown in FIG. 24 to FIG. 29 and Table 7 showed that the light-emitting device 3 and the light-emitting device 4 of embodiments of the present invention each including αN-βNPAnth as the host material in the light-emitting layer 913 and at least 2mDBTBPDBq-II as the electron-transport material in the electron-transport layer 914 have favorable current-voltage characteristics, favorable power efficiency, and favorable emission efficiency.

Figure 31:
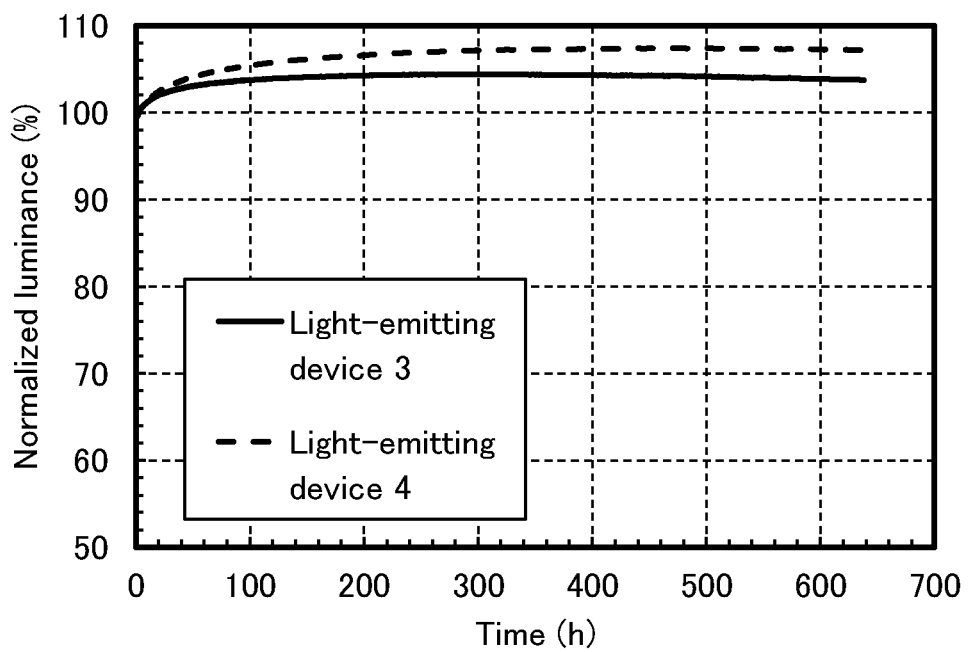
FIG. 31 is a diagram showing reliability of the light-emitting device 3 and the light-emitting device 4.

FIG. 31 is a graph showing a change in luminance over driving time when each element was driven at a constant current density (50 mA/cm$^2$). As shown in FIG. 31, the light-emitting device 3 and the light-emitting device 4 of embodiments of the present invention were found to be light-emitting devices with a favorable lifetime with a small reduction in luminance over the accumulated driving time. This was probably caused for the following reason: the difference in LUMO level between αN-βNPAnth used as the host material in the light-emitting layer 913 and 2mDBTBPDBq-II used as the electron-transport material in the electron-transport layer 914 was as large as 0.20 eV and thus, the electron-injection barrier at the interface between the light-emitting layer 913 and the electron-transport layer 914 stacked was high, which inhibited the electrons injected from the cathode side into the light-emitting layer from reaching the hole-transport layer and accordingly inhibited degradation of the hole-transport layer due to electron injection. Note that the change in luminance over the accumulated driving time shows a behavior of the luminance exceeding the initial value. This is because, as described above, the carrier recombination region spreads into the electron-transport layer in the initial stage of driving owing to the use of the electron-transport material with a slow electron-transport property in these light-emitting elements. It is deemed that as the driving time accumulates, the range of the carrier recombination region that has spread into the electron-transport layer decreases and the emission efficiency relatively increases, leading to the increase in luminance.

Reference Example

In this reference example, methods for calculating the HOMO levels, the LUMO levels, and the electron mobilities of the organic compounds that can be used in each example are described.

The HOMO level and the LUMO level can be calculated through cyclic voltammetry (CV) measurement.

An electrochemical analyzer (model number: ALS model 600A or 600C, manufactured by BAS Inc.) was used as a measurement apparatus. To prepare a solution for the CV measurement, dehydrated dimethylformamide (DMF) (manufactured by Sigma-Aldrich Inc., 99.8%, catalog No. 22705-6) was used as a solvent, tetra-n-butylammonium perchlorate (n-Bu4NClO4) (manufactured by Tokyo Chemical Industry Co., Ltd., catalog No. T0836) as a supporting electrolyte was dissolved at a concentration of 100 mmol/L, and the object to be measured was dissolved at a concentration of 2 mmol/L. A platinum electrode (PTE platinum electrode, manufactured by BAS Inc.) was used as a working electrode, another platinum electrode (Pt counter electrode for VC-3 (5 cm), manufactured by BAS Inc.) was used as an auxiliary electrode, and an Ag/Ag+ electrode (RE7 reference electrode for non-aqueous solvent, manufactured by BAS Inc.) was used as a reference electrode. Note that the measurement was conducted at room temperature (20 to 25° C.). The scan speed in the CV measurement was fixed to 0.1 V/sec, and an oxidation potential Ea [V] and a reduction potential Ec [V] with respect to the reference electrode were measured. Ea is an intermediate potential of an oxidation-reduction wave, and Ec is an intermediate potential of a reduction-oxidation wave. Here, since the potential energy of the reference electrode used in this example with respect to the vacuum level is known to be −4.94 [eV], the HOMO level and the LUMO level can be calculated by the following formulae: HOMO level [eV]=−4.94−Ea and LUMO level [eV]=−4.94−Ec.

The electron mobility can be measured by an impedance spectroscopy method (IS method).

As methods for measuring the carrier mobility of an EL material, a transient photocurrent method (time-of-flight (TOF) method), a method (SCLC method) using I-V characteristics of a space-charge-limited current (SCLC), and the like have been known for a long time. The TOF method needs a sample with a much larger thickness than that of an actual organic EL element. The SCLC method has a disadvantage in that electric field strength dependence of carrier mobility cannot be obtained, for example. Since an organic film required for the measurement employing the IS method is as thin as approximately several hundreds of nanometers, the film can be formed using a relatively small amount of EL materials; accordingly, the IS method is characterized by the capability of measuring the mobility with a thickness close to the thickness of a film in an actual EL element, and can also measure the electric field strength dependence of the carrier mobility.

In the IS method, a micro sinusoidal voltage signal ($V=V_0[\exp(j\omega t)]$) is applied to an EL element, and the impedance ($Z=V/I$) of the EL element is obtained from a phase difference between the current amplitude of a response current signal ($I=I_0\exp[(\omega t+\phi)]$) and the input signal. By applying the voltage to the element while the frequency of the voltage is changed from a high level to a low level, components having various relaxation times that contribute to the impedance can be separated and measured.

Here, admittance Y ($=1/Z$), which is the reciprocal number of the impedance, can be represented by conductance G and susceptance B as shown in the following formula (1).

[Formula 1]

$$Y = \frac{1}{Z} = G + jB \quad (1)$$

In addition, by a single injection model, calculation of the following formulae (2) and (3) can be performed. Here, g (the formula (4)) is differential conductance. In the formula, C represents capacitance, θ is wt and represents a transit angle, ω represents angular frequency, and t represents transit time. For the analysis, the current equation, the Poisson's equation, and the current continuity equation are used, and a diffusion current and a trap state are ignored.

[Formula 2]

$$G = \frac{g\theta^3}{6} \frac{\theta - \sin\theta}{(\theta - \sin\theta)^2 + \left(\frac{\theta^2}{2} + \cos\theta - 1\right)^2} \quad (2)$$

$$R = \omega C = \frac{g\theta^3}{6} \frac{\frac{\theta^2}{2} + \cos\theta - 1}{(\theta - \sin\theta)^2 + \left(\frac{\theta^2}{2} + \cos\theta - 1\right)^2} \quad (3)$$

$$g = \frac{9}{4}\varepsilon\mu\frac{V_0}{d^3} \quad (4)$$

A method for calculating mobility from the frequency characteristics of capacitance is a −ΔB method. A method for calculating mobility from the frequency characteristics of conductance is a ωΔG method.

In practice, first, an electron-only element is fabricated using a material whose electron mobility is intended to be calculated. The electron-only element is an element designed such that only electrons flow therein as carriers. In this specification, the method for calculating mobility from the frequency characteristics of capacitance (the −ΔB method) is described. A schematic diagram of an electron-only element is as shown in FIG. 10.

Figure 10:
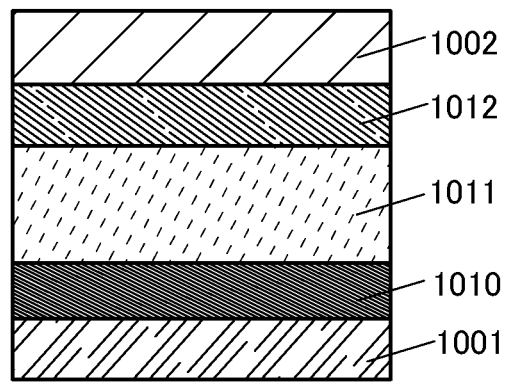
FIG. 10 is a diagram showing a structure of an electron-only element.

As shown in FIG. 10, the electron-only element fabricated for the measurement includes a first layer 1010, a second layer 1011, and a third layer 1012 between a first electrode 1001 and a second electrode 1002. Note that the material whose electron mobility is to be measured can be used for the second layer 1011. For explanation, an example in which the electron mobility of a film formed by co-evaporation of ZADN and Liq in a weight ratio of 1:1 is measured is given here. A specific structure example is listed in the following table.

TABLE 8

| Anode | | | First layer | Second layer | Third layer | Cathode |
|---|---|---|---|---|---|---|
| 100 nm | 50 nm | 100 nm | 1 nm | 200 nm | 1 nm | 100 nm |
| APC | NITO | Al | Liq | ZADN:Liq (0.5:0.5) | Liq | Al |

Figure 11:
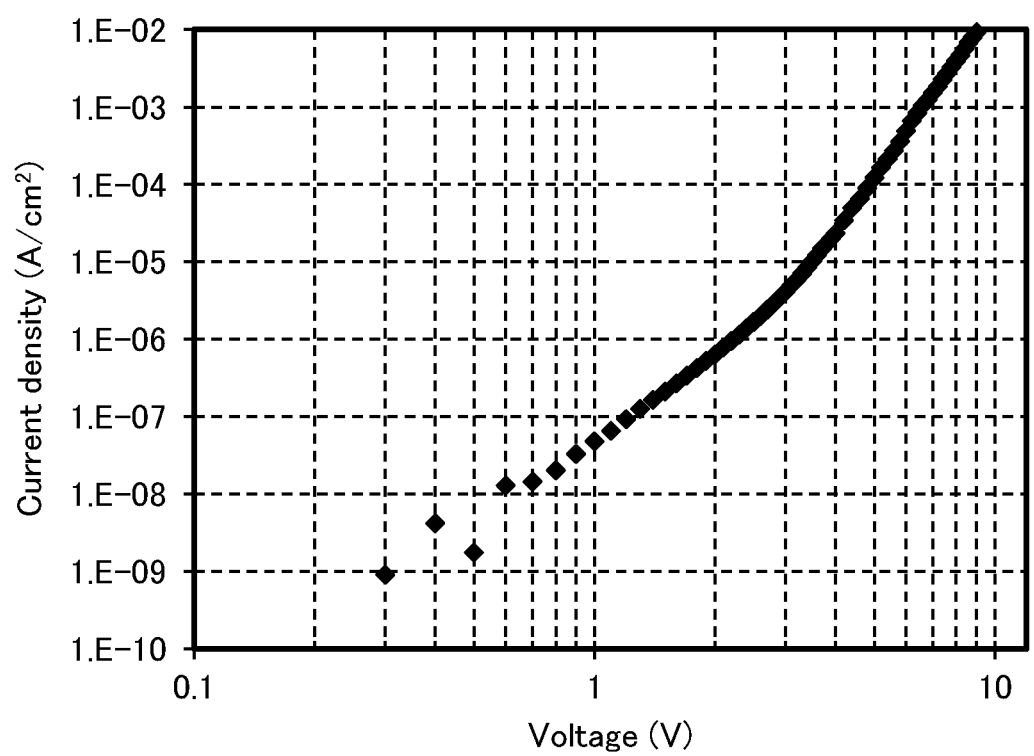
FIG. 11 shows current density-voltage characteristics of an electron-only element.

FIG. 11 shows the current density-voltage characteristics of the electron-only element including the film formed by co-evaporation of ZADN and Liq as the second layer 1011.

Figure 12:
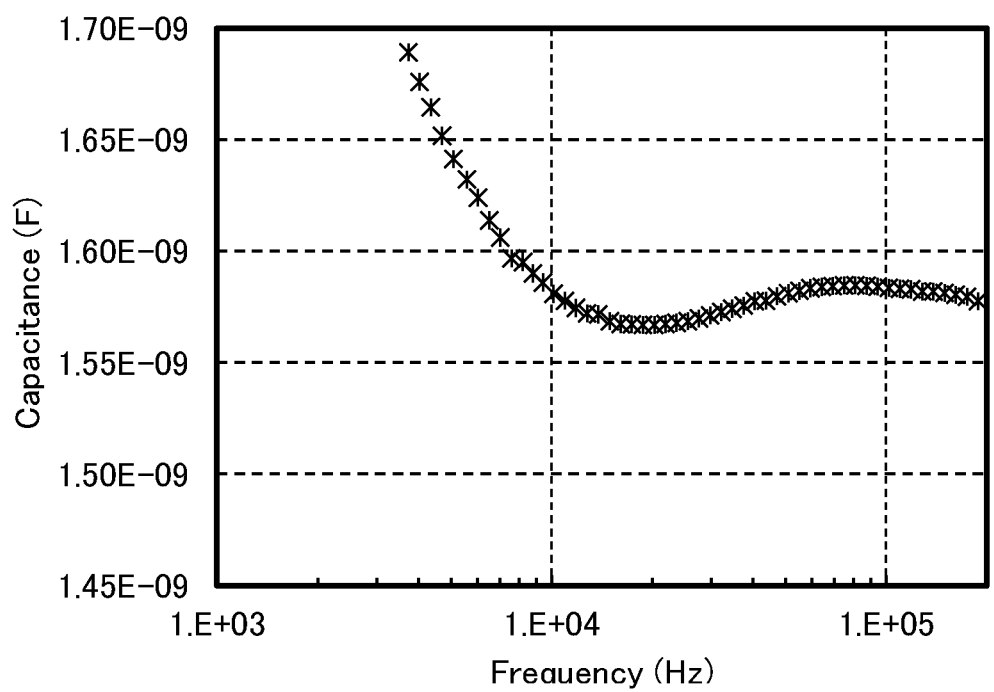
FIG. 12 shows frequency characteristics of capacitance C.

The impedance was measured under the conditions where the DC voltage was applied in the range of 5.0 V to 9.0 V, the AC voltage was 70 mV, and the frequency was 1 Hz to 3 MHz. Here, capacitance is calculated from admittance, which is the reciprocal number of the obtained impedance (the above formula (1)). FIG. 12 shows the frequency characteristics of the calculated capacitance C at an applied voltage of 7.0 V.

The frequency characteristics of the capacitance C are obtained from a phase difference in current, which is caused because a space charge generated by carriers injected by the micro voltage signal cannot completely follow the micro AC voltage. The transit time of the carriers in the film is defined by time T taken for the injected carriers to reach the counter electrode, and is represented by the following formula (5).

[Formula 3]

$$T = \frac{4}{3}\frac{L^2}{\mu V_0} \quad (5)$$

A negative susceptance change (−ΔB) corresponds to a value (−ωΔC) obtained by multiplying a capacitance change −ΔC by angular frequency ω. According to the formula (3), there is a relation between peak frequency on the lowest frequency side $f'_{max}(=\omega_{max}/2\pi)$ and the transit time T as shown in the following formula (6).

[Formula 4]

$$T = \frac{4.5}{2\pi f'_{max}} \quad (6)$$

Figure 13:
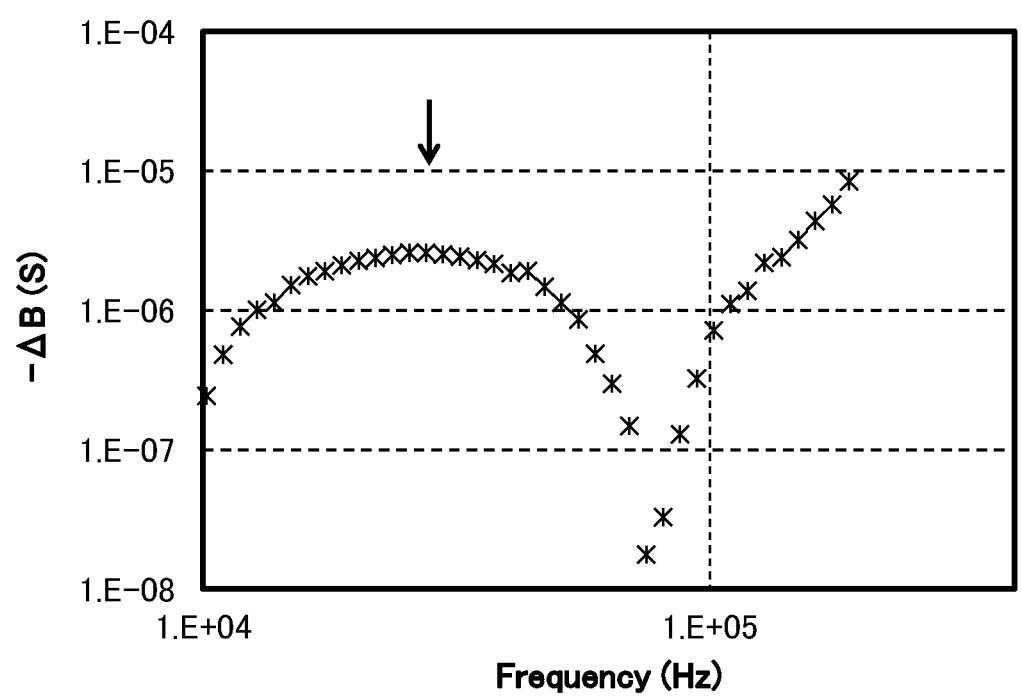
FIG. 13 shows frequency characteristics of $-\Delta B$.

FIG. 13 shows the frequency characteristics of −ΔB calculated from the above measurement (i.e., −ΔB at a DC voltage of 7.0 V). The peak frequency on the lowest frequency side $f'_{max}$ that is obtained from FIG. 13 is indicated by the arrow in the diagram.

The transit time T is obtained from $f_{max}$ obtained from the above measurement and analysis (see the above formula (6)); thus, the electron mobility at a voltage of 7.0 V can be obtained from the above formula (5). Through the same measurement with the DC voltage in the range of 5.0 V to 9.0 V, the electron mobility at each voltage (electric field strength) can be calculated, so that the electric field strength dependence of the mobility can also be measured.

Figure 14:
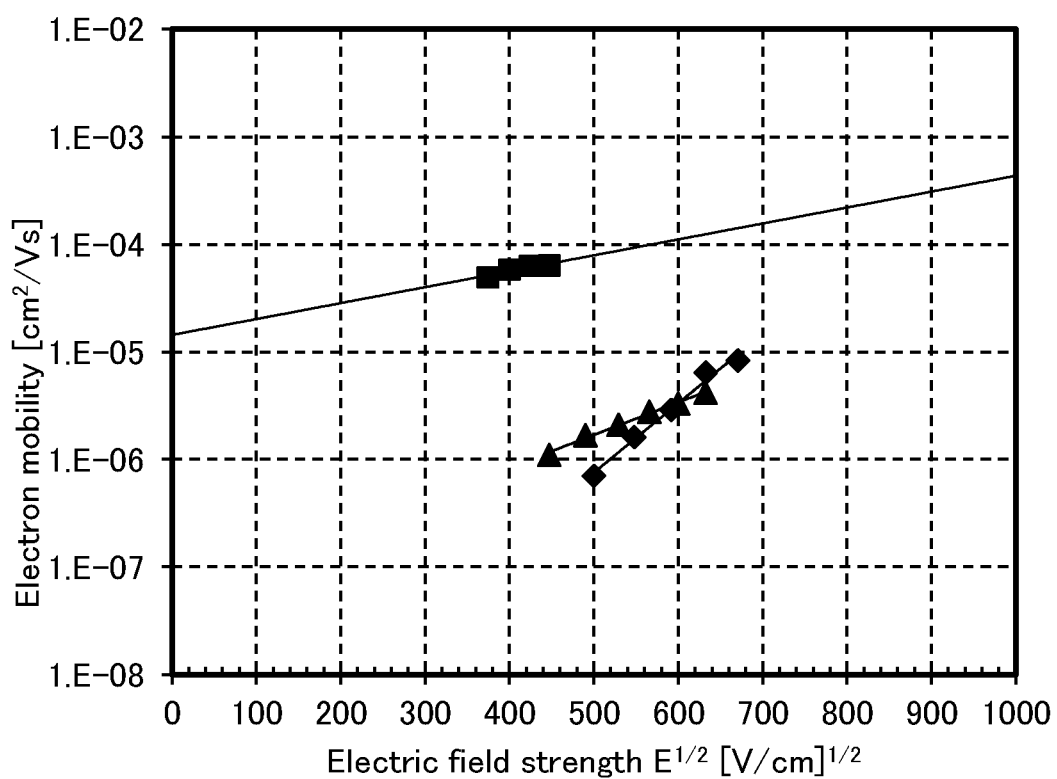
FIG. 14 shows electric field strength dependence of electron mobility of organic compounds.

FIG. 14 shows the electric field strength dependence of the electron mobility of the organic compounds, which is eventually obtained by the above calculation method, and Table 9 shows the values of the electron mobility in the case where the square root of the electric field strength [V/cm] read from the diagram was 600 [V/cm]$^{1/2}$.

TABLE 9

| | Electron mobility (cm$^2$/Vs) |
|---|---|
| cgDBCzPA | 7.7 × 10$^{-5}$ |
| 2mDBTBPDBq-II | 2.2 × 10$^{-5}$ |
| ZADN: Liq (1:1) | 3.5 × 10$^{-6}$ |

The electron mobility can be calculated as described above. For the details of the measurement method, refer to the following reference: Takayuki Okachi et al., "Japanese Journal of Applied Physics", vol. 47, No. 12, 2008, pp. 8965-8972.

[Chemical Formula 9]

Example 3

In this example, a light-emitting device 5, a light-emitting device 6, and a light-emitting device 7 are described. Note that the material used for an electron-transport layer of the light-emitting device 5 is the same as that used in the light-emitting device 1 described in Example 1. The electron-transport layers of the light-emitting device 6 and the light-emitting device 7 each contain at least ALD-MC057Q (Analysis Atelier Corporation, material serial No.: 1S20190330) (LUMO level: −2.98 eV) as an electron-transport material, and the light-emitting layers of the light-emitting device 6 and the light-emitting device 7 each include 9-(1-naphthyl)-10-[4-(2-naphthyl)phenyl]anthracene (abbreviation: αN-βNPAnth) as a host material. Thus, in the light-emitting device 6 and the light-emitting device 7, the difference in LUMO level between the host material (αN-βNPAnth) of the light-emitting layer and the electron-transport material (ALD-MC057Q) of the electron-transport layer is 0.24 eV. The device structures of the light-emitting devices described in this example are as shown in FIG. 15, and a fabrication method thereof is similar to that in Example 2.

The chemical formulae of the materials used in the light-emitting devices in this example are shown below. Specific structures of the light-emitting devices are shown in Table 10 below.

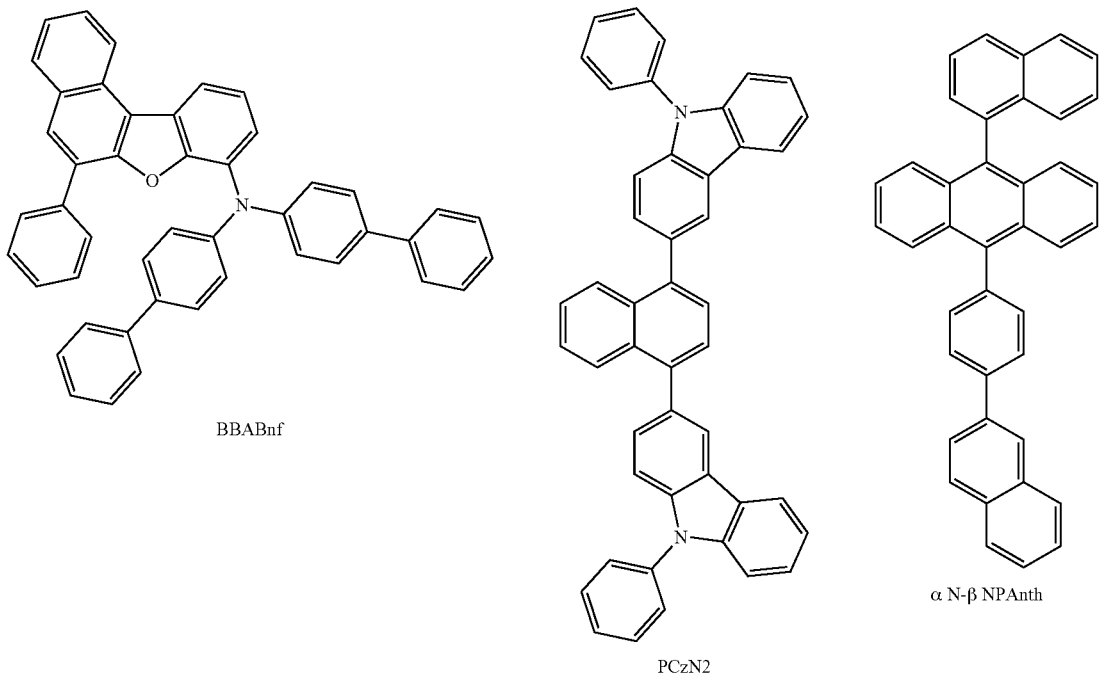

BBABnf

PCzN2

α N-β NPAnth

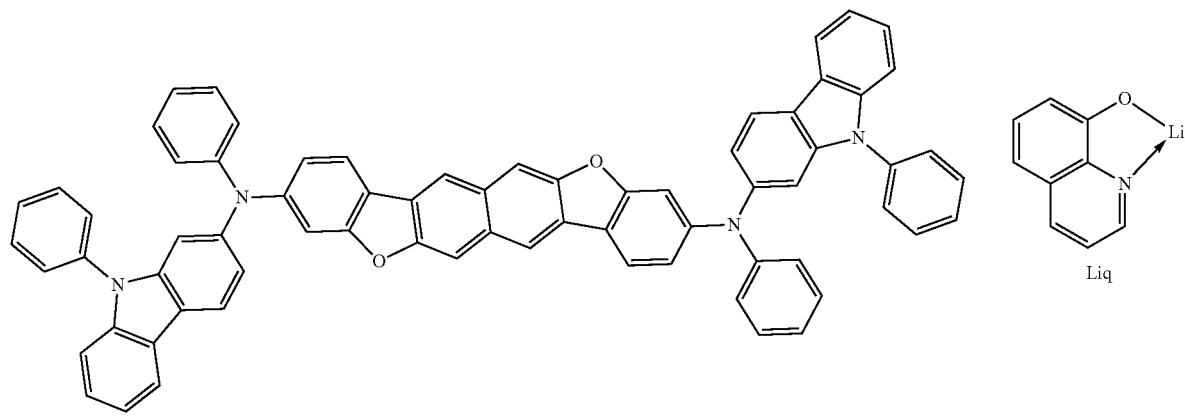

3,10PCA2Nbf(IV)-02

Liq

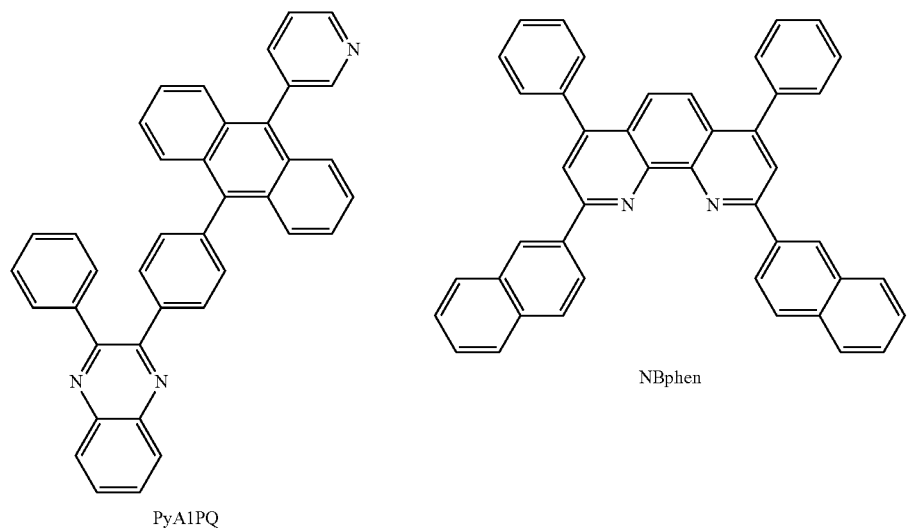

PyA1PQ

NBphen

TABLE 10

| | First electrode | Hole-injection layer | Hole-transport layer | Light-emitting layer | Electron-transport layer | | Electron-injection layer | Second electrode |
|---|---|---|---|---|---|---|---|---|
| Light-emitting device 5 | ITSO (70 nm) | BBABnf:ALD-MP001Q (1:0.1 10 nm) | BBABnf (20 nm) | PCzN2 (10 nm) | * | PyA1PQ:Liq (1:2.3 12.5 nm) | PyA1PQ:Liq (1:1.7 12.5 nm) | Liq (1 nm) | Al (200 nm) |
| Light-emitting device 6 | ITSO (70 nm) | BBABnf:ALD-MP001Q (1:0.1 10 nm) | BBABnf (20 nm) | PCzN2 (10 nm) | * | ALD-MC057Q:Liq (1:2 25 nm) | | Liq (1 nm) | Al (200 nm) |
| Light-emitting device 7 | ITSO (70 nm) | BBABnf:ALD-MP001Q (1:0.1 10 nm) | BBABnf (20 nm) | PCzN2 (10 nm) | * | ALD-MC057Q:Liq (1:2.5 15 nm) | NBphen (10 nm) | LiF (1 nm) | Al (200 nm) |

*αN-βNP Anth:3, 10PCA2Nbf(IV)-02 (1:0.015 25 nm)

<<Operation Characteristics of Light-Emitting Devices>>

Figure 32:
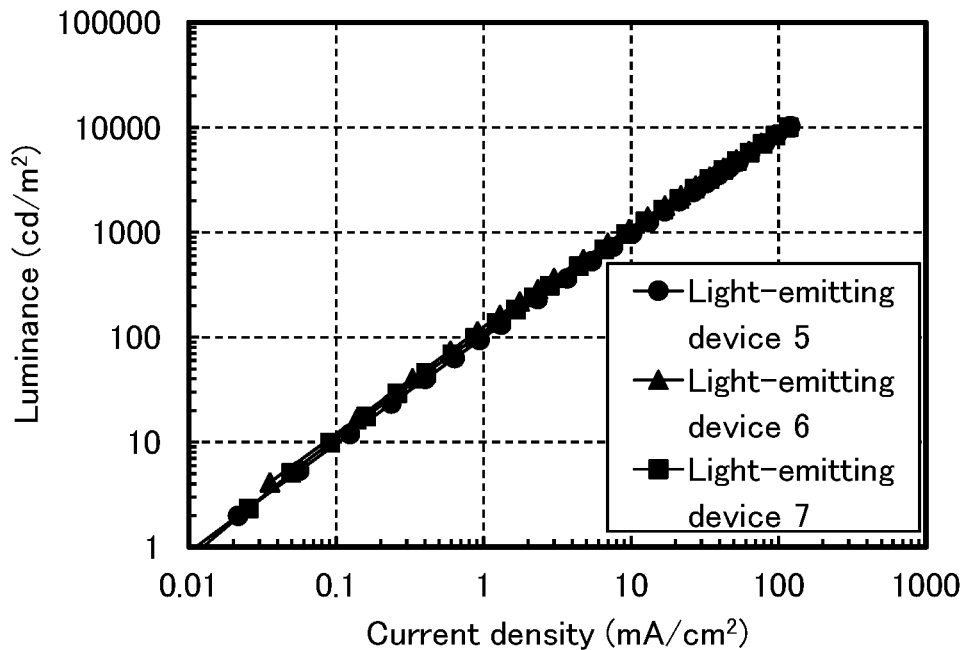
FIG. 32 is a diagram showing current density-luminance characteristics of a light-emitting device 5, a light-emitting device 6, and a light-emitting device 7.
Figure 33:
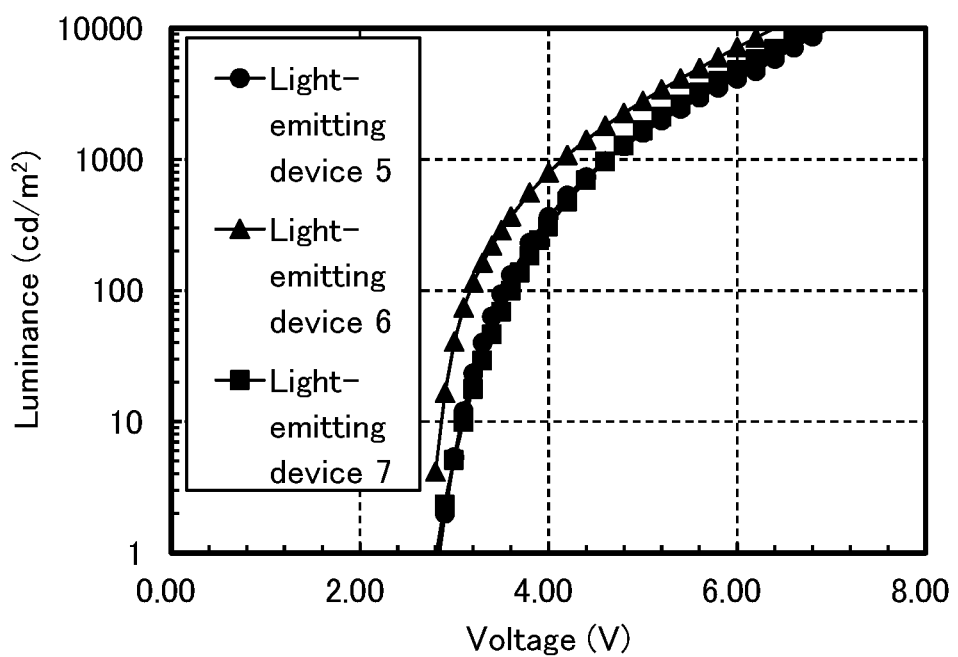
FIG. 33 is a diagram showing voltage-luminance characteristics of the light-emitting device 5, the light-emitting device 6, and the light-emitting device 7.
Figure 34:
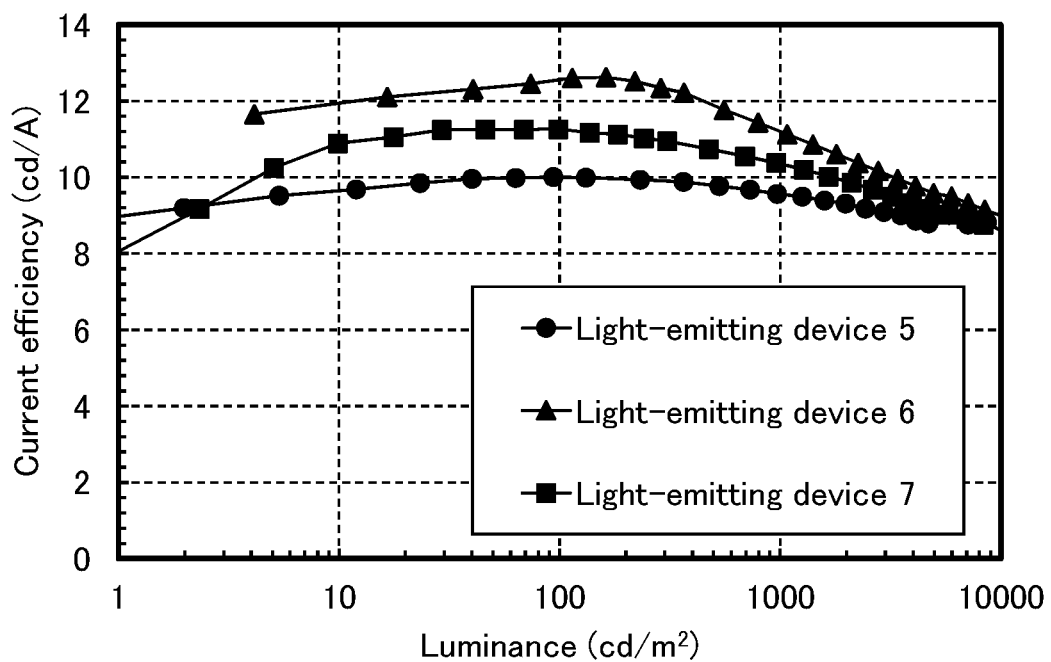
FIG. 34 is a diagram showing luminance-current efficiency characteristics of the light-emitting device 5, the light-emitting device 6, and the light-emitting device 7.
Figure 35:
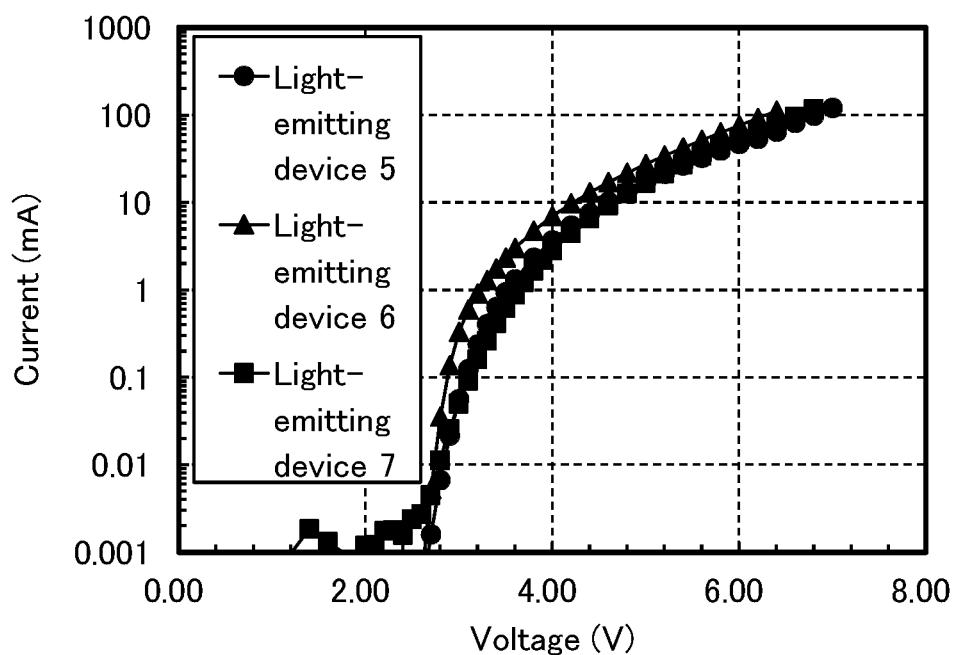
FIG. 35 is a diagram showing voltage-current characteristics of the light-emitting device 5, the light-emitting device 6, and the light-emitting device 7.
Figure 36:
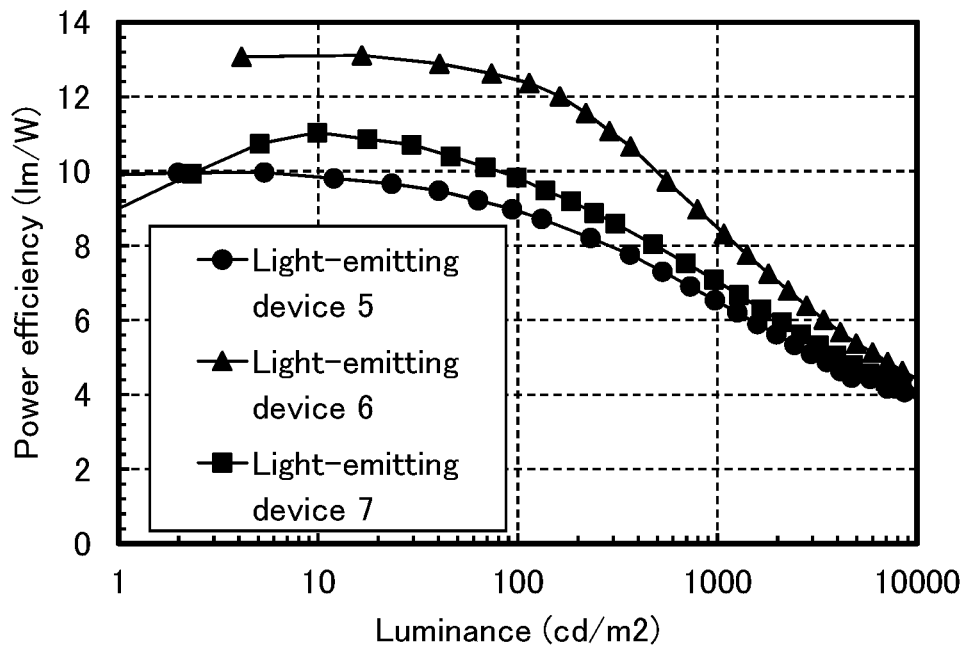
FIG. 36 is a diagram showing luminance-power efficiency characteristics of the light-emitting device 5, the light-emitting device 6, and the light-emitting device 7.
Figure 37:
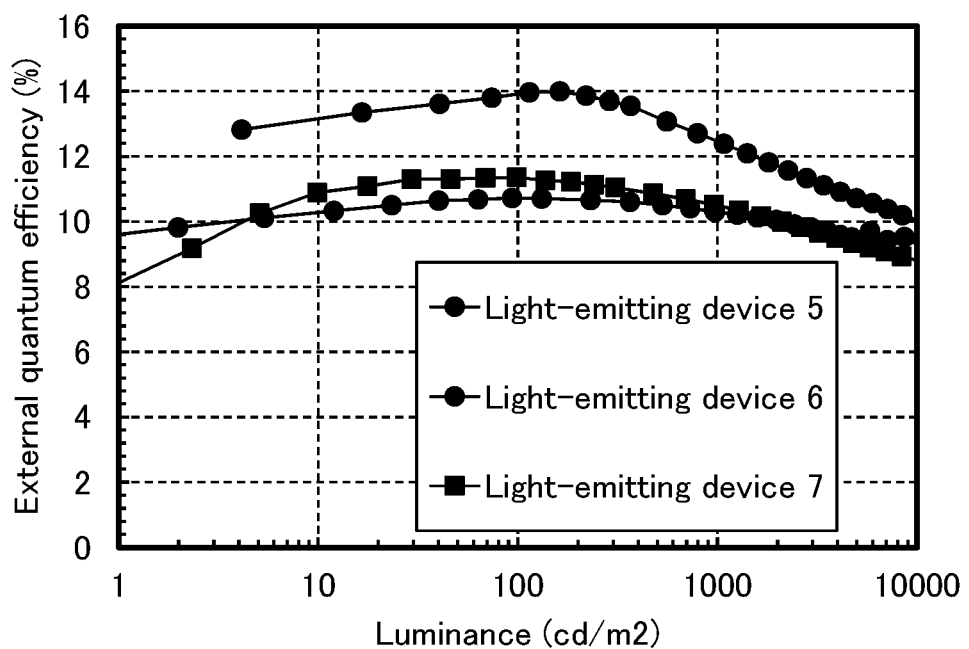
FIG. 37 is a diagram showing luminance-external quantum efficiency characteristics of the light-emitting device 5, the light-emitting device 6, and the light-emitting device 7.

Operation characteristics of each of the fabricated light-emitting devices were measured. Note that the measurement was carried out at room temperature (an atmosphere maintained at 25° C.). As the results of the operation characteristics of the light-emitting devices, the current density-luminance characteristics are shown in FIG. 32, the voltage-luminance characteristics are shown in FIG. 33, the luminance-current efficiency characteristics are shown in FIG. 34, the voltage-current characteristics are shown in FIG. 35, the luminance-power efficiency characteristics are shown in FIG. 36, and the luminance-external quantum efficiency characteristics are shown in FIG. 37.

Table 11 below shows the initial values of the main characteristics of each of the light-emitting devices at around 1000 cd/m2.

TABLE 11

| | Voltage (V) | Current (mA) | Current density (mA/cm$^2$) | Chromaticity (x, y) | Luminance (cd/m$^2$) | Current efficiency (cd/A) | Power efficiency (lm/W) | External quantum efficiency (%) |
|---|---|---|---|---|---|---|---|---|
| Light-emitting device 5 | 4.6 | 0.41 | 10 | (0.14, 0.11) | 970 | 9.6 | 6.5 | 10 |
| Light-emitting device 6 | 4.2 | 0.39 | 9.7 | (0.14, 0.10) | 1100 | 11 | 8.3 | 12 |
| Light-emitting device 7 | 4.6 | 0.37 | 9.3 | (0.13, 0.12) | 960 | 10 | 7.1 | 11 |

Figure 38:
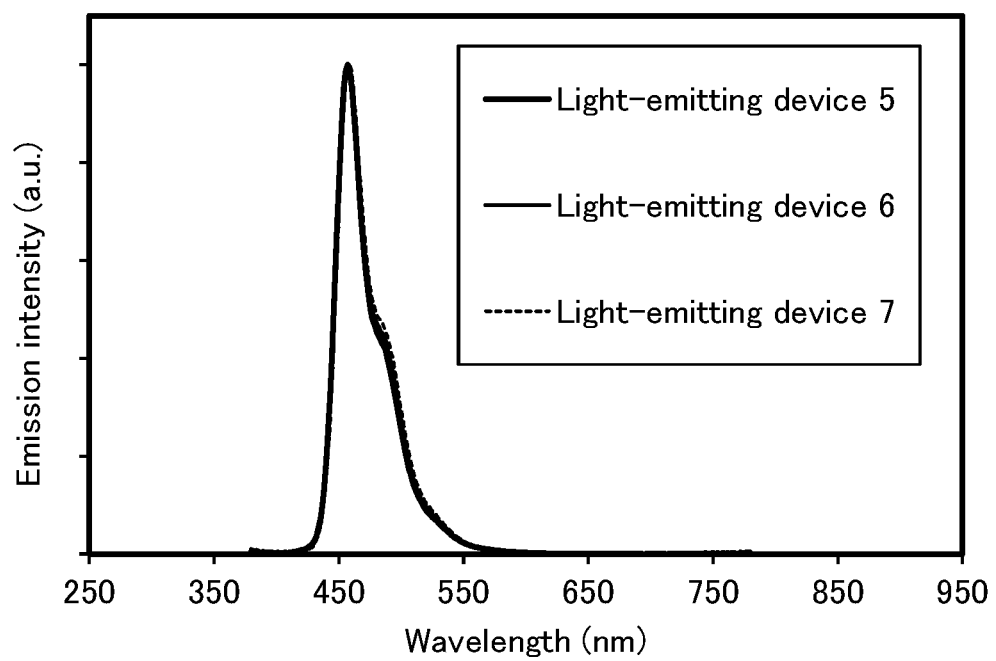
FIG. 38 is a diagram showing emission spectra of the light-emitting device 5, the light-emitting device 6, and the light-emitting device 7.

FIG. 38 shows the emission spectra at the time of applying the voltage that allows the light-emitting devices to achieve a luminance of 1000 cd/m$^2$. As shown in FIG. 38, the emission spectrum of each light-emitting device has a peak at around 460 nm, suggesting that each peak is derived from light emission of 3,10PCA2Nbf(IV)-02 contained in the light-emitting layer 913.

The results shown in FIG. 32 to FIG. 37 and Table 11 showed that the light-emitting device 6 and the light-emitting device 7 of embodiments of the present invention each including αN-βNPAnth as the host material in the light-emitting layer 913 and at least ALD-MC057Q as the electron-transport material in the electron-transport layer 914 have favorable current-voltage characteristics, favorable power efficiency, and favorable emission efficiency.

Figure 39:
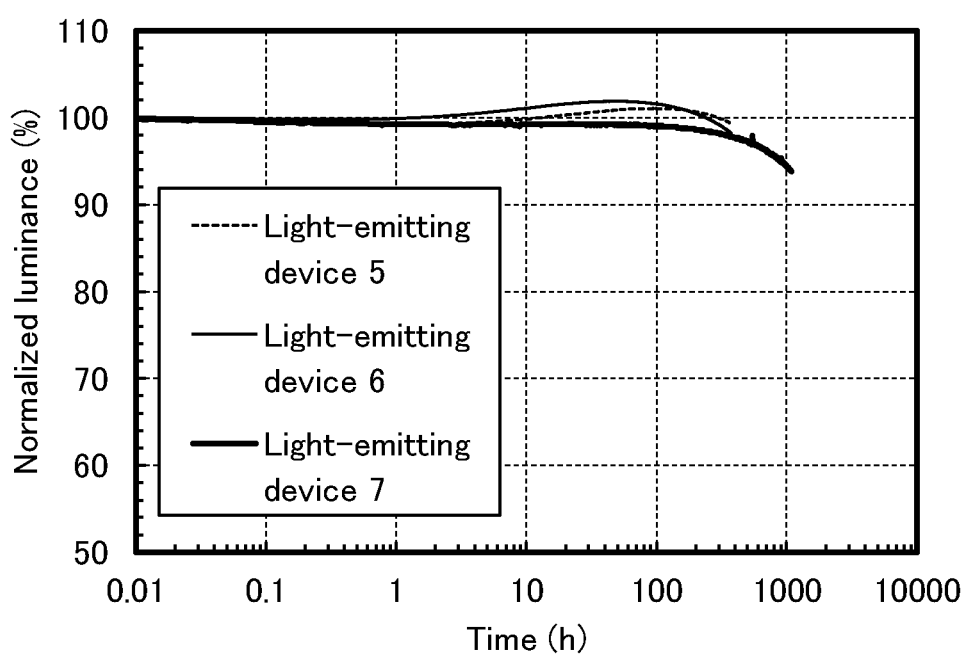
FIG. 39 is a diagram showing reliability of the light-emitting device 5, the light-emitting device 6, and the light-emitting device 7.

FIG. 39 is a graph showing a change in luminance over driving time when each element was driven at a constant current density (50 mA/cm$^2$). As shown in FIG. 39, the light-emitting device 5, the light-emitting device 6, and the light-emitting device 7 of embodiments of the present invention were found to be light-emitting devices with a favorable lifetime with a small reduction in luminance over the accumulated driving time. This was probably caused for the following reason: the difference in LUMO level between αN-βNPAnth used as the host material in the light-emitting layer 913 and the material used as the electron-transport material in the electron-transport layer 914, i.e., PyA1PQ in the case of the light-emitting device 5 and ALD-MC057Q in the case of the light-emitting device 6 and the light-emitting device 7, was as large as 0.26 eV in the case of the light-emitting device 5 and was as large as 0.24 eV in the case of the light-emitting device 6 and the light-emitting device 7 and thus, the electron-injection barrier at the interface between the light-emitting layer 913 and the electron-transport layer 914 stacked was high, which inhibited the electrons injected from the cathode side into the light-emitting layer from reaching the hole-transport layer and accordingly inhibited degradation of the hole-transport layer due to electron injection. Note that the change in luminance over the accumulated driving time shows a behavior of the luminance exceeding the initial value. This is because, as described above, the carrier recombination region spreads into the electron-transport layer in the initial stage of driving owing to the use of the electron-transport material with a slow electron-transport property in these light-emitting elements. It is deemed that as the driving time accumulates, the range of the carrier recombination region that has spread into the electron-transport layer decreases and the emission efficiency relatively increases, leading to the increase in luminance.

Example 4

In this example, a light-emitting device 8, a light-emitting device 9, a light-emitting device 10, a light-emitting device 11, and a light-emitting device 12 are described. Note that common materials are used in these light-emitting devices except for the materials in the electron-transport layers as shown in Table 12 below. Note that the difference between the LUMO level of the host material (αN-βNPAnth: −2.74 eV) in the light-emitting layer and the LUMO level of the electron-transport material in the electron-transport layer is 0.26 eV in the light-emitting device 8, 0.20 eV in the light-emitting device 9, 0.27 eV in the light-emitting device 10, 0.26 eV in the light-emitting device 11, and 0.26 eV in the light-emitting device 12. The device structures of the light-emitting devices described in this example are as shown in FIG. 15, and a fabrication method thereof is similar to that in Example 2.

The chemical formulae of the materials used in the light-emitting devices in this example are shown below. Specific structures of the light-emitting devices are shown in Table 12 below.
[Chemical Formula 10]
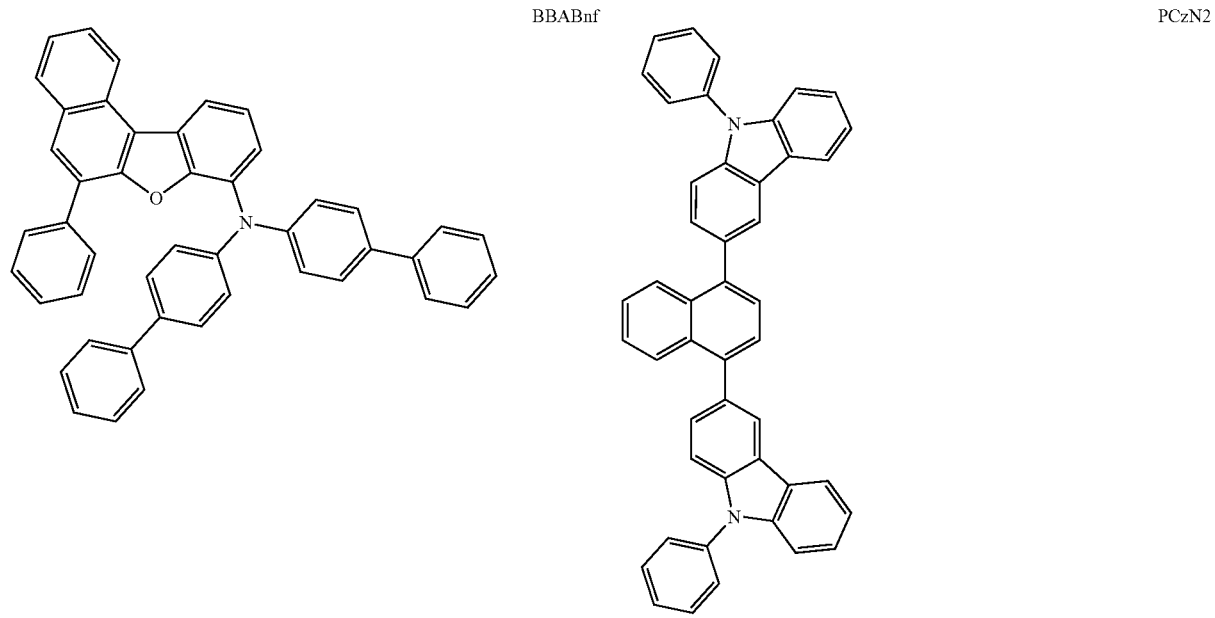
BBABnf
PCzN2
αN-βNPAnth -continued
3,10PCA2Nbf(IV)-02
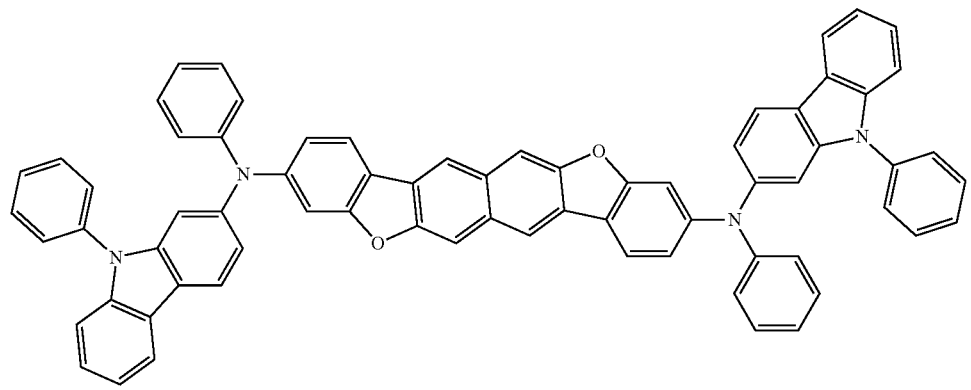
PyN1PQ-02
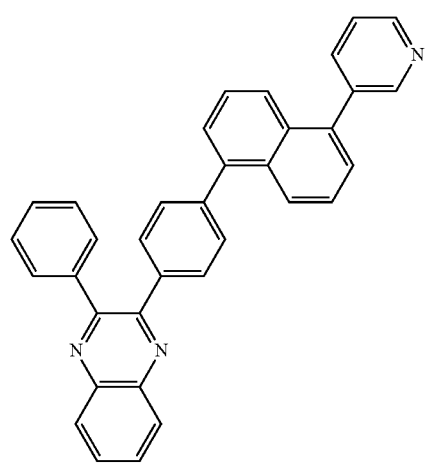
1PQPmA
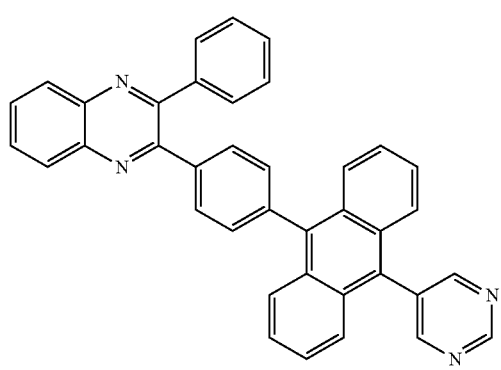
NPphen
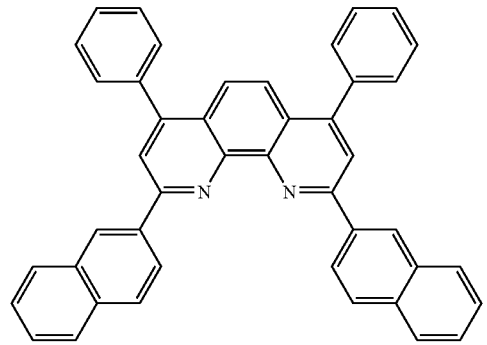
Liq
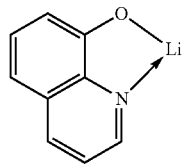
2mDBTPDBq-II
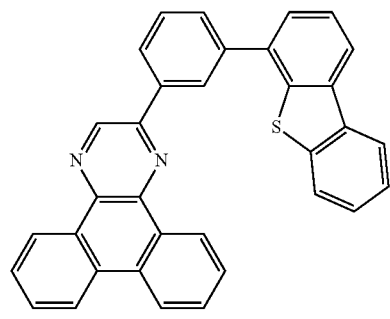
PPy1PQ
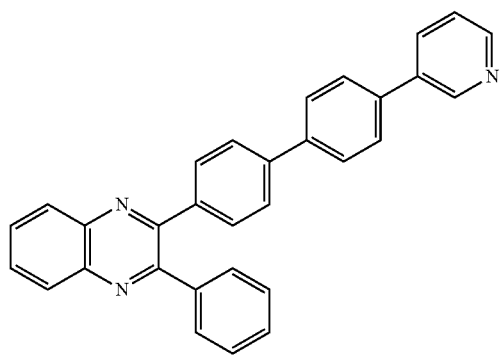

-continued

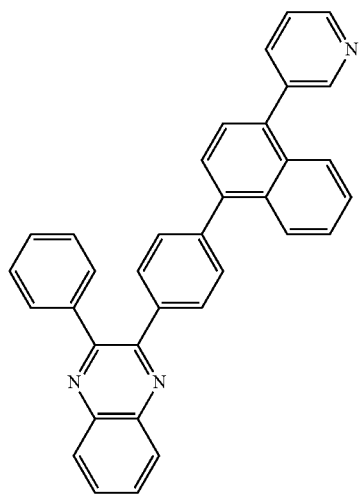
PyN1PQ

TABLE 12

|  | First electrode | Hole-injection layer | Hole-transport layer | Light-emitting layer | Electron-transport layer | | Electron-injection layer | Second electrode |
|---|---|---|---|---|---|---|---|---|
| Light-emitting device 8 | ITSO (70 nm) | BBABnf:ALD-MP001Q (1:0.1 10 nm) | BBABnf (20 nm) | PCzN2 (10 nm) | * | 1PQPmA:Liq (1:2 25 nm) | Liq (1 nm) | Al (200 nm) |
| Light-emitting device 9 | | | | | | 2mDBTPDBq-II:Liq (1:2 15 nm)   NBphen (10 nm) | | |
| Light-emitting device 10 | | | | | | PPy1PQ:Liq (1:2 12.5 nm)   PPy1PQ:Liq (1:0.5 12.5 nm) | | |
| Light-emitting device 11 | | | | | | PyN1PQ:Liq (1:1 25 nm) | | |
| Light-emitting device 12 | | | | | | PyN1PQ-02:Liq (1:1 25 nm) | | |

*αN-βNP Anth:3, 10PCA2Nbf(IV)-02 (1:0.015 25 nm)

<<Operation Characteristics of Light-Emitting Devices>>

Figure 40:
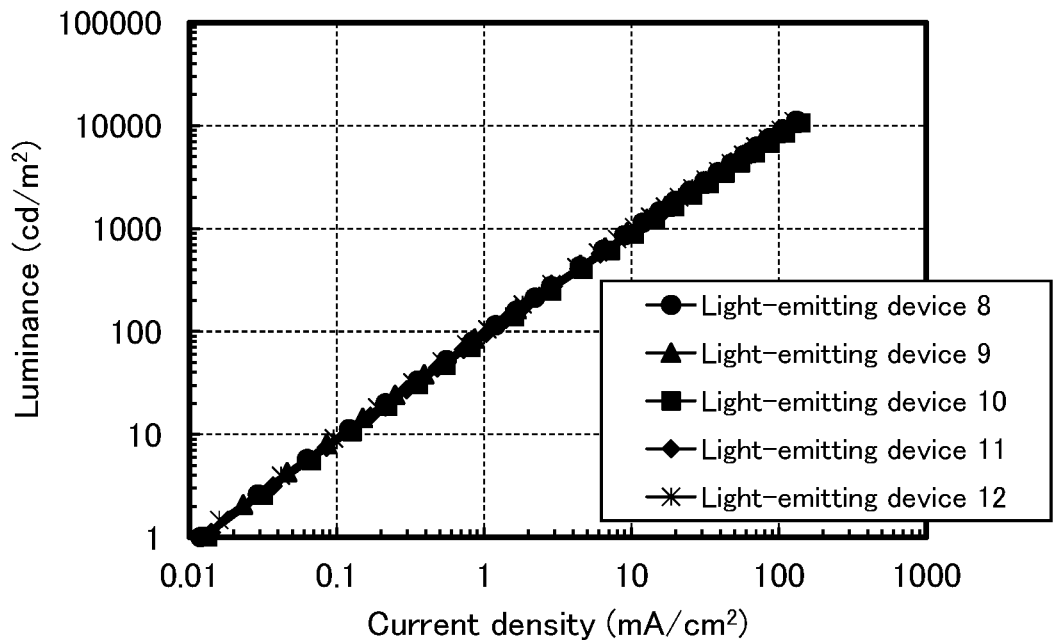
FIG. 40 is a diagram showing current density-luminance characteristics of a light-emitting device 8, a light-emitting device 9, a light-emitting device 10, a light-emitting device 11, and a light-emitting device 12.
Figure 41:
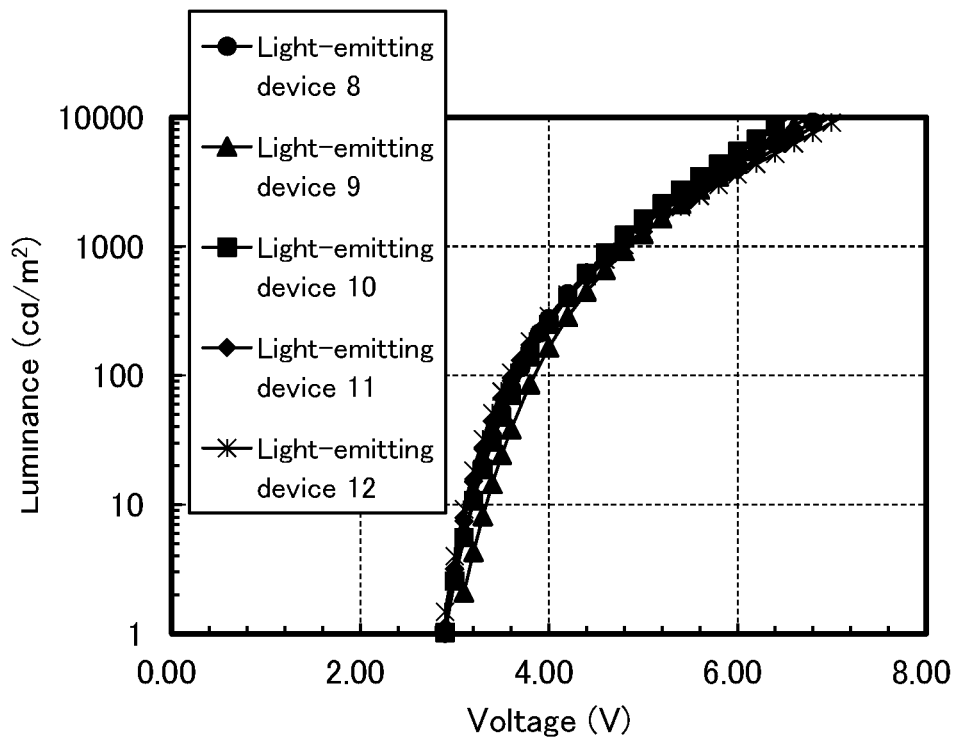
FIG. 41 is a diagram showing voltage-luminance characteristics of the light-emitting device 8, the light-emitting device 9, the light-emitting device 10, the light-emitting device 11, and the light-emitting device 12.
Figure 42:
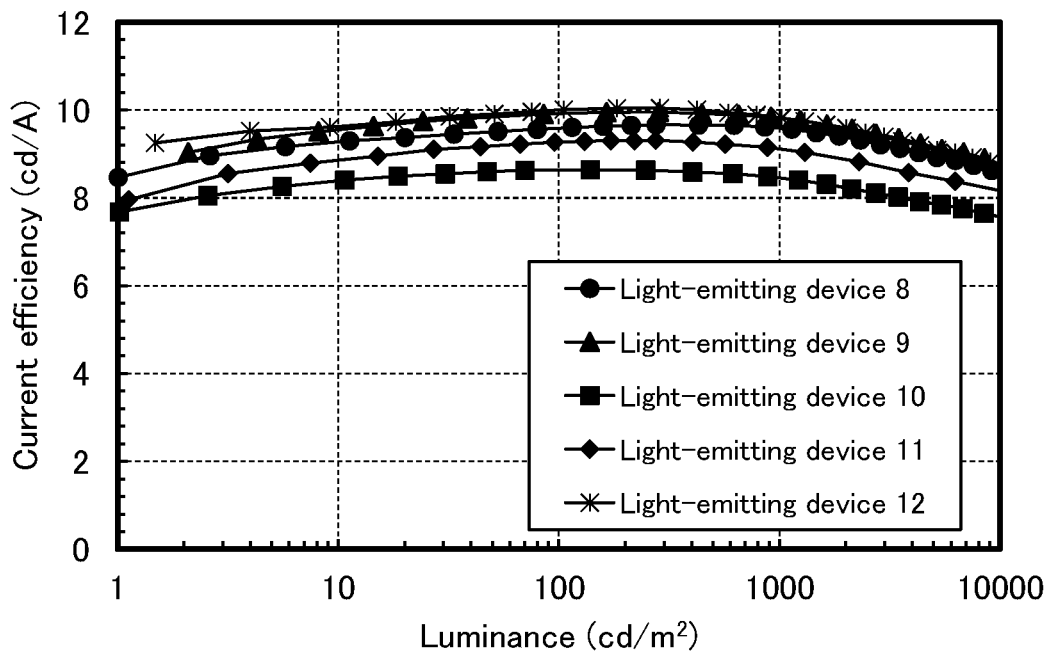
FIG. 42 is a diagram showing luminance-current efficiency characteristics of the light-emitting device 8, the light-emitting device 9, the light-emitting device 10, the light-emitting device 11, and the light-emitting device 12.
Figure 43:
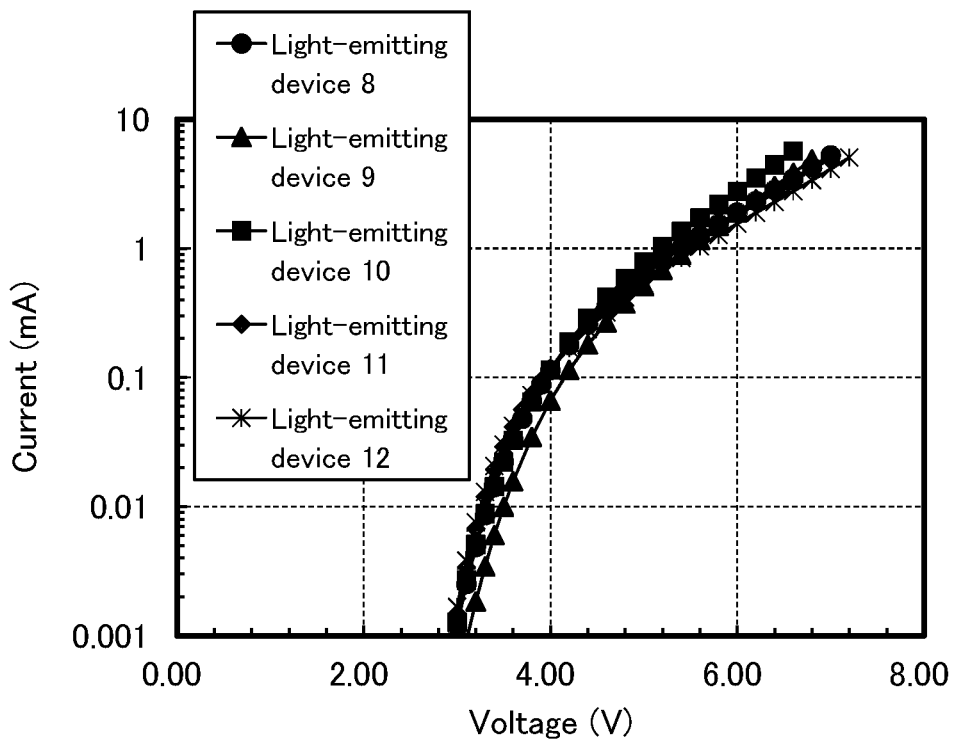
FIG. 43 is a diagram showing voltage-current characteristics of the light-emitting device 8, the light-emitting device 9, the light-emitting device 10, the light-emitting device 11, and the light-emitting device 12.
Figure 44:
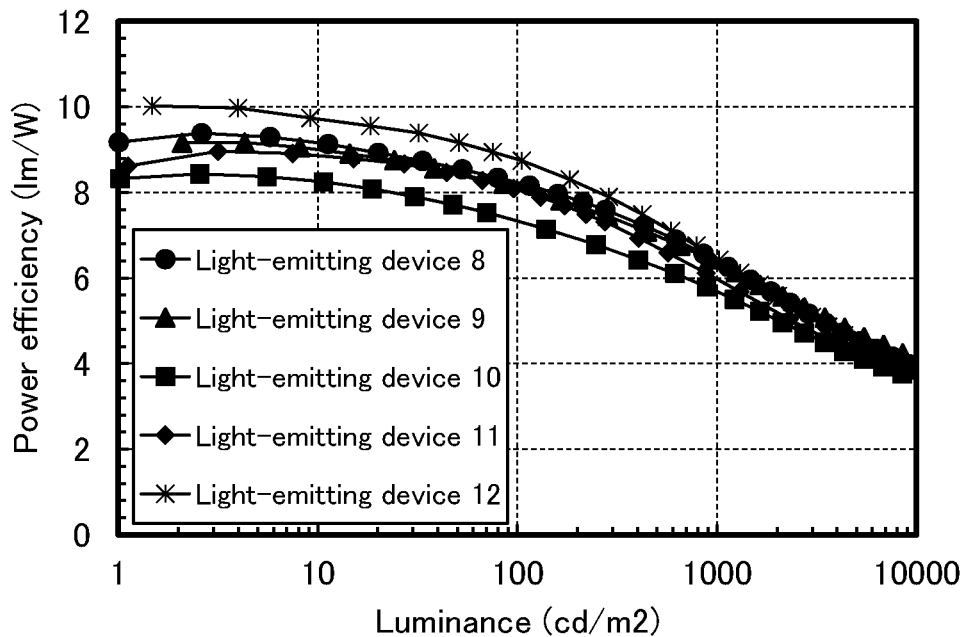
FIG. 44 is a diagram showing luminance-power efficiency characteristics of the light-emitting device 8, the light-emitting device 9, the light-emitting device 10, the light-emitting device 11, and the light-emitting device 12.
Figure 45:
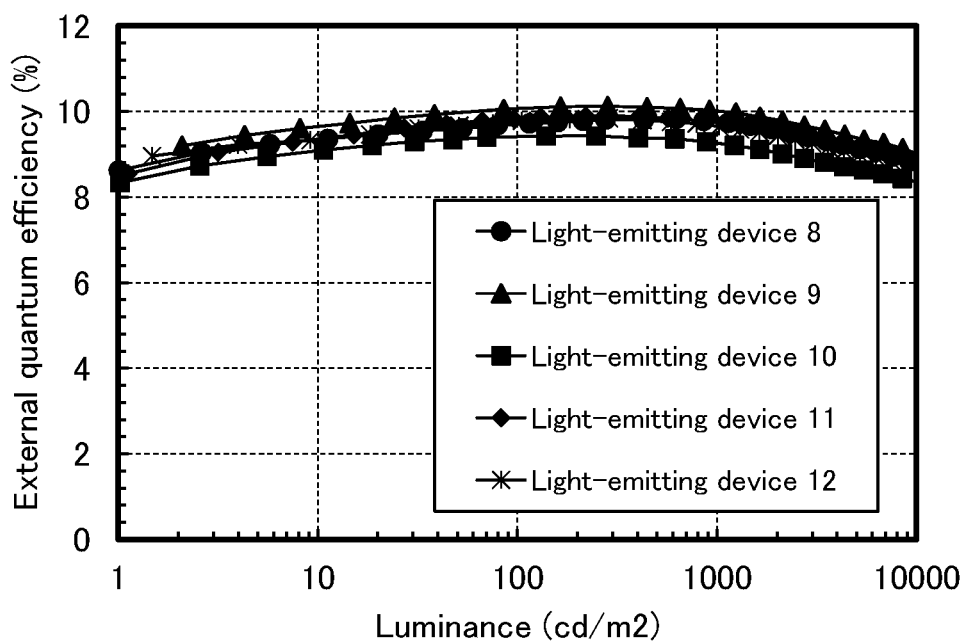
FIG. 45 is a diagram showing luminance-external quantum efficiency characteristics of the light-emitting device 8, the light-emitting device 9, the light-emitting device 10, the light-emitting device 11, and the light-emitting device 12.

Operation characteristics of each of the fabricated light-emitting devices were measured. Note that the measurement was carried out at room temperature (an atmosphere maintained at 25° C.). As the results of the operation characteristics of the light-emitting devices, the current density-luminance characteristics are shown in FIG. 40, the voltage-luminance characteristics are shown in FIG. 41, the luminance-current efficiency characteristics are shown in FIG. 42, the voltage-current characteristics are shown in FIG. 43, the luminance-power efficiency characteristics are shown in FIG. 44, and the luminance-external quantum efficiency characteristics are shown in FIG. 45.

Table 13 below shows the initial values of the main characteristics of each of the light-emitting devices at around 1000 cd/m2.

TABLE 13

| | Voltage (V) | Current (mA) | Current density (mA/cm$^2$) | Chromaticity x | Chromaticity y | Luminance (cd/m$^2$) | Current efficiency (cd/A) | Power efficiency (lm/W) | External quantum efficiency (%) |
|---|---|---|---|---|---|---|---|---|---|
| Light-emitting device 8 | 4.8 | 0.48 | 12 | 0.13 | 0.12 | 1100 | 9.6 | 6.3 | 9.7 |
| Light-emitting device 9 | 4.8 | 0.37 | 9.3 | 0.13 | 0.12 | 920 | 9.8 | 6.4 | 10 |

TABLE 13-continued

|  | Voltage (V) | Current (mA) | Current density (mA/cm$^2$) | Chromaticity x | Chromaticity y | Luminance (cd/m$^2$) | Current efficiency (cd/A) | Power efficiency (lm/W) | External quantum efficiency (%) |
|---|---|---|---|---|---|---|---|---|---|
| Light-emitting device 10 | 4.6 | 0.42 | 10 | 0.14 | 0.10 | 890 | 8.5 | 5.8 | 9.3 |
| Light-emitting device 11 | 4.7 | 0.39 | 9.6 | 0.14 | 0.11 | 890 | 9.2 | 6.1 | 9.8 |
| Light-emitting device 12 | 4.8 | 0.42 | 10 | 0.13 | 0.12 | 1000 | 9.8 | 6.4 | 9.7 |

Figure 46:
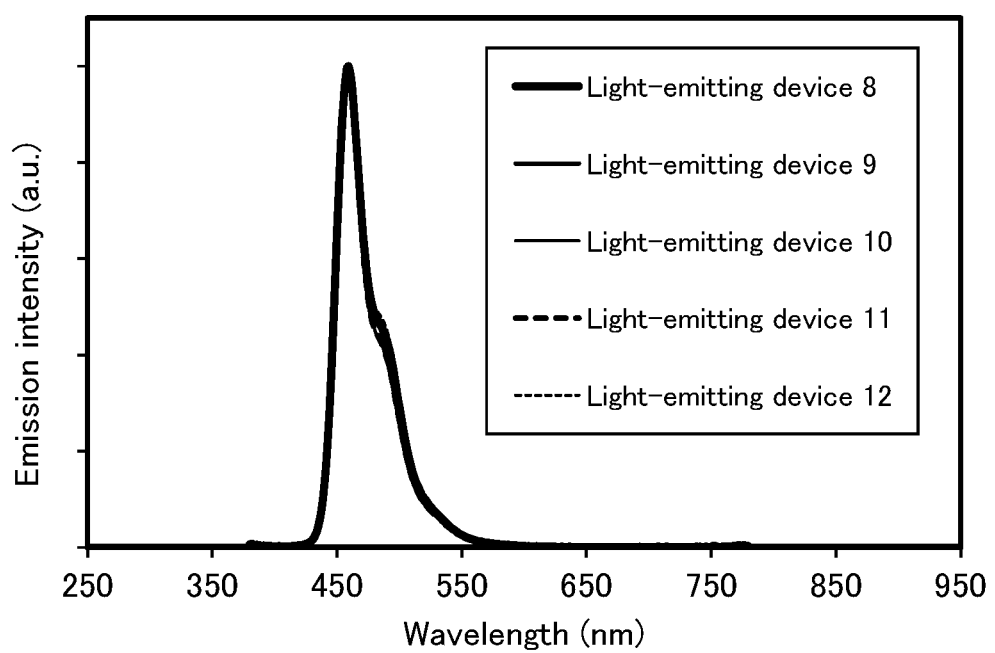
FIG. 46 is a diagram showing emission spectra of the light-emitting device 8, the light-emitting device 9, the light-emitting device 10, the light-emitting device 11, and the light-emitting device 12.

FIG. 46 shows the emission spectra at the time of applying the voltage that allows the light-emitting devices to achieve a luminance of 1000 cd/m$^2$. As shown in FIG. 46, the emission spectrum of each light-emitting device has a peak at around 459 nm, suggesting that each peak is derived from light emission of 3,10PCA2Nbf(IV)-02 contained in the light-emitting layer 913.

The results shown in FIG. 40 to FIG. 45 and Table 13 showed that the light-emitting device 8, the light-emitting device 9, the light-emitting device 10, the light-emitting device 11, and the light-emitting device 12 of embodiments of the present invention including αN-βNPAnth as the host material in the light-emitting layers 913 and the electron-transport materials shown in Table 12 as the electron-transport materials in the electron-transport layers 914 have favorable current-voltage characteristics, favorable power efficiency, and favorable emission efficiency.

Figure 47:
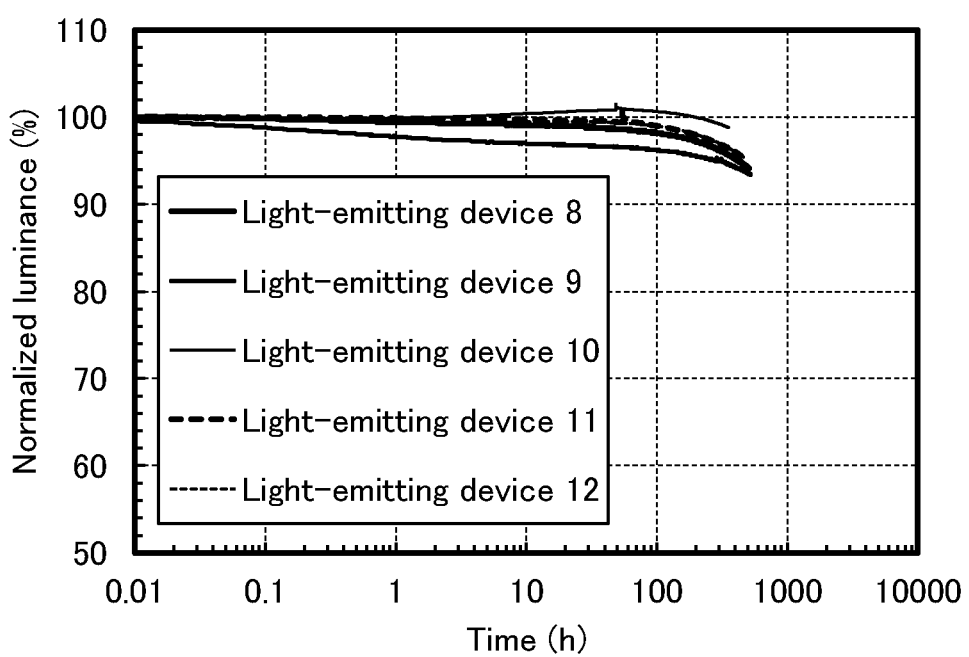
FIG. 47 is a diagram showing reliability of the light-emitting device 8, the light-emitting device 9, the light-emitting device 10, the light-emitting device 11, and the light-emitting device 12.

FIG. 47 is a graph showing a change in luminance over driving time when each element was driven at a constant current density (50 mA/cm$^2$). As shown in FIG. 47, the light-emitting device 8, the light-emitting device 9, the light-emitting device 10, the light-emitting device 11, and the light-emitting device 12 of embodiments of the present invention were found to be light-emitting devices with a favorable lifetime with a small reduction in luminance over the accumulated driving time. This was probably caused for the following reason: the difference in LUMO level between αN-βNPAnth used as the host material in the light-emitting layers 913 and the materials used as the electron-transport materials in the electron-transport layers 914 was as large as 0.20 eV to 0.27 eV and thus, the electron-injection barrier at the interface between the light-emitting layer 913 and the electron-transport layer 914 stacked was high, which inhibited the electrons injected from the cathode side into the light-emitting layer from reaching the hole-transport layer and accordingly inhibited degradation of the hole-transport layer due to electron injection. Note that the change in luminance over the accumulated driving time shows a behavior of the luminance exceeding the initial value. This is because, as described above, the carrier recombination region spreads into the electron-transport layer in the initial stage of driving owing to the use of the electron-transport material with a slow electron-transport property in these light-emitting elements. It is deemed that as the driving time accumulates, the range of the carrier recombination region that has spread into the electron-transport layer decreases and the emission efficiency relatively increases, leading to the increase in luminance.

Example 5

Synthesis Example 1

In this example, a synthesis method of 2-phenyl-3-{4-[4-(3-pyridyl)-1-naphthyl]phenyl}quinoxaline (abbreviation: PyN1PQ) (Structural Formula (300)), which is the organic compound described in Embodiment 1, is described. Note that the structure of PyN1PQ is shown below.

[Chemical Formula 11]

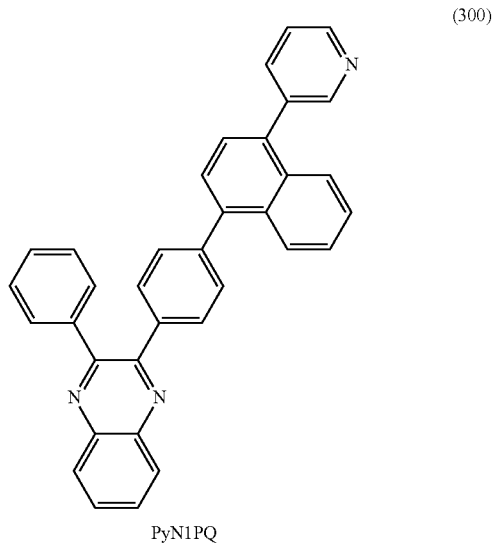

(300)

PyN1PQ

Into a flask were added 1.8 g (6.2 mmol) of 3-(4-bromonaphthalen-1-yl)pyridine, 2.2 g (6.8 mmol) of 4-(3-phenylquinoxalin-2-yl)phenylboronic acid, 0.19 g (0.62 mmol) of tri(o-tolyl)phosphine, and 1.7 g (6.0 mmol) of potassium carbonate, and the air in the flask was replaced with nitrogen. To this mixture were added 60 mL of toluene, 12 mL of ethanol, and 6 mL of water, and the mixture was degassed by being stirred under reduced pressure. To this mixture was added 28 mg (0.12 mmol) of palladium(II) acetate, and the mixture was stirred at 80° C. under a nitrogen stream for 6 hours.

After the predetermined time elapsed, water was added to this mixture, and an aqueous layer was subjected to extraction with toluene. The obtained solution of the extract and an organic layer were combined and washed with water and saturated brine, and the organic layer was dried with magnesium sulfate. This mixture was gravity filtered, and the filtrate was concentrated to give 3.5 g of a solid. This solid was purified by silica gel column chromatography (developing solvent: toluene/ethyl acetate=9/1) to give 2.6 g of a target pale yellow solid. Methanol was added to the obtained solid, and after irradiation with ultrasonic waves, a solid was collected. The resulting solid was recrystallized with a mixed solvent of toluene and methanol to give 2.1 g (4.4 mmol) of a target white solid in a yield of 71%. The synthesis scheme is shown in Formula (a-1) below.

[Chemical Formula 12]

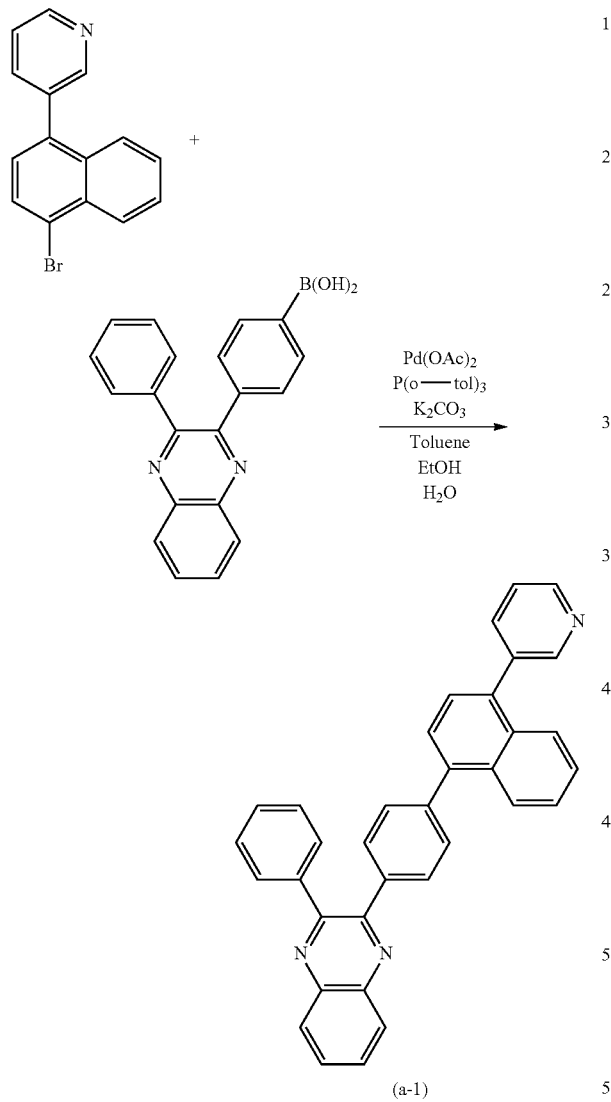

(a-1)

By the train sublimation method, 2.1 g of the obtained white solid was subjected to sublimation and purification. The sublimation purification was performed by heating at 245° C. under the conditions where the pressure was 3.6 Pa and the argon flow rate was 5 mL/min. After the sublimation purification, 2.0 g of a target white solid was obtained at a collection rate of 94%.

Figure 48:
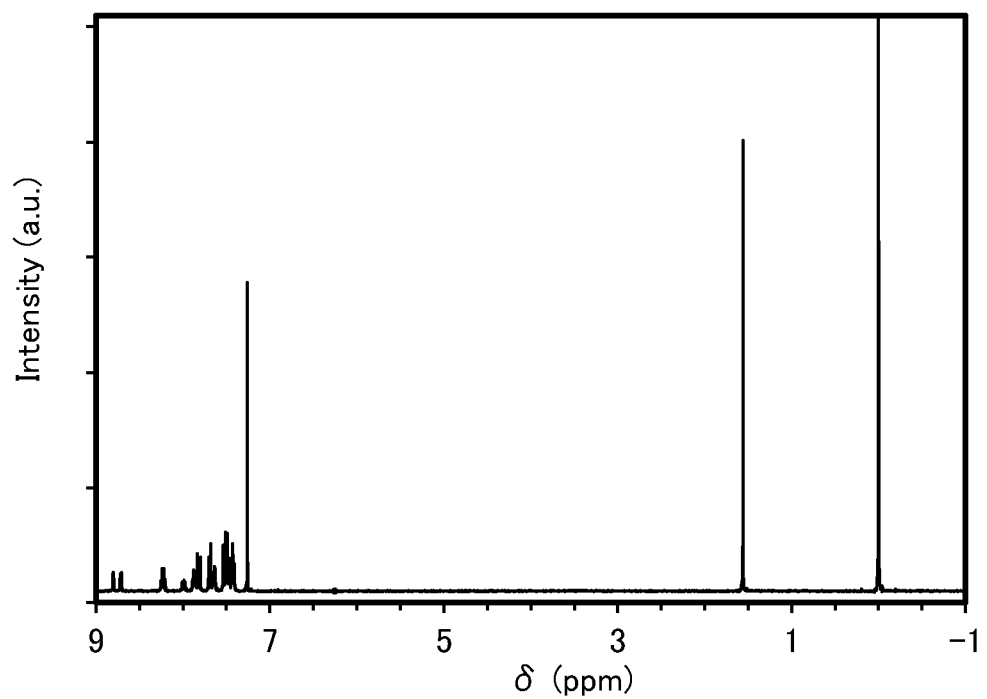
FIG. 48 is a $^1$H-NMR chart of an organic compound represented by Structural Formula (300).

Note that results of analysis by nuclear magnetic resonance ($^1$H-NMR) spectroscopy of the white solid obtained by the above synthesis method are shown below. FIG. 48 shows a $^1$H-NMR chart. The results revealed that PyN1PQ, the organic compound represented by Structural Formula (300) above, was obtained in this example.

$^1$H NMR (CDCl3, 300 MHz): δ=7.39-7.56 (m, 10H), 7.62-7.72 (m, 4H), 7.78-7.90 (m, 4H), 7.96-8.03 (m, 1H) 8.19-8.27 (m, 2H), 8.71 (dd, J=1.5 Hz, 4.8 Hz, 1H), 8.80 (dd, J=1.1 Hz, 2.2 Hz, 1H).

Example 6

Synthesis Example 2

In this example, a synthesis method of 2-phenyl-3-{4-[5-(3-pyridyl)-1-naphthyl]phenyl}quinoxaline (abbreviation: PyN1PQ-02) (Structural Formula (301)), which is the organic compound described in Embodiment 1, is described. Note that the structure of PyN1PQ-02 is shown below.

[Chemical Formula 13]

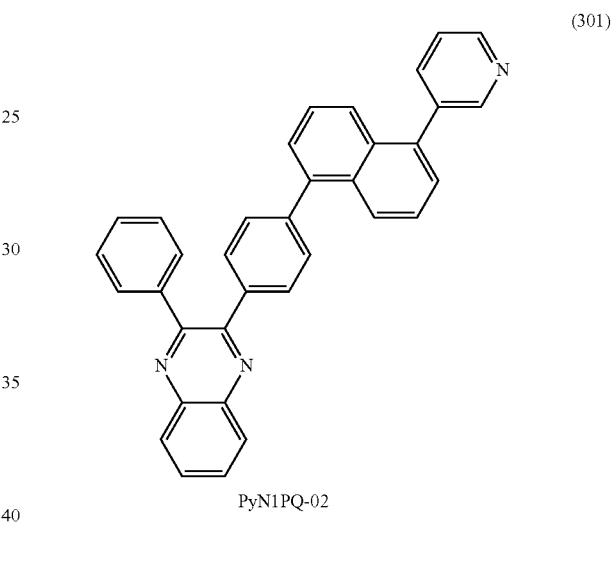

PyN1PQ-02

<Step 1: Synthesis of 3-(5-chloronaphthalen-1-yl)pyridine

Into a 500-mL three-neck flask were put 5.0 g (21 mmol) of 1-bromo-5-chloronaphthalene, 2.5 g (21 mmol) of 3-pyridineboronic acid, and 11 g (83 mmol) of potassium carbonate, and the air in the flask was replaced with nitrogen. To this mixture were added 200 mL of THF and 40 mL of water, and the mixture was degassed by being stirred under reduced pressure.

To this mixture were added 0.18 g (0.62 mmol) of tri-tert-butylphosphoniumtetrafluoroborate and 0.19 g (0.21 mmol) of tris(dibenzylideneacetone)dipalladium(0), and this solution was stirred at 80° C. for 2 hours. After the predetermined time elapsed, water was added to this mixture, an aqueous layer was subjected to extraction with toluene, the obtained solution of the extract and an organic layer were combined and washed with water and saturated brine, and the organic layer was dried with magnesium sulfate. Then, this mixture was separated by gravity filtration, and the filtrate was concentrated. The resulting solid was purified by silica gel column chromatography (developing solvent:toluene:ethyl acetate=2:1) to give 4.7 g (20 mmol) of a target orange solid in a yield of 94%. The synthesis scheme of Step 1 is shown in Formula (b-1) below.

[Chemical Formula 14]

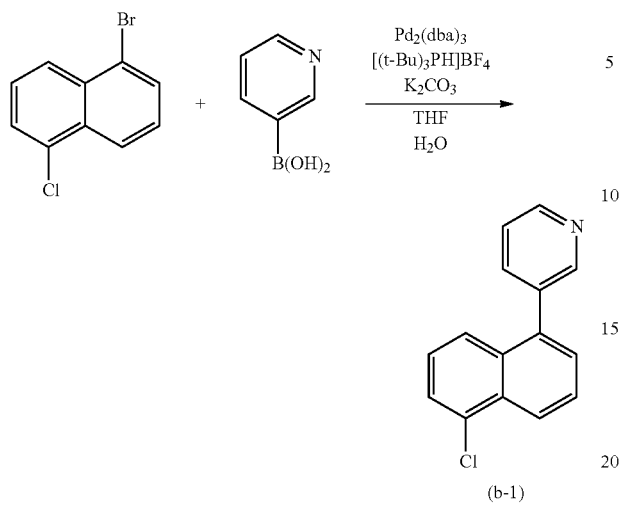

(b-1)

Step 2: Synthesis of PyN1PQ-02

Next, into a flask were added 1.3 g (5.3 mmol) of 3-(5-chloronaphthalen-1-yl)pyridine obtained in Step 1, 1.9 g (5.9 mmol) of 4-(3-phenylquinoxalin-2-yl)phenylboronic acid, 3.4 g (16 mmol) of potassium phosphate, and 1.2 g (16 mmol) of tert-butyl alcohol, and the air in the flask was replaced with nitrogen.

To this mixture, 55 mL of diglyme was added, and the mixture was degassed by being stirred under reduced pressure. To this mixture were added 0.19 g (0.53 mmol) of di(1-adamantyl)-n-butylphosphine and 60 mg (0.27 mmol) of palladium(II) acetate, and stirring was performed at 140° C. under a nitrogen stream for 6 hours.

After the predetermined time elapsed, water was added to this mixture, and an aqueous layer was subjected to extraction with toluene. The obtained solution of the extract and an organic layer were combined and washed with water and saturated brine, and the organic layer was dried with magnesium sulfate. This mixture was gravity filtered, and the filtrate was concentrated to give a solid. This solid was purified by silica gel column chromatography (developing solvent: toluene:ethyl acetate=9:1) to give 2.1 g of a target pale yellow solid. The resulting solid was recrystallized with a mixed solvent of toluene and methanol to give 1.6 g (3.4 mmol) of a target white solid in a yield of 63%. The synthesis scheme of Step 2 is shown in Formula (b-2) below.

[Chemical Formula 15]

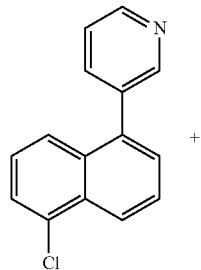

+

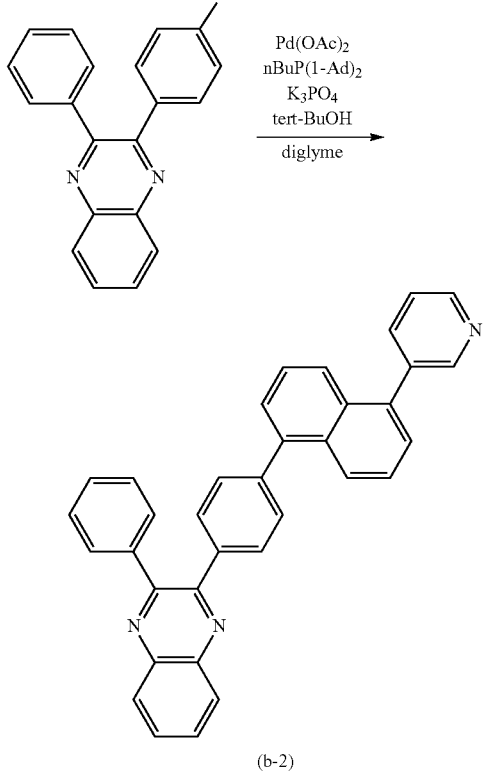

(b-2)

By the train sublimation method, 1.4 g of the obtained white solid was subjected to sublimation and purification. The sublimation purification was performed by heating at 235° C. under the conditions where the pressure was 3.3 Pa and the argon flow rate was 5 mL/min. After the sublimation purification, 1.3 g of a white solid was obtained at a collection rate of 90%.

Figure 49:
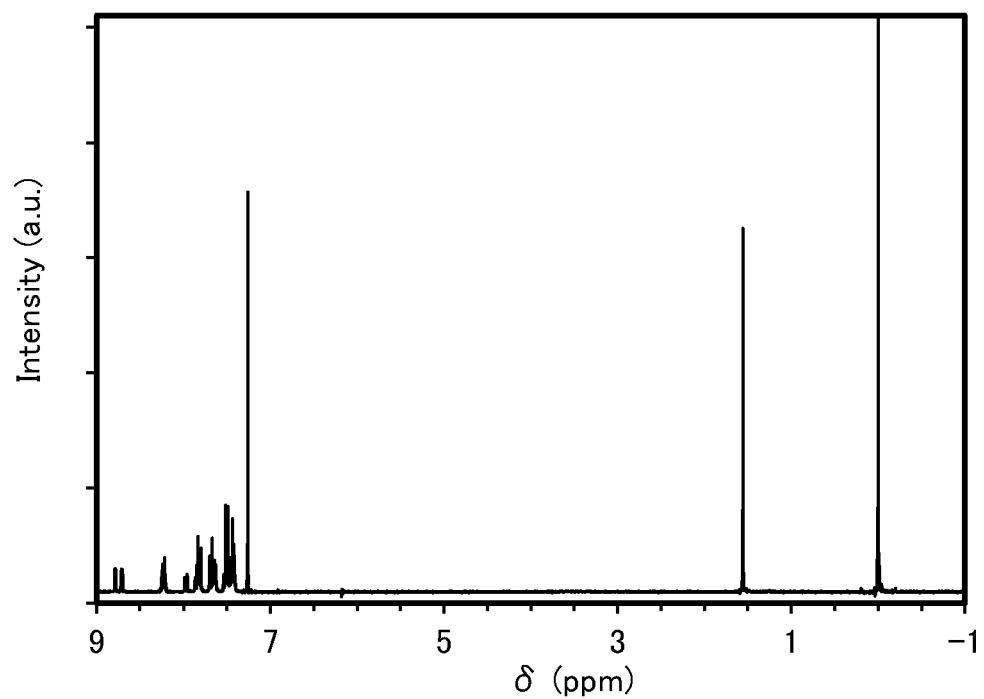
FIG. 49 is a $^1$H-NMR chart of an organic compound represented by Structural Formula (301).

Note that results of analysis by nuclear magnetic resonance ($^1$H-NMR) spectroscopy of the white solid obtained in Step 2 above are shown below. FIG. 49 shows a $^1$H-NMR chart. The results revealed that PyN1PQ-02, the organic compound represented by Structural Formula (301) above, was obtained in this example.

$^1$H NMR (CDCl3, 300 MHz): δ=7.40-7.55 (m, 10H), 7.61-7.71 (m, 4H), 7.78-7.88 (m, 4H), 7.94-8.00 (m, 1H), 8.19-8.27 (m, 2H), 8.71 (dd, J=1.8 Hz, 4.8 Hz, 1H), 8.78 (dd, J=1.1 Hz, 2.2 Hz, 1H).

REFERENCE NUMERALS

101: first electrode, 102: second electrode, 103: EL layer, 111: hole-injection layer, 112: hole-transport layer, 113: light-emitting layer, 114: electron-transport layer, 114-1: first electron-transport layer, 114-2: second electron-transport layer, 115: electron-injection layer, 103a, 103b: EL layer, 104: charge-generation layer, 111a, 111b: hole-injection layer, 112a, 112b: hole-transport layer, 113a, 113b: light-emitting layer, 114a, 114b: electron-transport layer, 115a, 115b: electron-injection layer, 200R, 200G, 200B: optical path length, 201: first substrate, 202: transistor (FET), 203R, 203G, 203B, 203W: light-emitting device, 204: EL layer, 205: second substrate, 206R, 206G, 206B: color filter, 206R', 206G', 206B': color filter, 207: first electrode, 208: second electrode, 209: black layer (black matrix), 210R, 210G: conductive layer, 301: first substrate, 302: pixel portion, 303: driver circuit portion (source line driver circuit), 304a, 304b: driver circuit portion (gate line driver circuit), 305: sealant, 306: second substrate, 307: lead wiring, 308: FPC, 309: FET, 310: FET, 311: FET, 312: FET, 313: first electrode, 314: insulator, 315: EL layer, 316: second electrode, 317: light-emitting device, 318: space, 900: substrate, 901: first electrode, 902: EL layer, 903: second electrode, 911: hole-injection layer, 912: hole-transport layer, 913: light-emitting layer, 914: electron-transport layer, 915: electron-injection layer, 1001: first electrode, 1002: second electrode, 1010: first layer, 1011: second layer, 1012: third layer, 4000: lighting device, 4001: substrate, 4002: light-emitting device, 4003: substrate, 4004: first electrode, 4005: EL layer, 4006: second electrode, 4007: electrode, 4008: electrode, 4009: auxiliary wiring, 4010: insulating layer, 4011: sealing substrate, 4012: sealant, 4013: desiccant, 4015: diffuser plate, 4200: lighting device, 4201: substrate, 4202: light-emitting device, 4204: first electrode, 4205: EL layer, 4206: second electrode, 4207: electrode, 4208: electrode, 4209: auxiliary wiring, 4210: insulating layer, 4211: sealing substrate, 4212: sealant, 4213: barrier film, 4214: planarization film, 4215: diffuser plate, 5101: light, 5102: wheel, 5103: door, 5104: display portion, 5105: steering wheel, 5106: shifter, 5107: seat, 5108: inner rearview mirror, 5109: windshield, 7000: housing, 7001: display portion, 7002: second display portion, 7003: speaker, 7004: LED lamp, 7005: operation key, 7006: connection terminal, 7007: sensor, 7008: microphone, 7009: switch, 7010: infrared port, 7011: recording medium reading portion, 7012: support portion, 7013: earphone, 7014: antenna, 7015: shutter button, 7016: image receiving portion, 7018: stand, 7020: camera, 7021: external connection portion, 7022, 7023: operation button, 7024: connection terminal, 7025: band, 7026: microphone, 7027: icon indicating time, 7028: another icon, 7029: sensor, 7030: speaker, 7052, 7053, 7054: information, 9310: portable information terminal, 9311: display portion, 9312: display region, 9313: hinge, 9315: housing

The invention claimed is:

1. A light-emitting device comprising:
an anode;
a cathode; and
an EL layer between the anode and the cathode,
wherein the EL layer comprises a hole-injection layer, a light-emitting layer, and an electron-transport layer from the anode side,
wherein the hole-injection layer is in contact with the anode,
wherein the hole-injection layer comprises a first substance and a second substance,
wherein the first substance is an organic compound having an electron-withdrawing group,
wherein the second substance has a HOMO level higher than or equal to −5.7 eV and lower than or equal to −5.4 eV,
wherein the light-emitting layer comprises a third substance and a fourth substance, the third substance being a light-emitting substance and the fourth substance being a host material,
wherein the electron-transport layer comprises a first electron-transport layer and a second electron-transport layer,
wherein the first electron-transport layer is in contact with the light-emitting layer,
wherein the first electron-transport layer comprises a fifth substance,
wherein the second electron-transport layer comprises a sixth substance,
wherein the fifth substance is an electron-transport material,
wherein the sixth substance is a metal, a metal salt, a metal oxide, or a metal complex, and
wherein a first LUMO level of the fifth substance is lower than a second LUMO level of the fourth substance and a difference between the first LUMO level and the second LUMO level is greater than or equal to 0.15 eV and less than or equal to 0.40 eV.

2. A light-emitting device comprising:
an anode;
a cathode; and
an EL layer between the anode and the cathode,
wherein the EL layer comprises a hole-injection layer, a light-emitting layer, and an electron-transport layer from the anode side,
wherein the hole-injection layer is in contact with the anode,
wherein the hole-injection layer comprises a first substance and a second substance,
wherein the first substance is an organic compound having an electron-withdrawing group,
wherein the second substance has a HOMO level higher than or equal to −5.7 eV and lower than or equal to −5.4 eV,
wherein the light-emitting layer comprises a third substance and a fourth substance, the third substance being a light-emitting substance and the fourth substance being a host material,
wherein the electron-transport layer comprises a first electron-transport layer and a second electron-transport layer,
wherein the first electron-transport layer is in contact with the light-emitting layer,
wherein the first electron-transport layer comprises a fifth substance and a sixth substance,
wherein the second electron-transport layer comprises a seventh substance,
wherein the fifth substance and the seventh substance are an electron-transport material,
wherein the sixth substance is a metal, a metal salt, a metal oxide, or a metal complex, and
wherein a first LUMO level of the fifth substance is lower than a second LUMO level of the fourth substance and a difference between the first LUMO level and the second LUMO level is greater than or equal to 0.15 eV and less than or equal to 0.40 eV.

3. The light-emitting device according to claim 2,
wherein the second electron-transport layer comprises the seventh substance and an eighth substance,
wherein a proportion of the sixth substance in the first electron-transport layer is higher than a proportion of the eighth substance in the second electron-transport layer, and
wherein the eighth substance is a metal, a metal salt, a metal oxide, or a metal complex.

4. The light-emitting device according to claim 3, wherein the sixth substance and the eighth substance are the same.

5. The light-emitting device according to claim 2, wherein the fifth substance and the seventh substance are the same.

6. The light-emitting device according to claim 1,
wherein the difference between the first LUMO level and the second LUMO level is greater than or equal to 0.20 eV and less than or equal to 0.40 eV.

7. The light-emitting device according to claim 1,
wherein the fifth substance has a HOMO level higher than or equal to −6.0 eV.

8. The light-emitting device according to claim 1,
wherein the fifth substance has an electron mobility higher than or equal to $1\times10^{-7}$ cm$^2$/Vs and lower than or equal to $5\times10^{-5}$ cm$^2$/Vs when a square root of electric field strength [V/cm] is 600.

9. The light-emitting device according to claim 1,
wherein the light-emitting layer further comprises a ninth substance, and
wherein a combination of the fourth substance and the ninth substance forms an exciplex.

10. The light-emitting device according to claim 9,
wherein the fourth substance is an electron-transport material, and
wherein the ninth substance is a hole-transport material.

11. The light-emitting device according to claim 1,
wherein the EL layer comprises a hole-transport layer,
wherein the hole-transport layer is positioned between the hole-injection layer and the light-emitting layer,
wherein the hole-transport layer comprises a tenth substance, and
wherein a HOMO level of the tenth substance is lower than or equal to the HOMO level of the second substance and higher than a HOMO level of the fourth substance.

12. The light-emitting device according to claim 11,
wherein the tenth substance comprises at least one of a carbazole skeleton, a dibenzofuran skeleton, a dibenzothiophene skeleton, and a fluorene skeleton.

13. The light-emitting device according to claim 11, wherein the second substance and the tenth substance are the same.

14. The light-emitting device according to claim 4,
wherein the sixth substance and the eighth substance are a metal complex comprising an alkali metal or an alkaline earth metal.

15. The light-emitting device according to claim 4,
wherein the sixth substance and the eighth substance are a metal complex comprising an alkali metal or an alkaline earth metal and a ligand comprising nitrogen and oxygen.

16. The light-emitting device according to claim 4,
wherein the sixth substance and the eighth substance are a metal complex comprising a monovalent metal ion and a ligand comprising an 8-hydroxyquinolinato structure.

17. The light-emitting device according to claim 4,
wherein the sixth substance and the eighth substance are a lithium complex comprising a ligand comprising an 8-hydroxyquinolinato structure.

18. A light-emitting apparatus comprising:
the light-emitting device according to claim 1; and
a Flexible Printed Circuit.

19. An electronic device comprising:
the light-emitting apparatus according to claim 18; and
at least one of a microphone, a camera, an operation button, an external connection portion, and a speaker.

20. A lighting device comprising:
the light-emitting device according to claim 1; and
at least one of a housing and a cover.

21. The light-emitting device according to claim 2,
wherein the difference between the first LUMO level and the second LUMO level is greater than or equal to 0.20 eV and less than or equal to 0.40 eV.

22. The light-emitting device according to claim 2,
wherein the fifth substance has a HOMO level higher than or equal to −6.0 eV.

23. The light-emitting device according to claim 2,
wherein the fifth substance has an electron mobility higher than or equal to $1\times10^{-7}$ cm$^2$/Vs and lower than or equal to $5\times10^{-5}$ cm$^2$/Vs when a square root of electric field strength [V/cm] is 600.

24. The light-emitting device according to claim 2,
wherein the light-emitting layer further comprises a ninth substance, and
wherein a combination of the fourth substance and the ninth substance forms an exciplex.

* * * * *